United States Patent
Ohsawa et al.

(10) Patent No.: US 11,956,981 B2
(45) Date of Patent: Apr. 9, 2024

(54) LIGHT-EMITTING ELEMENT, DISPLAY DEVICE, ELECTRONIC DEVICE, AND LIGHT DEVICE EACH INCLUDING TADF ORGANIC COMPOUND

(71) Applicant: Semiconductor Energy Laboratory Co., Ltd., Kanagawa-ken (JP)

(72) Inventors: Nobuharu Ohsawa, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 18/138,250

(22) Filed: Apr. 24, 2023

(65) Prior Publication Data
US 2023/0269955 A1 Aug. 24, 2023

Related U.S. Application Data

(63) Continuation of application No. 16/758,999, filed as application No. PCT/IB2018/058227 on Oct. 23, 2018, now Pat. No. 11,637,263.

(30) Foreign Application Priority Data

Nov. 2, 2017 (JP) ................................ 2017-213080

(51) Int. Cl.
*H10K 50/12* (2023.01)
*C09K 11/02* (2006.01)
(Continued)

(52) U.S. Cl.
CPC ............ *H10K 50/121* (2023.02); *C09K 11/02* (2013.01); *C09K 11/06* (2013.01); *H10K 50/16* (2023.02);
(Continued)

(58) Field of Classification Search
CPC .. H10K 50/121; H10K 85/654; H10K 85/636; H10K 59/40; H10K 50/131;
(Continued)

(56) References Cited

U.S. PATENT DOCUMENTS 6,863,997 B2 3/2005 Thompson et al.
6,869,695 B2 3/2005 Thompson et al.
(Continued)

FOREIGN PATENT DOCUMENTS

CN 105103326 A 11/2015
CN 105810846 A 7/2016
(Continued)

OTHER PUBLICATIONS

Sato, K. et al., "Organic Luminescent Molecule with Energetically Equivalent Singlet and Triplet Excited States for Organic Light-Emitting Diodes," Physical Review Letters, Jun. 10, 2013, vol. 110, No. 24, pp. 247401-1-247401-5.
(Continued)

*Primary Examiner* — Michael Jung
(74) *Attorney, Agent, or Firm* — Husch Blackwell LLP

(57) ABSTRACT

A light-emitting element having high emission efficiency is provided.
The light-emitting element includes a first organic compound, a second organic compound, and a third organic compound. The first organic compound has a function of converting triplet excitation energy into light emission. The second organic compound is preferably a TADF material. The third organic compound is a fluorescent compound. Light emitted from the light-emitting element is obtained from the third organic compound. Triplet excitation energy in a light-emitting layer is transferred to the third organic
(Continued)

compound by reverse intersystem crossing caused by the second organic compound or through the first organic compound.

9 Claims, 40 Drawing Sheets

(51) Int. Cl.
| | | |
|---|---|---|
| *C09K 11/06* | (2006.01) | |
| *H10K 50/16* | (2023.01) | |
| *H10K 59/12* | (2023.01) | |
| *H10K 59/40* | (2023.01) | |
| *H10K 50/13* | (2023.01) | |
| *H10K 50/19* | (2023.01) | |
| *H10K 85/30* | (2023.01) | |
| *H10K 85/60* | (2023.01) | |
| *H10K 101/00* | (2023.01) | |
| *H10K 101/30* | (2023.01) | |

(52) U.S. Cl.
CPC .......... *C09K 2211/1007* (2013.01); *C09K 2211/1044* (2013.01); *C09K 2211/185* (2013.01); *H10K 50/131* (2023.02); *H10K 50/19* (2023.02); *H10K 59/12* (2023.02); *H10K 59/40* (2023.02); *H10K 85/342* (2023.02); *H10K 85/60* (2023.02); *H10K 85/615* (2023.02); *H10K 85/622* (2023.02); *H10K 85/626* (2023.02); *H10K 85/636* (2023.02); *H10K 85/654* (2023.02); *H10K 85/657* (2023.02); *H10K 85/6572* (2023.02); *H10K 85/6576* (2023.02); *H10K 2101/27* (2023.02); *H10K 2101/30* (2023.02)

(58) Field of Classification Search
CPC .......... H10K 85/342; H10K 85/657; H10K 2101/30; H10K 85/622; H10K 85/60; H10K 85/6576; H10K 50/19; H10K 85/615; H10K 59/12; H10K 85/626; H10K 85/6572; H10K 2101/27; H01K 50/16; C09K 11/06; C09K 2211/1007; C09K 2211/1044; C09K 2211/185
See application file for complete search history.

(56) References Cited

U.S. PATENT DOCUMENTS

| | | | |
|---|---|---|---|
| 6,951,694 | B2 | 10/2005 | Thompson et al. |
| 7,175,922 | B2 | 2/2007 | Jarikov et al. |
| 7,183,010 | B2 | 2/2007 | Jarikov |
| 7,332,857 | B2 | 2/2008 | Seo et al. |
| 7,553,557 | B2 | 6/2009 | Thompson et al. |
| 7,597,967 | B2 | 10/2009 | Kondakova et al. |
| 7,993,760 | B2 | 8/2011 | Komori et al. |
| 8,034,465 | B2 | 10/2011 | Liao et al. |
| 8,274,214 | B2 | 9/2012 | Ikeda et al. |
| 8,853,680 | B2 | 10/2014 | Yamazaki et al. |
| 8,963,127 | B2 | 2/2015 | Pieh et al. |
| 8,981,355 | B2 | 3/2015 | Seo |
| 8,993,129 | B2 | 3/2015 | Endo et al. |
| 8,994,263 | B2 | 3/2015 | Shitagaki et al. |
| 9,054,317 | B2 | 6/2015 | Monkman et al. |
| 9,093,649 | B2 | 7/2015 | Kawakami et al. |
| 9,159,942 | B2 | 10/2015 | Seo et al. |
| 9,175,213 | B2 | 11/2015 | Seo et al. |
| 9,276,228 | B2 | 3/2016 | Seo et al. |
| 9,356,250 | B2 | 5/2016 | Ohsawa et al. |
| 9,362,517 | B2 | 6/2016 | Ohsawa et al. |
| 9,515,279 | B2 | 12/2016 | Ishisone et al. |
| 9,586,924 | B2 | 3/2017 | Kawakami et al. |
| 9,604,928 | B2 | 3/2017 | Shitagaki et al. |
| 9,634,279 | B2 | 4/2017 | Seo et al. |
| 9,899,603 | B2 | 2/2018 | Kawakami et al. |
| 10,367,160 | B2 | 7/2019 | Seo et al. |
| 10,439,005 | B2 | 10/2019 | Ishisone et al. |
| 10,566,542 | B2 | 2/2020 | Duan et al. |
| 2003/0175553 | A1 | 9/2003 | Thompson et al. |
| 2004/0253478 | A1 | 12/2004 | Thompson et al. |
| 2005/0048310 | A1 | 3/2005 | Cocchi et al. |
| 2005/0221116 | A1 | 10/2005 | Cocchi et al. |
| 2006/0134464 | A1 | 6/2006 | Nariyuki |
| 2007/0090756 | A1 | 4/2007 | Okada et al. |
| 2012/0217487 | A1 | 8/2012 | Yamazaki et al. |
| 2012/0235127 | A1 | 9/2012 | Takasu et al. |
| 2013/0277655 | A1 | 10/2013 | Seo et al. |
| 2013/0277656 | A1 | 10/2013 | Seo et al. |
| 2013/0306945 | A1 | 11/2013 | Seo |
| 2014/0034930 | A1 | 2/2014 | Seo et al. |
| 2014/0034932 | A1 | 2/2014 | Seo et al. |
| 2014/0291645 | A1 | 10/2014 | Inoue et al. |
| 2014/0319492 | A1 | 10/2014 | Seo et al. |
| 2015/0069352 | A1 | 3/2015 | Kim et al. |
| 2015/0131302 | A1 | 5/2015 | Inoue et al. |
| 2015/0188070 | A1 | 7/2015 | Ogiwara et al. |
| 2015/0243893 | A1 | 8/2015 | Joseph et al. |
| 2016/0013421 | A1 | 1/2016 | Inoue et al. |
| 2016/0028022 | A1 | 1/2016 | Seo et al. |
| 2016/0056401 | A1 | 2/2016 | Lee et al. |
| 2016/0064684 | A1 | 3/2016 | Seo et al. |
| 2016/0072078 | A1 | 3/2016 | Lee et al. |
| 2016/0093823 | A1 | 3/2016 | Seo et al. |
| 2016/0104855 | A1 | 4/2016 | Ohsawa et al. |
| 2016/0164020 | A1 | 6/2016 | Kim et al. |
| 2016/0172605 | A1 | 6/2016 | Seo et al. |
| 2016/0248031 | A1 | 8/2016 | Seo |
| 2016/0248032 | A1 | 8/2016 | Seo et al. |
| 2016/0268513 | A1 | 9/2016 | Ishisone et al. |
| 2016/0268534 | A1 | 9/2016 | Hosoumi et al. |
| 2016/0343949 | A1 | 11/2016 | Seo et al. |
| 2016/0343954 | A1 | 11/2016 | Seo et al. |
| 2016/0351826 | A1 | 12/2016 | Kim et al. |
| 2016/0351829 | A1 | 12/2016 | Hosoumi et al. |
| 2016/0351833 | A1 | 12/2016 | Hosoumi et al. |
| 2016/0372683 | A1 | 12/2016 | Tanimoto et al. |
| 2017/0012207 | A1 | 1/2017 | Seo et al. |
| 2017/0062731 | A1 | 3/2017 | Ogiwara et al. |
| 2017/0133617 | A1 | 5/2017 | Seo et al. |
| 2017/0186971 | A1 | 6/2017 | Kanamoto et al. |
| 2017/0186980 | A1 | 6/2017 | Watabe et al. |
| 2017/0271610 | A1 | 9/2017 | Takahashi |
| 2017/0324054 | A1 | 11/2017 | Ishisone et al. |
| 2017/0324055 | A1 | 11/2017 | Ishisone et al. |
| 2017/0352813 | A1 | 12/2017 | Duan et al. |
| 2018/0130959 | A1 | 5/2018 | Ogiwara et al. |
| 2018/0145273 | A1 | 5/2018 | Seo et al. |
| 2019/0013476 | A1 | 1/2019 | Saito et al. |
| 2019/0044073 | A1 | 2/2019 | Ogiwara et al. |
| 2019/0081249 | A1 | 3/2019 | Saito et al. |
| 2019/0140027 | A1 | 5/2019 | Ishisone et al. |
| 2019/0173038 | A1 | 6/2019 | Seo et al. |
| 2020/0083460 | A1 | 3/2020 | Duan et al. |
| 2021/0391552 | A1 | 12/2021 | Liu et al. |

FOREIGN PATENT DOCUMENTS

| | | |
|---|---|---|
| CN | 106848074 A | 6/2017 |
| CN | 108701771 A | 10/2018 |
| DE | 10 2015 213 426 A1 | 1/2016 |
| EP | 1 202 608 A2 | 5/2002 |
| EP | 2 876 698 A1 | 5/2015 |
| EP | 2 958 158 A1 | 12/2015 |
| EP | 3 226 320 A1 | 10/2017 |
| EP | 3 422 431 A1 | 1/2019 |
| JP | 2005-514754 | 5/2005 |
| JP | 2007-015933 A | 1/2007 |
| JP | 2008-288344 A | 11/2008 |
| JP | 2013-258402 A | 12/2013 |
| JP | 2014-022666 A | 2/2014 |
| JP | 2014-045179 A | 3/2014 |
| JP | 2014-045184 A | 3/2014 |

(56) References Cited

FOREIGN PATENT DOCUMENTS

| JP | 2014-192214 A | 10/2014 |
|---|---|---|
| JP | 2015-065448 A | 4/2015 |
| JP | 2015-144224 A | 8/2015 |
| JP | 2015-179809 A | 10/2015 |
| JP | 2016-006905 A | 1/2016 |
| JP | 2016-006906 A | 1/2016 |
| JP | 2016-032108 A | 3/2016 |
| JP | 2016-072632 A | 5/2016 |
| JP | 2016-207998 A | 12/2016 |
| JP | 2018-501660 | 1/2018 |
| KR | 2015-0120447 A | 10/2015 |
| KR | 2016-0026717 A | 3/2016 |
| KR | 2017-0093906 A | 8/2017 |
| KR | 2018-0020320 A | 2/2018 |
| KR | 2018-0099657 A | 9/2018 |
| TW | 201624791 | 7/2016 |
| TW | 201731840 | 9/2017 |
| WO | WO 2014/013947 A1 | 1/2014 |
| WO | WO 2014/104315 A1 | 7/2014 |
| WO | WO 2015/011614 A1 | 1/2015 |
| WO | WO 2015/037675 A1 | 3/2015 |
| WO | WO 2015/098975 A1 | 7/2015 |
| WO | WO 2016/107446 A1 | 7/2016 |
| WO | WO 2017/115788 A1 | 7/2017 |
| WO | WO 2017/146191 A1 | 8/2017 |

OTHER PUBLICATIONS

International Search Report (Application No. PCT/IB2018/058227) dated Jan. 29, 2019.
Written Opinion (Application No. PCT/IB2018/058227) dated Jan. 29, 2019.
Baldo, M. et al., "High-Efficiency Fluorescent Organic Light-Emitting Devices Using a Phosphorescent Sensitizer," Nature, Feb. 17, 2000, vol. 403, pp. 750-753.
Chen, F. et al., "Triplet Exciton Confinement in Phosphorescent Polymer Light-Emitting Diodes," Applied Physics Letters, Feb. 17, 2003, vol. 82, No. 7, pp. 1006-1008.
Tokito, S. et al., "Confinement of Triplet Energy on Phosphorescent Molecules for Highly-Efficient Organic Blue-Light-Emitting Devices," Applied Physics Letters, Jul. 21, 2003, vol. 83, No. 3, pp. 569-571.
Itano, K. et al., "Exciplex Formation at the Organic Solid-State Interface: Yellow Emission in Organic Light-Emitting Diodes Using Green-Fluorescent tris(8-quinolinolato)aluminum and Hole-Transporting Molecular Materials with Low Ionization Potentials," Applied Physics Letters, Feb. 9, 1998, vol. 72, No. 6, pp. 636-638.
Endo, A. et al., "Efficient Up-Conversion of Triplet Excitons Into a Singlet State and Its Application for Organic Light Emitting Diodes," Applied Physics Letters, Feb. 24, 2011, vol. 98, No. 8, pp. 083302-1-083302-3.
Kondakova, M. et al., "High-Efficiency, Low-Voltage Phosphorescent Organic Light-Emitting Diode Devices with Mixed Host," Journal of Applied Physics, Nov. 4, 2008, vol. 104, pp. 094501-1-094501-17.
Hino, Y. et al., "Red Phosphorescent Organic Light-Emitting Diodes Using Mixture System of Small-Molecule and Polymer Host," Japanese Journal of Applied Physics, Apr. 21, 2005, vol. 44, No. 4B, pp. 2790-2794.
Su, S. et al., "RGB Phosphorescent Organic Light-Emitting Diodes by Using Host Materials with Heterocyclic Cores:Effect of Nitrogen Atom Orientations," Chemistry of Materials, 2011, vol. 23, No. 2, pp. 274-284.
Goushi, K. et al., "Efficient Organic Light-Emitting Diodes Through Up-Conversion from Triplet to Singlet Excited States of Exciplexes," Applied Physics Letters) , Jul. 12, 2012, vol. 101, No. 2, pp. 023306-1-023306-4.

Tsuboyama, A. et al., "Homoleptic Cyclometalated Iridium Complexes with Highly Efficient Red Phosphorescence and Application to Organic Light-Emitting Diode," Journal of the American Chemical Society, 2003, vol. 125, No. 42, pp. 12971-12979.
Sajoto, T. et al., "Temperature Dependence of Blue Phosphorescent Cyclometalated Ir(III) Complexes," Journal of the American Chemical Society, Jun. 18, 2009, vol. 131, No. 28, pp. 9813-9822.
Gong, X. et al., "Phosphorescence from Iridium Complexes Doped into Polymer Blends," Journal of Applied Physics, Feb. 1, 2004, vol. 95, No. 3, pp. 948-953.
Lee, J. et al., "Stabilizing the Efficiency of Phosphorescent Organic Light-Emitting Diodes," SPIE Newsroom, Apr. 21, 2008, pp. 1-3.
D'Andrade, B et al., "High-Efficiency Yellow Double-Doped Organic Light-Emitting Devices Based on Phosphor-Sensitized Fluorescence," Applied Physics Letters, Aug. 13, 2001, vol. 79, No. 7, pp. 1045-1047.
Cheng, G. et al., "Improved Efficiency for White Organic Light-Emitting Devices based on Phosphor Sensitized Fluorescence," Applied Physics Letters, Feb. 20, 2006, vol. 88, No. 8, pp. 083512-1-083512-3.
Kanno, H. et al., "White Organic Light-Emitting Device Based on a Compound Fluorescent Phosphor-Sensitized-Fluorescent Emission Layer," Applied Physics Letters, Oct. 2, 2006, vol. 89, No. 14, pp. 143516-1-143516-3.
Matsumoto, N. et al., "Exciplex Formations between Tris(8-hydoxyquinolate)aluminum and Hole Transport Materials and Their Photoluminescence and Electroluminescence Characteristics, " The Journal of Physical Chemistry C, May 22, 2008, vol. 112, No. 20, pp. 7735-7741.
Yersin, H. et al., *Highly Efficient OLEDs with Phosphorescent Materials*, 2008, pp. 1-97,283-309, Wiley-VCH Verlag Gmbh & Co.
Tokito, S. et al., "Improvement in Performance by Doping," Organic EL Display, Aug. 20, 2004, pp. 67-99, Ohmsha.
Jeon, W. et al., "Ideal Host and Guest System in Phosphorescent OLEDs," Organic Electronics, 2009, vol. 10, pp. 240-246, Elsevier.
Rausch, A. et al., "Matrix Effects on the Triplet State of the OLED Emitter Ir(4,6-dFppy)2(pic)(Flrpic):Investigations by High-Resolution Optical Spectroscopy," Inorganic Chemistry, 2009, vol. 48, No. 5, pp. 1928-1937.
Zhao, Q. et al., "Synthesis and Photophysical, Electrochemical, and Electrophosphorescent Properties of a Series of Iridium(III) Complexes Based on Quinoline Derivatives and Different β-Diketonate Ligands," Organometallics, Jun. 14, 2006, vol. 25, No. 15, pp. 3631-3638.
International Search Report (Application No. PCT/IB2017/052329) dated Jul. 11, 2017.
Written Opinion (Application No. PCT/IB2017/052329) dated Jul. 11, 2017.
Park, Y. et al., "Efficient Triplet Harvesting by Fluorescent Molecules Through Exciplexes for High Efficiency Organic Light-Emitting Diodes," Applied Physics Letters, Apr. 18, 2013, vol. 102, No. 15, pp. 153306-1-153306-5.
Lee, J. et al., "An Exciplex Forming Host for Highly Efficient Blue Organic Light Emitting Diodes with Low Driving Voltage," Advanced Functional Materials, Oct. 22, 2014, vol. 25, No. 3, pp. 361-366.
Park, Y. et al., "Exciplex Forming Co host for Organic Light Emitting Diodes with Ultimate Efficiency," Advanced Functional Materials, Oct. 18, 2013, vol. 23, No. 39, pp. 4914-4920.
Liu, X. et al., "Nearly 100% Triplet Harvesting in Conventional Fluorescent Dopant-Based Organic Light-Emitting Devices Through Energy Transfer from Exciplex," Advanced Materials, Feb. 11, 2015, vol. 27, No. 12, pp. 2025-2030.
Zhao, B. et al., "Highly Efficient Red OLEDs using DCJTB as the Dopant and Delayed Fluorescent Exciplex as the Host," Scientific Reports, May 29, 2015, vol. 5, No. 10697, pp. 1-8.
Chinese Office Action (Application No. 201780028120.4) dated Jul. 31, 2020.
Taiwanese Office Action (Application No. 107138332) dated Jun. 27, 2022.

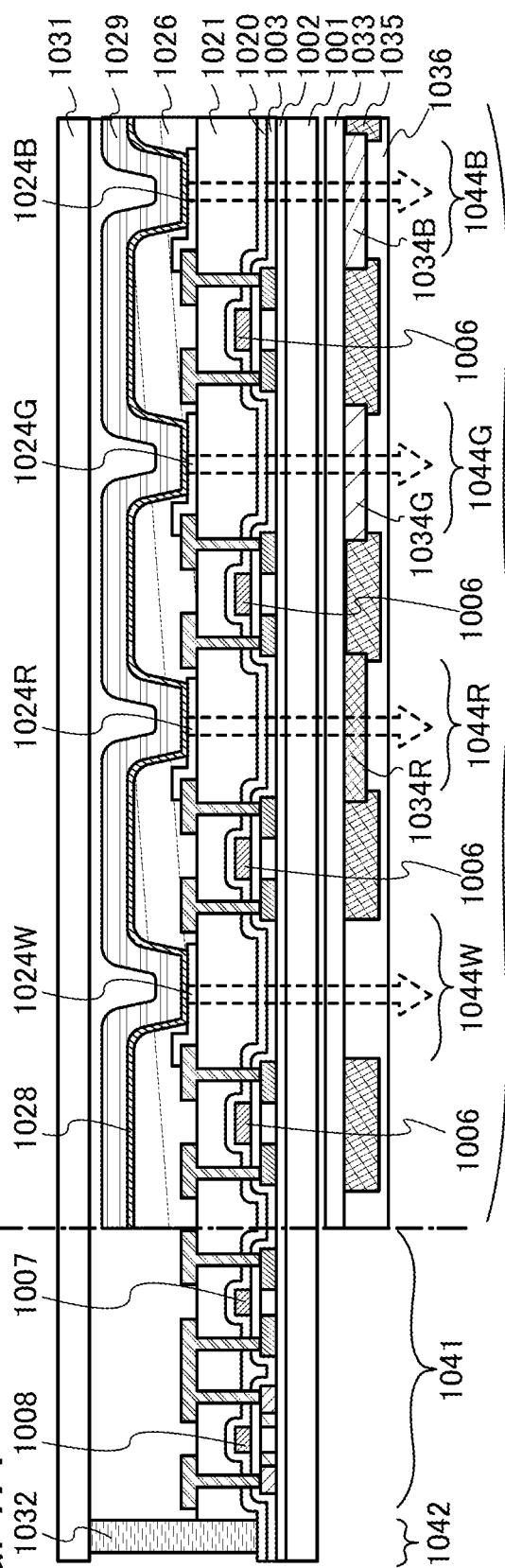
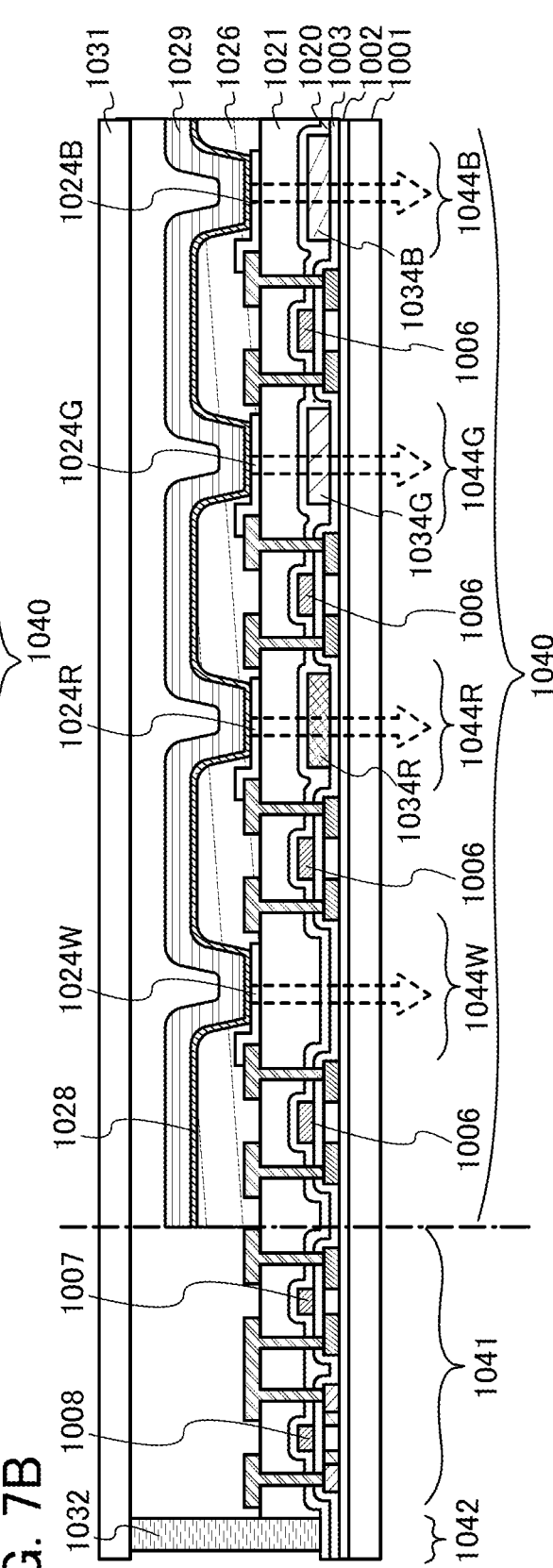
FIG. 7A
FIG. 7B

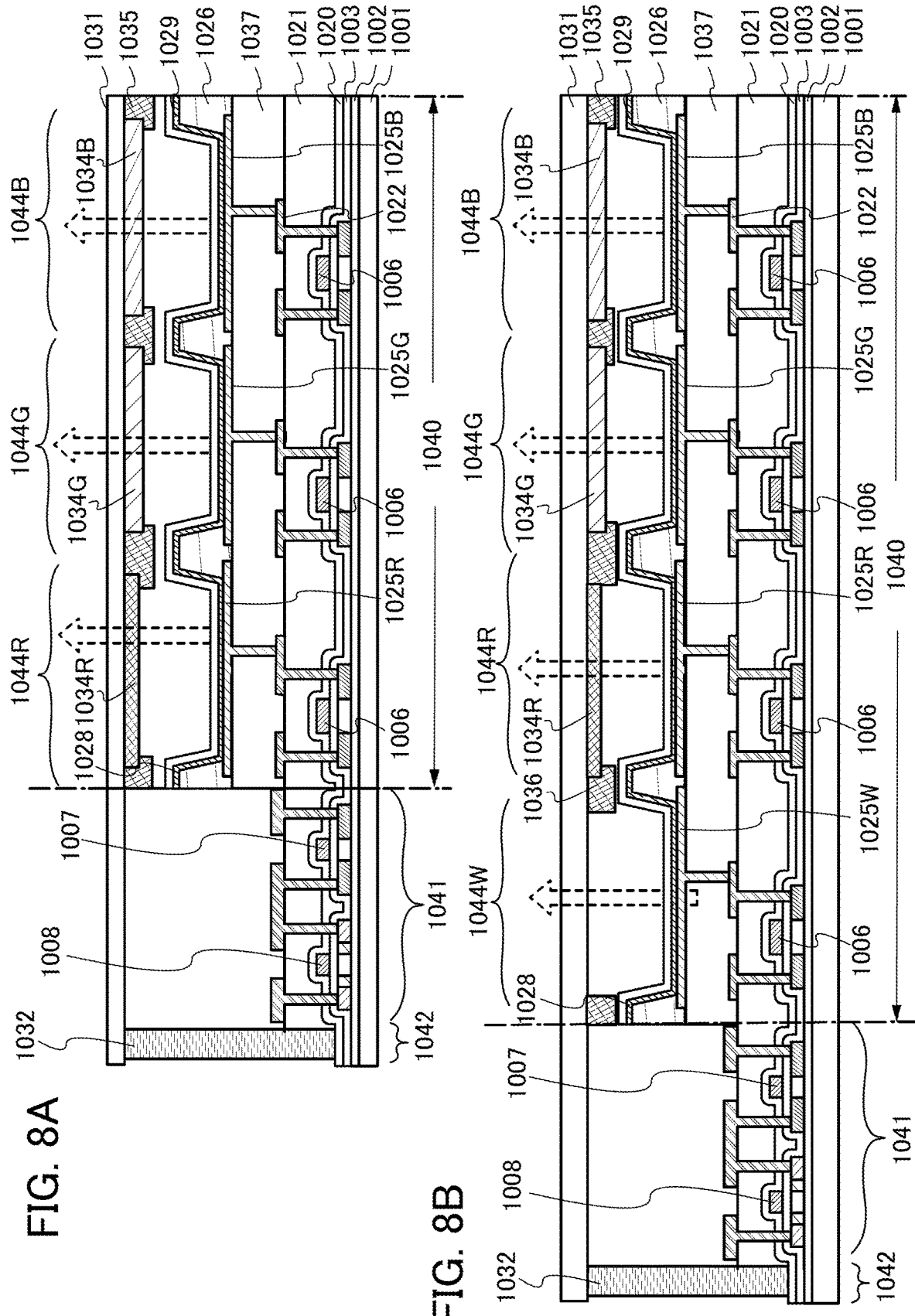

LIGHT-EMITTING ELEMENT, DISPLAY DEVICE, ELECTRONIC DEVICE, AND LIGHT DEVICE EACH INCLUDING TADF ORGANIC COMPOUND

This application is a continuation of copending U.S. application Ser. No. 16/758,999, filed on Apr. 24, 2020 which is a 371 of international application PCT/M2018/058227 filed on Oct. 23, 2018 which are all incorporated herein by reference.

TECHNICAL FIELD

One embodiment of the present invention relates to a light-emitting element, or a display device, an electronic device, and a lighting device each including the light-emitting element.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

BACKGROUND ART

In recent years, research and development of light-emitting elements using electroluminescence (EL) have been actively conducted. In the basic structure of such a light-emitting element, a layer containing a light-emitting substance (an EL layer) is provided between a pair of electrodes. Voltage application between the electrodes of this element can cause light emission from the light-emitting substance.

Since the above light-emitting element is a self-luminous element, a display device using this light-emitting element has advantages such as high visibility, no necessity of a backlight, and low power consumption. Furthermore, such a light-emitting element also has advantages in that the element can be formed to be thin and lightweight and has high response speed, for example.

In a light-emitting element (e.g., an organic EL element) where an EL layer containing an organic compound as a light-emitting substance is provided between a pair of electrodes, by voltage application between the pair of electrodes, electrons from a cathode and holes from an anode are injected into the EL layer having a light-emitting property; thus, current flows. By recombination of the injected electrons and holes, the light-emitting organic compound is brought into an excited state to provide light emission.

Excited states that can be formed by an organic compound are a singlet excited state (S*) and a triplet excited state (T*). Light emission from the singlet excited state is referred to as fluorescence, and light emission from the triplet excited state is referred to as phosphorescence. The statistical generation ratio of S* to T* in a light-emitting element is 1:3. Thus, a light-emitting element containing a compound that emits phosphorescence (phosphorescent compound) has higher emission efficiency than a light-emitting element containing a compound that emits fluorescence (fluorescent compound). For this reason, light-emitting elements containing phosphorescent compounds capable of converting triplet excitation energy into light emission have been actively developed in recent years.

Among light-emitting elements containing phosphorescent compounds, in particular, a light-emitting element that emits blue light has not yet been put into practical use because it is difficult to develop a stable compound having a high triplet excited energy level. For this reason, the development of a light-emitting element containing a fluorescent compound, which is more stable, has been conducted and a technique for increasing the emission efficiency of a light-emitting element containing a fluorescent compound (fluorescent light-emitting element) has been searched.

Examples of a fluorescent light-emitting element include a light-emitting element containing a thermally activated delayed fluorescent (TADF) material. In a thermally activated delayed fluorescent material, a singlet excited state is generated from a triplet excited state by reverse intersystem crossing, and the singlet excited state is converted into light emission.

Patent Document 1 discloses the following method: in a light-emitting element containing a thermally activated delayed fluorescent material and a fluorescent compound, singlet excitation energy of the thermally activated delayed fluorescent material is transferred to the fluorescent compound and light emission is obtained from the fluorescent compound.

REFERENCES

[Patent Document]
[Patent Document 1] Japanese Published Patent Application No. 2014-045179 [Non-Patent Document]
[Non-Patent Document 1] T. Sajoto et al., *J. Am. Chem. Soc.*, 2009, 131, 9813

DISCLOSURE OF INVENTION

A fluorescent material cannot convert triplet excitation energy into light emission. Thus, a fluorescent light-emitting element is likely to have lower emission efficiency than a phosphorescent light-emitting element. In addition, a fluorescent light-emitting element requires a large amount of current to emit light with high luminance and thus the amounts of generated heat and current load become higher. Accordingly, it is difficult for a fluorescent light-emitting element to have high reliability.

In order to increase emission efficiency of a fluorescent light-emitting element, it is preferable that triplet excitation energy in a light-emitting layer be efficiently converted into singlet excitation energy or be efficiently transferred to a fluorescent light-emitting material. Hence, development of a method and a material for efficiently generating a singlet excited state from a triplet excited state to further increase emission efficiency of a light-emitting element is required. Moreover, a material having a high carrier-transport property needs to be used for a light-emitting layer in order to reduce driving voltage.

In view of the above, an object of one embodiment of the present invention is to provide a light-emitting element having high emission efficiency. Another object of one embodiment of the present invention is to provide a light-emitting element with low driving voltage. Another object of one embodiment of the present invention is to provide a highly reliable light-emitting element. Another object of one embodiment of the present invention is to provide a light-emitting element with low power consumption. Another object of one embodiment of the present invention is to provide a light-emitting element that emits light with high color purity. Another object of one embodiment of the present invention is to provide a novel light-emitting element. Another object of one embodiment of the present invention is to provide a novel light-emitting device. Another object of one embodiment of the present invention is to provide a novel electronic device.

Note that the description of the above objects does not preclude the existence of other objects. In one embodiment of the present invention, there is no need to achieve all the objects. Objects other than the above objects will be apparent from and can be derived from the description of the specification and the like.

As described above, development of a method for efficiently converting triplet excitation energy into light emission in a light-emitting element that emits fluorescence is required. Thus, energy transfer efficiency between materials used in a light-emitting layer needs to be increased.

In view of the above, one embodiment of the present invention is a light-emitting element including a light-emitting layer between a pair of electrodes. The light-emitting layer includes a first organic compound, a second organic compound, and a third organic compound. The first organic compound has a function of converting triplet excitation energy into light emission. A difference between singlet excitation energy of the second organic compound and triplet excitation energy of the second organic compound is greater than or equal to 0 eV and less than or equal to 0.2 eV. The third organic compound has a function of converting singlet excitation energy into light emission. Light emission from the light-emitting layer includes light emission from the third organic compound.

Another embodiment of the present invention is a light-emitting element including a light-emitting layer between a pair of electrodes. The light-emitting layer includes a first organic compound, a second organic compound, and a third organic compound. The first organic compound has a function of converting triplet excitation energy into light emission. The second organic compound includes a π-electron rich skeleton and a π-electron deficient skeleton. The third organic compound has a function of converting singlet excitation energy into light emission. Light emission from the light-emitting layer includes light emission from the third organic compound.

Another embodiment of the present invention is a light-emitting element including a light-emitting layer between a pair of electrodes. The light-emitting layer includes a first organic compound, a second organic compound, and a third organic compound. The first organic compound and the second organic compound can form an exciplex. The first organic compound has a function of converting triplet excitation energy into light emission. A difference between a singlet excitation energy level of the second organic compound and a triplet excitation energy level of the second organic compound is greater than or equal to 0 eV and less than or equal to 0.2 eV. The third organic compound has a function of converting singlet excitation energy into light emission. Light emission from the light-emitting layer includes light emission from the third organic compound.

Another embodiment of the present invention is a light-emitting element including a light-emitting layer between a pair of electrodes. The light-emitting layer includes a first organic compound, a second organic compound, and a third organic compound. The first organic compound and the second organic compound can form an exciplex. The first organic compound has a function of converting triplet excitation energy into light emission. The second organic compound includes a π-electron rich skeleton and a π-electron deficient skeleton. The third organic compound has a function of converting singlet excitation energy into light emission. Light emission from the light-emitting layer includes light emission from the third organic compound.

In any of the above embodiments, the first organic compound preferably has a function of supplying excitation energy to the third organic compound.

In any of the above embodiments, the exciplex preferably has a function of supplying excitation energy to the third organic compound.

In any of the above embodiments, it is preferable that the π-electron rich skeleton and the π-electron deficient skeleton be directly bonded to each other.

In any of the above embodiments, a triplet excitation energy level of the first organic compound is preferably higher than or equal to a singlet excitation energy level of the third organic compound.

In any of the above embodiments, the first organic compound preferably contains Ru, Rh, Pd, Os, Ir, or Pt.

In any of the above embodiments, the first organic compound preferably has a function of emitting phosphorescence.

In any of the above embodiments, the lowest triplet excitation energy level of the first organic compound is preferably lower than or equal to the lowest triplet excitation energy level of the second organic compound.

In any of the above embodiments, an emission spectrum of the exciplex preferably includes a region overlapping with an absorption band on the longest wavelength side in an absorption spectrum of the third organic compound.

In any of the above embodiments, the first organic compound preferably has an emission quantum yield higher than or equal to 0% and lower than or equal to 40% at room temperature.

In any of the above embodiments, the third organic compound preferably emits fluorescence.

Another embodiment of the present invention is a display device including the light-emitting element having any of the above structures and at least one of a color filter and a transistor. Another embodiment of the present invention is an electronic device including the display device and at least one of a housing and a touch sensor. Another embodiment of the present invention is a lighting device including the light-emitting element having any of the above structures and at least one of a housing and a touch sensor. The category of one embodiment of the present invention includes not only a light-emitting device including a light-emitting element but also an electronic device including a light-emitting device. Accordingly, the light-emitting device in this specification refers to an image display device or a light source (including a lighting device). The light-emitting device may include, in its category, a display module in which a connector such as a flexible printed circuit (FPC) or a tape carrier package (TCP) is connected to a light-emitting element, a display module in which a printed wiring board is provided on the tip of a TCP, or a display module in which an integrated circuit (IC) is directly mounted on a light-emitting element by a chip on glass (COG) method.

One embodiment of the present invention can provide a light-emitting element having high emission efficiency. Another embodiment of the present invention can provide a light-emitting element with low driving voltage. Another embodiment of the present invention can provide a highly reliable light-emitting element. Another embodiment of the present invention can provide a light-emitting element with low power consumption. Another embodiment of the present invention can provide a light-emitting element that emits light with high color purity. Another embodiment of the present invention can provide a novel light-emitting element. Another embodiment of the present invention can provide a novel light-emitting device. Another embodiment of the present invention can provide a novel electronic device.

Note that the description of these effects does not preclude the existence of other effects. One embodiment of the present invention does not necessarily have all the effects described above. Other effects will be apparent from and can be derived from the description of the specification, the drawings, the claims, and the like.

BRIEF DESCRIPTION OF DRAWINGS

In the accompanying drawings:

FIGS. 7A and 7B are schematic cross-sectional views each illustrating a display device of one embodiment of the present invention;

FIGS. 8A and 8B are schematic cross-sectional views each illustrating a display device of one embodiment of the present invention;

BEST MODE FOR CARRYING OUT THE INVENTION

Figure 1A:
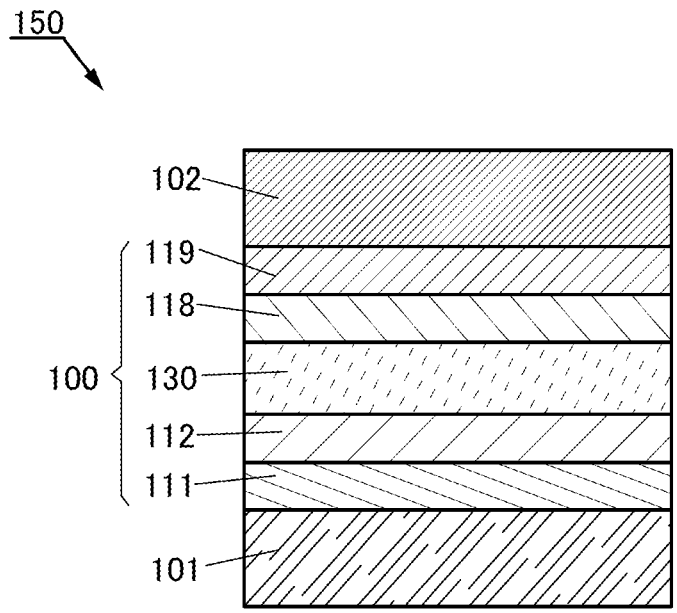
FIGS. 1A and 1B are schematic cross-sectional views of a light-emitting element of one embodiment of the present invention and FIG. 1C shows the correlation of energy levels in a light-emitting layer.

Embodiments of the present invention will be described in detail below with reference to the drawings. Note that the present invention is not limited to the following description, and the mode and details can be modified in various ways without departing from the spirit and scope of the present invention. Accordingly, the present invention should not be interpreted as being limited to the content of the embodiments and examples below.

Note that the position, size, range, or the like of each component illustrated in the drawings and the like are not accurately represented in some cases for easy understanding. Therefore, the disclosed invention is not necessarily limited to the position, size, range, or the like disclosed in the drawings and the like.

Note that the ordinal numbers such as first and second in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those used for specifying one embodiment of the present invention.

In the description of modes of the present invention in this specification and the like with reference to the drawings, the same components in different drawings are denoted by the same reference numeral in some cases.

In this specification and the like, the terms "film" and "layer" can be interchanged with each other. For example, the term "conductive layer" can be changed into the term "conductive film" in some cases, and the term "insulating film" can be changed into the term "insulating layer" in some cases.

In this specification and the like, a singlet excited state (S*) refers to a singlet state having excitation energy. An S1 level refers to the lowest level of the singlet excitation energy level, that is, the excitation energy level of the lowest singlet excited state (S1 state). A triplet excited state (T*) refers to a triplet state having excitation energy. A T1 level refers to the lowest level of the triplet excitation energy level, that is, the excitation energy level of the lowest triplet excited state (T1 state). Note that in this specification and the like, simple expressions "singlet excited state" and "singlet excitation energy level" sometimes mean the S1 state and the S1 level, respectively. In addition, expressions "triplet excited state" and "triplet excitation energy level" sometimes mean the T1 state and the T1 level, respectively.

In this specification and the like, a fluorescent compound refers to a compound that emits light in a visible light region when the relaxation from a singlet excited state to a ground state occurs. A phosphorescent compound refers to a compound that emits light in a visible light region at room temperature when the relaxation from a triplet excited state to a ground state occurs. That is, a phosphorescent compound refers to a compound that can convert triplet excitation energy into visible light.

Note that room temperature in this specification and the like refers to a temperature higher than or equal to 0° C. and lower than or equal to 40° C.

In this specification and the like, a blue wavelength range refers to a wavelength range of greater than or equal to 400 nm and less than 490 nm, and blue light has at least one emission spectrum peak in the wavelength range. A green wavelength range refers to a wavelength range of greater than or equal to 490 nm and less than 580 nm, and green light has at least one emission spectrum peak in the wavelength range. A red wavelength range refers to a wavelength range of greater than or equal to 580 nm and less than or equal to 680 nm, and red light has at least one emission spectrum peak in the wavelength range.

Embodiment 1

In this embodiment, a light-emitting element of one embodiment of the present invention will be described below with reference to FIGS. 1A to 1C, FIGS. 2A and 2B, FIG. 3, and FIGS. 4A and 4B.

Structure Example 1 of Light-Emitting Element

First, the structure of the light-emitting element of one embodiment of the present invention will be described below with reference to FIGS. 1A to 1C.

FIG. 1A is a schematic cross-sectional view of a light-emitting element 150 of one embodiment of the present invention.

The light-emitting element 150 includes a pair of electrodes (an electrode 101 and an electrode 102) and an EL layer 100 between the pair of electrodes. The EL layer 100 includes at least a light-emitting layer 130.

The EL layer 100 illustrated in FIG. 1A includes functional layers such as a hole-injection layer 111, a hole-transport layer 112, an electron-transport layer 118, and an electron-injection layer 119, in addition to the light-emitting layer 130.

Although description in this embodiment is given assuming that the electrode 101 and the electrode 102 of the pair of electrodes serve as an anode and a cathode, respectively, they are not limited thereto for the structure of the light-emitting element 150. That is, the electrode 101 may be a cathode, the electrode 102 may be an anode, and the stacking order of the layers between the electrodes may be reversed. In other words, the hole-injection layer 111, the hole-transport layer 112, the light-emitting layer 130, the electron-transport layer 118, and the electron-injection layer 119 may be stacked in this order from the anode side.

The structure of the EL layer 100 is not limited to the structure illustrated in FIG. 1A, and a structure including at least one layer selected from the hole-injection layer 111, the hole-transport layer 112, the electron-transport layer 118, and the electron-injection layer 119 is employed. Alternatively, the EL layer 100 may include a functional layer which has a function of lowering a hole- or electron-injection barrier, improving a hole- or electron-transport property, inhibiting a hole- or electron-transport property, or suppressing quenching by an electrode, for example. Note that the functional layer may be either a single layer or stacked layers.

Next, the light-emitting layer 130 is described below.

In one embodiment of the present invention, the light-emitting element 150 is a fluorescent light-emitting element that contains a fluorescent compound in the light-emitting layer 130. A fluorescent light-emitting element is highly reliable and emits light with high color purity because its emission spectrum tends to be shaper than that of a phosphorescent light-emitting element. Note that in an organic EL element, the generation ratio of singlet excitons to triplet excitons (hereinafter, referred to as exciton generation probability) is 1:3 according to the statistical probability. This means that, in a fluorescent light-emitting element that emits light using singlet excitons, only 25% of the generated excitons typically contribute to light emission. It is thus important to make triplet excitons contribute to light emission in order to increase the efficiency of a fluorescent light-emitting element.

In view of the above, the present inventors have found that triplet excitons can efficiently contribute to fluorescence, that is, a highly efficient fluorescent element can be obtained with the use of an organic compound that can convert triplet excitation energy into light emission, an organic compound in which a difference between singlet excitation energy and triplet excitation energy is greater than or equal to 0 eV and less than or equal to 0.2 eV, and an organic compound that emits fluorescence, for a light-emitting layer. The organic compound in which a difference between singlet excitation energy and triplet excitation energy is greater than or equal to 0 eV and less than or equal to 0.2 eV may be an organic compound including a π-electron rich skeleton and a π-electron deficient skeleton in one molecule.

Examples of the organic compound in which a difference between singlet excitation energy and triplet excitation energy is greater than or equal to 0 eV and less than or equal to 0.2 eV include a thermally activated delayed fluorescent (TADF) material. Note that the thermally activated delayed fluorescent material is a material having a small difference between the S1 level and the T1 level and having a function of converting triplet excitation energy into singlet excitation energy by reverse intersystem crossing. Thus, the thermally activated delayed fluorescent material can upconvert triplet excitation energy into singlet excitation energy (i.e., reverse intersystem crossing) using a small amount of thermal energy and efficiently generate a singlet excited state. An exciplex whose excited state is formed by two kinds of substances has an extremely small difference between the S1 level and the T1 level and functions as a thermally activated delayed fluorescent material that can convert triplet excitation energy into singlet excitation energy.

The organic compound including a π-electron rich skeleton and a π-electron deficient skeleton in one molecule has a bipolar property and a high carrier (electrons and holes) transport property; thus, the use of the organic compound for a light-emitting element can improve carrier balance and reduce driving voltage. The organic compound may have a TADF property. In that case, a structure is preferable in which a π-electron rich skeleton and a π-electron deficient skeleton are directly bonded to each other. With such a structure, the efficiency of reverse intersystem crossing increases; thus, a TADF material having high emission efficiency can be obtained.

A TADF material includes the organic compound including a π-electron rich skeleton and a π-electron deficient skeleton in one molecule. Thus, as described above, a TADF material has a high carrier-transport property, and the use of a TADF material for a light-emitting element can improve carrier balance. In addition, the driving voltage of the light-emitting element can be reduced.

Examples of the organic compound that has a function of converting triplet excitation energy into light emission include a compound that can emit phosphorescence (hereinafter, also referred to as phosphorescent compound). A phosphorescent compound in this specification and the like is a compound that emits phosphorescence but does not emit fluorescence at a temperature higher than or equal to a low temperature (e.g., 77 K) and lower than or equal to room temperature (i.e., higher than or equal to 77 K and lower than or equal to 313 K). The phosphorescent compound preferably contains a heavy atom in order to efficiently convert triplet excitation energy into light emission. In the case where the phosphorescent compound contains a heavy atom, transition between a singlet ground state and a triplet excited state is allowed by spin-orbit interaction (interaction between spin angular momentum and orbital angular momentum of an electron). Consequently, the probability of transition between the singlet ground state and the triplet excited state of the phosphorescent compound is increased; thus, the emission efficiency and the absorption probability that relate to the transition can be increased. In addition, energy transfer from a triplet excitation energy level of the phosphorescent compound to a singlet excitation energy level of a fluorescent compound by the Förster mechanism is allowed. To facilitate the energy transfer, the phosphorescent compound preferably contains a metal element with large spin-orbit interaction, specifically, a transition metal element. It is particularly preferable that the phosphorescent compound contain a platinum group element (ruthenium (Ru), rhodium (Rh), palladium (Pd), osmium (Os), iridium (Ir), or platinum (Pt)), especially iridium, in which case the probability of direct transition between the singlet ground state and the triplet excited state can be increased. Examples of the material that has a function of converting triplet excitation energy into light emission also include the above-described TADF material.

Figure 1B:
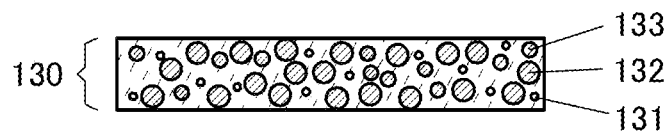

FIG. 1B is a schematic cross-sectional view illustrating an example of the light-emitting layer 130 in FIG. 1A. The light-emitting layer 130 illustrated in FIG. 1B contains a compound 131, a compound 132, and a compound 133. In one embodiment of the present invention, the compound 131 has a function of converting triplet excitation energy into light emission. The compound 132 is preferably a TADF material. The compound 133 is a guest material that emits fluorescence.

Structure Example 1 of Light-Emitting Layer

Figure 1C:
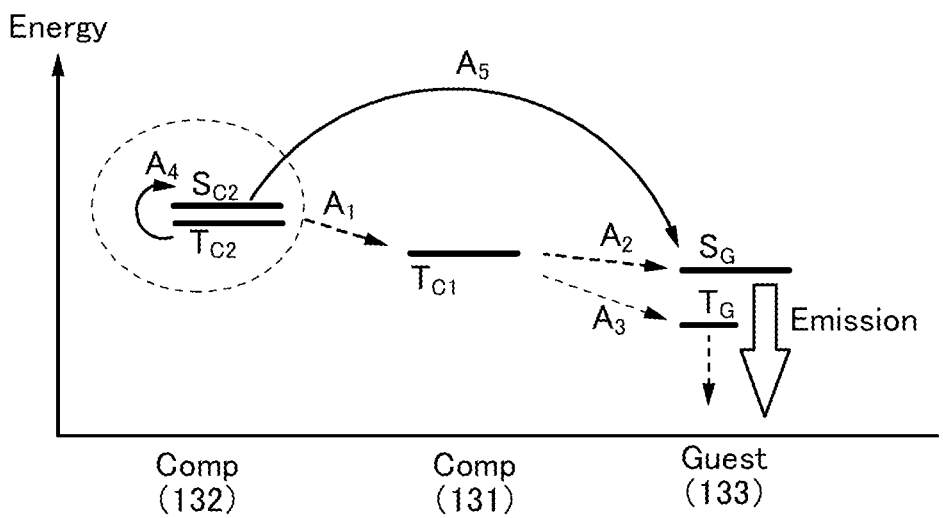

FIG. 1C shows an example of the correlation of energy levels in the light-emitting layer of the light-emitting element of one embodiment of the present invention. In this structure example, the compound 131 is a phosphorescent compound.

Specifically, FIG. 1C shows the correlation of the energy levels of the compounds 131, 132, and 133 in the light-emitting layer 130. The following explains what terms and signs in FIG. 1C represent:

Comp (131): the compound 131;
Comp (132): the compound 132;
Guest (133): the compound 133;
$T_{C1}$: the T1 level of the compound 131;
$S_{C2}$: the S1 level of the compound 132;
$T_{C2}$: the T1 level of the compound 132;
$S_G$: the S1 level of the compound 133; and
$T_G$: the T1 level of the compound 133.

In FIG. 1C, an excited state is formed when the compound 131 or the compound 132 receives holes and electrons. Here, since the compound 131 is a phosphorescent compound, intersystem crossing between a singlet state and a triplet state is allowed. Hence, both the singlet excitation energy and the triplet excitation energy of the compound 132 can be rapidly transferred to the compound 131 (Route $A_1$ in FIG. 1C). At this time, $S_{C2} \geq T_{C1}$ and $T_{C2} \geq T_{C1}$ are preferable. The light-emitting layer 130 is formed with a mixture of the compounds 131, 132, and 133; the proportion of the compound 132 is preferably higher than that of the compound 131 in the mixture, and specifically, the weight ratio of the compound 131 to the compound 132 preferably ranges from 1:9 to 3:7. With such a composition, the compound 131 can be excited efficiently. In addition, since the compound 131 is a phosphorescent compound, the triplet excitation energy of the compound 131 can be efficiently converted into the singlet excitation energy of the compound 133 (Route $A_2$ in FIG. 1C). Here, $S_{C2} \geq T_{C1} \geq S_G$ as shown in FIG. 1C is preferable, in which case the singlet excitation energy is efficiently transferred to the compound 133 serving as the guest material. Moreover, $T_{C2} \geq T_{C1} \geq S_G$ is preferable, in which case the triplet excitation energy is efficiently converted into the singlet excitation energy and transferred to the compound 133 serving as the guest material.

The triplet excitation energy transferred from $T_{C1}$ to $T_G$ is deactivated (Route $A_3$ in FIG. 1C). Thus, the amount of energy transfer through Route $A_3$ is preferably small. In order to avoid energy transfer through Route $A_3$, the weight ratio of the compound 133 to the total of the compounds 131 and 132 is preferably low. Specifically, the weight ratio of the compound 133 to the total of the compounds 131 and 132 is preferably greater than or equal to 0.001 and less than or equal to 0.05, further preferably greater than or equal to 0.001 and less than or equal to 0.01.

Note that when the direct carrier recombination process is dominant in the compound 133, a large number of triplet excitons are generated in the compound 133, resulting in decreased emission efficiency due to thermal deactivation. Thus, the proportion of the energy transfer process through Route $A_2$ is preferably higher than that of the direct carrier recombination process in the compound 133, in which case the generation probability of the triplet excited state of the compound 133 can be lowered and thermal deactivation can be suppressed. In order to make this condition, the weight ratio of the compound 133 to the total of the compounds 131 and 132 is preferably low. Specifically, the weight ratio of the compound 133 to the total of the compounds 131 and 132 is preferably greater than or equal to 0.001 and less than or equal to 0.05, further preferably greater than or equal to 0.001 and less than or equal to 0.01.

In the light-emitting element of one embodiment of the present invention, the compound 132 is capable of exhibiting thermally activated delayed fluorescence (TADF property). In other words, the compound 132 has a function of converting triplet excitation energy into singlet excitation energy by upconversion (Route $A_4$ in FIG. 1C). The singlet excitation energy of the compound 132 can be rapidly transferred to the compound 133 (Route $A_5$ in FIG. 1C). At this time, $S_{C2} \geq S_G$ is preferable.

Note that Route $A_1$ may occur even when reverse intersystem crossing shown by Route $A_4$ does not occur. That is, the energy transfer shown by Route $A_1$ may occur whether the reverse intersystem crossing shown by Route $A_4$ occurs or not.

As described above, in the light-emitting element of one embodiment of the present invention, there are a path where the triplet excitation energy is transferred to the compound 133 serving as the guest material through Route $A_1$ and Route $A_2$ in FIG. 1C and a path where the triplet excitation energy is transferred to the compound 133 through Route $A_4$ and Route $A_5$ in FIG. 1C. The path through which the triplet excitation energy is transferred to a fluorescent compound can increase the emission efficiency of a fluorescent light-emitting element. In addition, a plurality of paths through each of which the triplet excitation energy is transferred to a fluorescent compound can further increase the emission efficiency.

When the light-emitting layer 130 has the above-described structure, light emission from the fluorescent compound of the light-emitting layer 130 can be efficiently obtained.

In addition, $T_G$ is preferably 2.0 eV or lower, in which case a highly reliable light-emitting element can be obtained.

In the above structure, a material with a high emission quantum yield does not need to be used for the phosphorescent compound; accordingly, the material design is facilitated and the material can be selected from a wide range of choices. Specifically, the emission quantum yield of the compound may be greater than or equal to 0% and less than or equal to 50%, greater than or equal to 0% and less than or equal to 40%, greater than or equal to 0% and less than or equal to 25%, greater than or equal to 0% and less than or equal to 10%, or greater than or equal to 0% and less than or equal to 1% at room temperature or normal temperature. Furthermore, the compound preferably contains a heavy atom. Examples of the heavy atom include Ru, Rh, Pd, Os, Ir, and Pt.

Structure Example 2 of Light-Emitting Layer

Figure 2A:
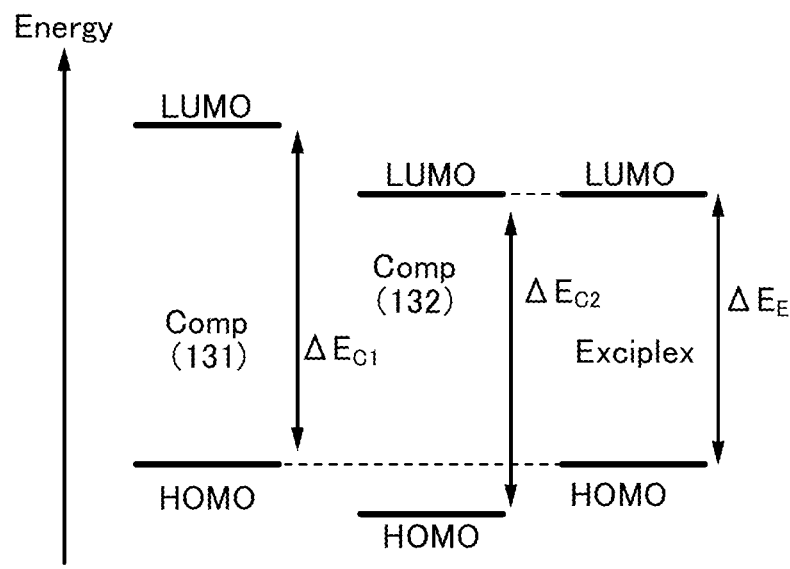
FIGS. 2A and 2B show the correlation of energy levels in a light-emitting layer of a light-emitting element of one embodiment of the present invention.
Figure 2B:
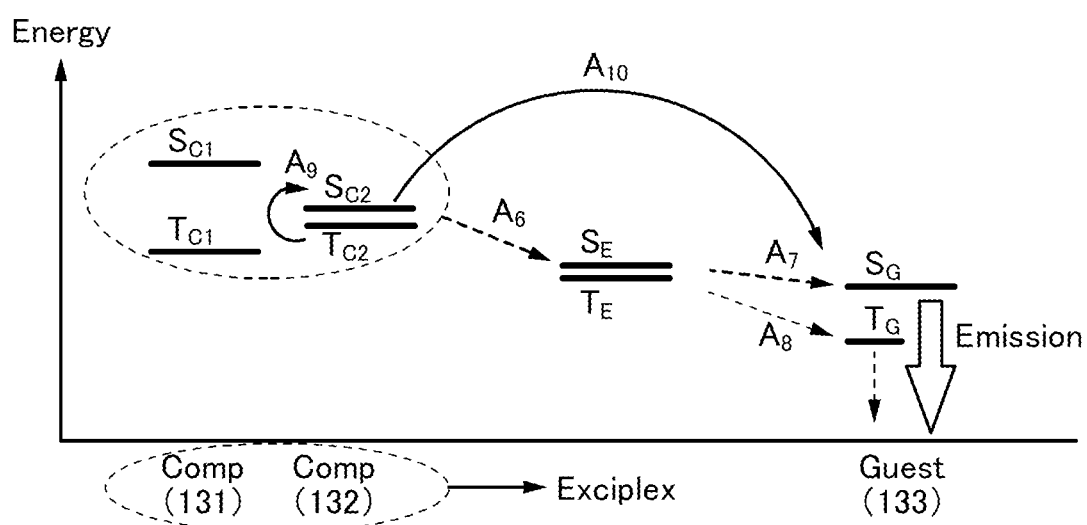

FIG. 2B shows an example of the correlation of energy levels in the light-emitting layer 130 of the light-emitting element 150 of one embodiment of the present invention. In this structure example, the compound 131 is a phosphorescent compound, and the compound 131 and the compound 132 form an exciplex.

Although any combination of the compound 131 and the compound 132 that can form an exciplex is acceptable, it is preferable that one of them be a compound having a hole-transport property and the other be a compound having an electron-transport property. In that case, a donor-acceptor exciplex is easily formed; thus, efficient formation of an exciplex is possible. When the compounds 131 and 132 are a combination of a compound having a hole-transport property and a compound having an electron-transport property, the carrier balance can be easily controlled depending on the mixing ratio. Specifically, the weight ratio of the compound having a hole-transport property to the compound having an electron-transport property is preferably within a range of 1:9 to 9:1. Since the carrier balance can be easily controlled with the above composition, a carrier recombination region can also be controlled easily.

Note that the formation of an exciplex can be confirmed by, for example, comparing the emission spectra of the compound 131, the compound 132, and a mixed film of the compounds 131 and 132 and observing a phenomenon in which the emission spectrum of the mixed film is shifted to the longer wavelength side than the emission spectra of the compounds 131 and 132 (or has a new peak on the longer wavelength side). Alternatively, the formation of an exciplex can be confirmed by comparing transient photoluminescence (PL) of the compound 131, the compound 132, and the mixed film of the compounds 131 and 132 and observing a difference in transient response (e.g., a phenomenon in which the transient PL lifetime of the mixed film has more long lifetime components or has a larger proportion of delayed components than that of each of the compounds 131 and 132). The transient PL can be replaced with transient electroluminescence (EL). That is, the formation of an exciplex can also be confirmed by comparing the transient EL of the compound 131, the compound 132, and the mixed film of the compounds 131 and 132 and observing a difference in transient response.

For the combination of the materials for forming an exciplex efficiently, it is preferable that the highest occupied molecular orbital (also referred to as HOMO) level of one of the compounds 131 and 132 be higher than that of the other compound and the lowest unoccupied molecular orbital (also referred to as LUMO) level of the one of the compounds be higher than that of the other compound. Specifically, the energy difference between the HOMO levels of the compound 131 and the compound 132 is preferably greater than or equal to 0.1 eV, further preferably greater than or equal to 0.2 eV, and still further preferably greater than or equal to 0.3 eV. Moreover, the energy difference between the LUMO levels of the compound 131 and the compound 132 is preferably greater than or equal to 0.1 eV, further preferably greater than or equal to 0.2 eV, and still further preferably greater than or equal to 0.3 eV. Such correlation of energy levels is suitable because electrons and holes, which are carriers injected from the pair of electrodes (the electrodes 101 and 102), are easily injected into the compound 131 and the compound 132. Note that the HOMO level of the compound 131 may be equivalent to that of the compound 132, or the LUMO level of the compound 131 may be equivalent to that of the compound 132.

Note that the LUMO levels and the HOMO levels of the compounds can be derived from the electrochemical characteristics (the reduction potentials and the oxidation potentials) of the compounds that are measured by cyclic voltammetry (CV).

When the compound 131 has a hole-transport property and the compound 132 has an electron-transport property, for example, it is preferable that the HOMO level of the compound 131 be higher than that of the compound 132 and the LUMO level of the compound 131 be higher than that of the compound 132, as in an energy band diagram in FIG. 2A. Such correlation of energy levels is suitable because electrons and holes, which are carriers injected from the pair of electrodes (the electrodes 101 and 102), are easily injected into the compound 131 and the compound 132.

In FIG. 2A, Comp (131) represents the compound 131; Comp (132) represents the compound 132; $\Delta E_{C1}$ represents the energy difference between the LUMO level and the HOMO level of the compound 131; $\Delta E_{C2}$ represents the energy difference between the LUMO level and the HOMO level of the compound 132; and $\Delta E_E$ represents the energy difference between the LUMO level of the compound 132 and the HOMO level of the compound 131.

The exciplex formed by the compound 131 and the compound 132 has HOMO in the compound 131 and LUMO in the compound 132. The excitation energy of the exciplex substantially corresponds to the energy difference between the LUMO level of the compound 132 and the HOMO level of the compound 131 ($\Delta E_E$), which is smaller than the energy difference between the LUMO level and the HOMO level of the compound 131 ($\Delta E_{C1}$) and the energy difference between the LUMO level and the HOMO level of the compound 132 ($\Delta E_{C2}$). Thus, when the compound 131 and the compound 132 form an exciplex, an excited state can be formed with lower excitation energy. Having lower excitation energy, the exciplex can form a stable excited state.

FIG. 2B shows the correlation of the energy levels of the compounds 131, 132, and 133 in the light-emitting layer 130. The following explains what terms and signs in FIG. 2B represent.

The other terms and signs in FIG. 2B are the same as those in FIG. 1C.

$S_{C1}$: the S1 level of the compound 131;
$S_E$: the S1 level of the exciplex; and
$T_E$: the T1 level of the exciplex.

In this structure example, the compound 131 and the compound 132 contained in the light-emitting layer 130 form the exciplex in the light-emitting element of one embodiment of the present invention. The S1 level ($S_E$) and the T1 level ($T_E$) of the exciplex are close to each other (see Route $A_6$ in FIG. 2B).

When the exciplex formed through the above process loses excitation energy by emitting light or supplying the excitation energy to another material, for example, and is brought into a ground state, the two substances forming the exciplex individually behave as the original separate substances.

Since the excitation energy levels ($S_E$ and $T_E$) of the exciplex are lower than the S1 levels ($S_{C1}$ and $S_{C2}$) of the substances (the compounds 131 and 132) that form the exciplex, an excited state can be formed with lower excitation energy. Accordingly, the driving voltage of the light-emitting element 150 can be reduced.

Since the S1 level and the T1 level ($S_E$ and $T_E$) of the exciplex are close to each other, the exciplex has a function of exhibiting thermally activated delayed fluorescence. In other words, the exciplex has a function of converting triplet excitation energy into singlet excitation energy by upconversion. Thus, the triplet excitation energy generated in the light-emitting layer 130 is partly converted into singlet excitation energy by the exciplex. In order to cause this conversion, the energy difference between the S1 level and the T1 level ($S_E$ and $T_E$) of the exciplex is preferably greater than 0 eV and less than or equal to 0.2 eV, further preferably greater than 0 eV and less than or equal to 0.1 eV. Note that in order to efficiently cause reverse intersystem crossing, the T1 level of the exciplex ($T_E$) is preferably lower than the T1 levels of the substances (the compounds 131 and 132) forming the exciplex ($T_{C1}$ and $T_{C2}$). Accordingly, quenching of the triplet excitation energy of the exciplex formed by the compounds 131 and 132 does not easily occur, which causes efficient reverse intersystem crossing from triplet excitation energy to singlet excitation energy by the exciplex.

The singlet excitation energy level of the exciplex ($S_E$) is preferably higher than the singlet excitation energy level of the compound 133 ($S_G$) serving as a light-emitting material. With such correlation of energy levels, the singlet excitation energy of the formed exciplex can be transferred from the singlet excitation energy level of the exciplex ($S_E$) to the singlet excitation energy level of the compound 133 ($S_G$).

Here, the correlation of energy levels of the compounds 131 and 132 is not limited to that shown in FIG. 2B. That is, the singlet excitation energy level of the compound 131 ($S_{C1}$) may be higher or lower than the singlet excitation energy level of the compound 132 ($S_{C2}$), and the triplet excitation energy level of the compound 131 ($T_{C1}$) may be higher or lower than the triplet excitation energy level of the compound 132 ($T_{C2}$).

A phosphorescent compound is used as one of the compounds that form the exciplex in one embodiment of the present invention, which allows intersystem crossing between a singlet state and a triplet state. Thus, an exciplex in which the triplet excited state can be transferred to the singlet ground state can be formed. In that case, the triplet excitation energy level of the exciplex ($T_E$) is preferably higher than the singlet excitation energy level of the compound 133 ($S_G$) serving as a light-emitting material. With such correlation of energy levels, the triplet excitation energy of the formed exciplex can be transferred from the triplet excitation energy level of the exciplex ($T_E$) to the singlet excitation energy level of the compound 133 ($S_G$). Note that it is sometimes difficult to clearly distinguish fluorescence and phosphorescence from each other in an emission spectrum because the S1 level and the T1 level ($S_E$ and $T_E$) of the exciplex are close to each other. In that case, fluorescence and phosphorescence can sometimes be distinguished from each other by the emission lifetime.

Through the above-described energy transfer process, the compound 133 is brought into a singlet excited state and can emit light (see Route $A_7$ in FIG. 2B).

The triplet excitation energy transferred from $T_E$ to $T_G$ is deactivated (Route $A_8$ in FIG. 2B). Thus, the amount of energy transfer through Route $A_8$ is preferably small. In order to avoid energy transfer through Route $A_8$, the weight ratio of the compound 133 to the total of the compounds 131 and 132 is preferably low. Specifically, the weight ratio of the compound 133 to the total of the compounds 131 and 132 is preferably greater than or equal to 0.001 and less than or equal to 0.05, further preferably greater than or equal to 0.001 and less than or equal to 0.01.

Note that when the direct carrier recombination process is dominant in the compound 133, a large number of triplet excitons are generated in the compound 133, resulting in decreased emission efficiency due to thermal deactivation. Thus, the proportion of the energy transfer through the exciplex formation process (Route $A_7$ in FIG. 2B) is preferably higher than that of the direct carrier recombination process in the compound 133, in which case the generation probability of the triplet excited state of the compound 133 can be lowered and thermal deactivation can be suppressed. In order to make this condition, as described above, the weight ratio of the compound 133 to the total of the compounds 131 and 132 is preferably low. Specifically, the weight ratio of the compound 133 to the total of the compounds 131 and 132 is preferably greater than or equal to 0.001 and less than or equal to 0.05, further preferably greater than or equal to 0.001 and less than or equal to 0.01.

In addition, $T_G$ is preferably 2.0 eV or lower, in which case a highly reliable light-emitting element can be obtained.

Alternatively, the compound 131 may have an electron-transport property and the compound 132 may have a hole-transport property. In that case, the HOMO level of the compound 132 is preferably higher than that of the compound 131 and the LUMO level of the compound 132 is preferably higher than that of the compound 131.

The weight ratio of the compound 131 to the compound 132 is preferably low. Specifically, the weight ratio of the compound 131 to the compound 132 is preferably greater than or equal to 0.01 and less than or equal to 0.5, further preferably greater than or equal to 0.05 and less than or equal to 0.3.

When all the energy transfer processes through Route $A_6$ and Route $A_7$ occur efficiently in the above manner, both the singlet excitation energy and the triplet excitation energy generated in the light-emitting layer 130 are efficiently converted into the singlet excitation energy of the compound 133, whereby the light-emitting element 150 can emit light with high emission efficiency.

In the light-emitting element of one embodiment of the present invention, the compound 132 preferably includes a π-electron deficient skeleton. Such a composition lowers the LUMO level of the compound 132, which is suitable for forming an exciplex.

In addition, in the light-emitting element of one embodiment of the present invention, the compound 132 preferably includes a π-electron rich skeleton. Such a composition increases the HOMO level of the compound 132, which is suitable for forming an exciplex.

In the light-emitting element of one embodiment of the present invention, the compound 132 is capable of exhibiting thermally activated delayed fluorescence (TADF property). Thus, the compound 132 that does not form an exciplex has a function of converting triplet excitation energy into singlet excitation energy by upconversion as described in the above structure example of the light-emitting layer (Route $A_9$ in FIG. 2B). The singlet excitation energy of the compound 132 can be rapidly transferred to the compound 133 (Route $A_{10}$ in FIG. 2B). At this time, $S_{C2}$ $S_G$ is preferable.

As described above, in the light-emitting element of one embodiment of the present invention, there are a path where the triplet excitation energy is transferred to the compound 133 serving as the guest material through Route $A_6$ and Route $A_7$ in FIG. 2B and a path where the triplet excitation energy is transferred to the compound 133 through Route $A_9$ and Route $A_{10}$ in FIG. 2B. As described in the above structure example of the light-emitting layer, the path through which the triplet excitation energy is transferred to a fluorescent compound can increase the emission efficiency of a fluorescent light-emitting element. In addition, a plurality of paths through each of which the triplet excitation energy is transferred to a fluorescent compound can further increase the emission efficiency.

The above-described process through Route $A_6$ and Route $A_7$ may be referred to as exciplex-singlet energy transfer (ExSET) or exciplex-enhanced fluorescence (ExEF) in this specification and the like. In other words, in the light-emitting layer 130, excitation energy is supplied from the exciplex to the fluorescent compound.

When the light-emitting layer 130 has the above-described structure, light emission from the fluorescent compound can be efficiently obtained.

Structure Example 3 of Light-Emitting Layer

Figure 3:
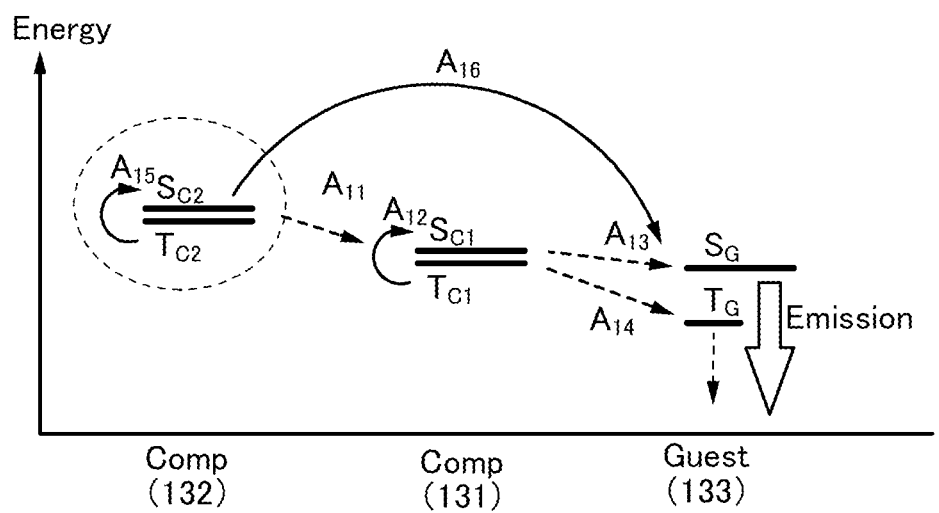
FIG. 3 shows the correlation of energy levels in a light-emitting layer of a light-emitting element of one embodiment of the present invention.

FIG. 3 shows an example of the correlation of energy levels in the light-emitting layer of the light-emitting element of one embodiment of the present invention. In this structure example, the compound 131 is a TADF material. Note that $S_{C1}$ represents the S1 level of the compound 131, and the other terms and signs in FIG. 3 are the same as those in FIG. 1C.

In FIG. 3, an excited state is formed when the compound 131 or the compound 132 receives holes and electrons. The excitation energy of the compound 132 can be rapidly transferred to the compound 131 (Route $A_{11}$ in FIG. 3). At this time, $S_{C2} \geq S_{C1}$ and $T_{C2} \geq T_{C1}$ are preferable. Since the compound 131 is a thermally activated delayed fluorescent material, the triplet excitation energy of the compound 131 is upconverted into the singlet excitation energy at a temperature around room temperature (Route $A_{12}$ in FIG. 3). Moreover, because energy transfer from the singlet excitation energy level of the compound 131 ($S_{C1}$) to the singlet excitation energy level of the compound 133 ($S_G$) (Route $A_{13}$ in FIG. 3) is allowed, the triplet excitation energy of the compound 131 can be transferred to the singlet excitation energy level of the compound 133 ($S_G$) through the processes via Route $A_{11}$ to Route $A_{13}$. Here, as shown in FIG. 3, $T_{C2} \geq T_{C1} \geq S_G$ is preferable, in which case both the singlet excitation energy and the triplet excitation energy are efficiently transferred from the compounds 131 and 132 to the compound 133 serving as the guest material.

To advance the above-described upconversion efficiently, the energy difference between the S1 level ($S_{C2}$) and the T1 level ($T_{C2}$) of the TADF material is preferably greater than 0 eV and less than or equal to 0.2 eV, further preferably greater than 0 eV and less than or equal to 0.1 eV.

The triplet excitation energy transferred from $T_{C1}$ to $T_G$ is deactivated (Route $A_{14}$ in FIG. 3). Thus, the amount of energy transfer through Route $A_{14}$ is preferably small. In order to avoid energy transfer through Route $A_{14}$, the energy difference between $T_{C1}$ and $T_G$ is preferably large; therefore, $T_G$ is preferably 2.0 eV or lower. With such a structure, a highly reliable light-emitting element having high emission efficiency can be obtained.

As described in the above structure example of the light-emitting layer, the compound 132 is the TADF material and thus has a function of converting triplet excitation energy into singlet excitation energy by upconversion (Route $A_{15}$ in FIG. 3). The singlet excitation energy of the compound 132 can be rapidly transferred to the compound 133 (Route $A_{16}$ in FIG. 3). At this time, $S_{C2} \geq S_G$ is preferable.

As described in the above structure example of the light-emitting layer, in the light-emitting element of one embodiment of the present invention, there are a path where the triplet excitation energy is transferred to the compound 133 serving as the guest material through Route $A_{11}$ to Route $A_{13}$ in FIG. 3 and a path where the triplet excitation energy is transferred to the compound 133 through Route $A_{15}$ and Route $A_{16}$ in FIG. 3. The path through which the triplet excitation energy is transferred to a fluorescent compound can increase the emission efficiency of a fluorescent light-emitting element. In addition, a plurality of paths through each of which the triplet excitation energy is transferred to a fluorescent compound can further increase the emission efficiency.

Note that Route $A_{11}$ may occur even when reverse intersystem crossing shown by Route $A_{15}$ does not occur. That is, the energy transfer shown by Route $A_{11}$ may occur whether the reverse intersystem crossing shown by Route $A_{15}$ occurs or not.

Structure Example 4 of Light-Emitting Layer

Figure 4A:
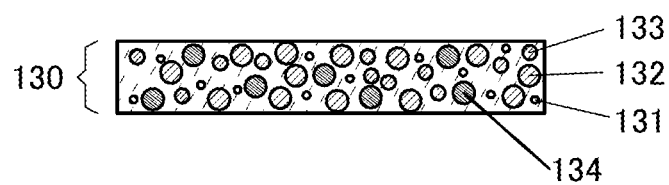
FIGS. 4A and 4B show the correlation of energy levels in a light-emitting layer of a light-emitting element of one embodiment of the present invention.

FIG. 4A shows the light-emitting layer 130 containing four kinds of materials. In FIG. 4A, the light-emitting layer 130 contains the compound 131, the compound 132, the compound 133, and a compound 134. In one embodiment of the present invention, the compound 131 has a function of converting triplet excitation energy into light emission. The compound 132 is preferably a TADF material. The compound 133 is a guest material that emits fluorescence. The compound 134 is an organic compound that forms an exciplex together with the compound 132.

Figure 4B:
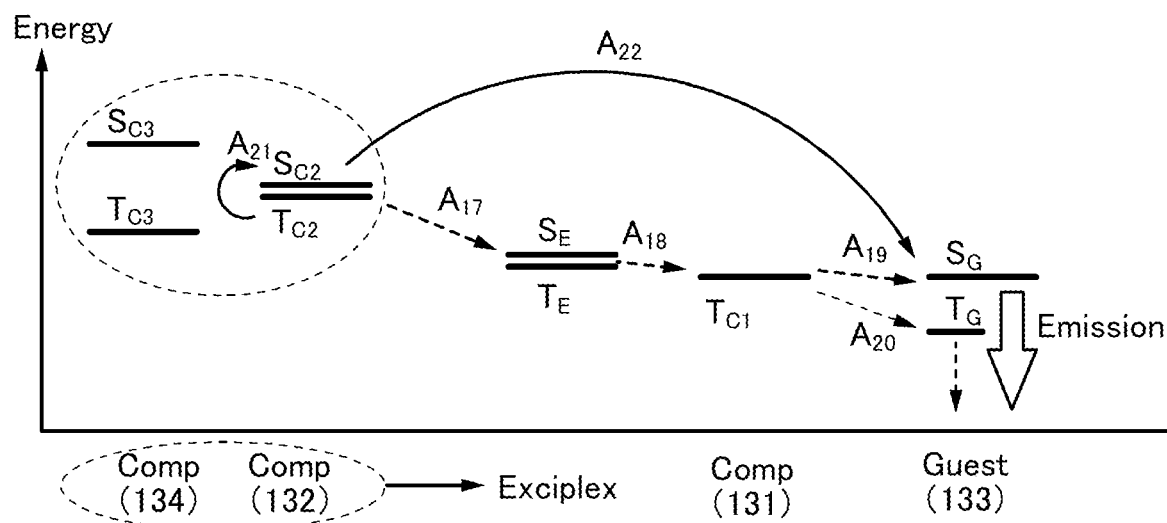

FIG. 4B shows the correlation of the energy levels of the compounds 131, 132, 133, and 134 in the light-emitting layer 130. The following explains what terms and signs in FIG. 4B represent. The other terms and signs in FIG. 4B are the same as those in FIG. 2B.

$S_{C3}$: the S1 level of the compound 134; and
$T_{C3}$: the T1 level of the compound 134.

In this structure example, the compound 132 and the compound 134 contained in the light-emitting layer 130 form the exciplex in the light-emitting element of one embodiment of the present invention. The S1 level ($S_E$) and the T1 level ($T_E$) of the exciplex are close to each other (see Route $A_{17}$ in FIG. 4B).

As described above, when the exciplex formed through the above process loses excitation energy, the two substances forming the exciplex individually behave as the original separate substances.

Since the excitation energy levels ($S_E$ and $T_E$) of the exciplex are lower than the S1 levels ($S_{C2}$ and $S_{C3}$) of the substances (the compounds 132 and 134) that form the exciplex, an excited state can be formed with lower excitation energy. Accordingly, the driving voltage of the light-emitting element 150 can be reduced.

Here, since the compound 131 is a phosphorescent compound, intersystem crossing between a singlet state and a triplet state is allowed. Hence, both the singlet excitation energy and the triplet excitation energy of the exciplex are rapidly transferred to the compound 131 (Route $A_{18}$). At this time, $T_E \geq T_{C1}$ is preferable. In addition, the triplet excitation energy of the compound 131 can be efficiently converted into the singlet excitation energy of the compound 133 (Route $A_{19}$). Here, $T_E \geq T_{C1} \geq S_G$ as shown in FIG. 4B is preferable, in which case the excitation energy of the compound 131 is efficiently transferred as the singlet excitation energy to the compound 133 serving as the guest material.

Although any combination of the compound 132 and the compound 134 that can form an exciplex is acceptable here, it is preferable that one of them be a compound having a hole-transport property and the other be a compound having an electron-transport property. In that case, a donor-acceptor exciplex is easily formed; thus, efficient formation of an exciplex is possible. When the compounds 132 and 134 are a combination of a compound having a hole-transport property and a compound having an electron-transport property, the carrier balance can be easily controlled depending on the mixture ratio. Specifically, the weight ratio of the compound having a hole-transport property to the compound having an electron-transport property is preferably within a range of 1:9 to 9:1. Since the carrier balance can be easily controlled with the above composition, a carrier recombination region can also be controlled easily.

For the combination of the materials for forming an exciplex efficiently, it is preferable that the HOMO level of one of the compounds 132 and 134 be higher than that of the other compound and the LUMO level of the one of the compounds be higher than that of the other compound. Specifically, the energy difference between the HOMO levels of the compound 132 and the compound 134 is preferably greater than or equal to 0.1 eV, further preferably greater than or equal to 0.2 eV, and still further preferably greater than or equal to 0.3 eV. Moreover, the energy difference between the LUMO levels of the compound 132 and the compound 134 is preferably greater than or equal to 0.1 eV, further preferably greater than or equal to 0.2 eV, and still further preferably greater than or equal to 0.3 eV. Such correlation of energy levels is suitable because electrons and holes, which are carriers injected from the pair of electrodes (the electrodes 101 and 102), are easily injected into the compound 132 and the compound 134. Note that the HOMO level of the compound 132 may be equivalent to that of the compound 134, or the LUMO level of the compound 132 may be equivalent to that of the compound 134.

Furthermore, the correlation of energy levels of the compounds 132 and 134 is not limited to that shown in FIG. 4B. That is, the singlet excitation energy level of the compound 132 ($S_{C2}$) may be higher or lower than the singlet excitation energy level of the compound 134 ($S_{C3}$), and the triplet excitation energy level of the compound 132 ($T_{C2}$) may be higher or lower than the triplet excitation energy level of the compound 134 ($T_{C3}$).

In the light-emitting element of one embodiment of the present invention, the compound 132 preferably includes a π-electron deficient skeleton. Such a composition lowers the LUMO level of the compound 132, which is suitable for forming an exciplex.

In addition, in the light-emitting element of one embodiment of the present invention, the compound 132 preferably includes a π-electron rich skeleton. Such a composition increases the HOMO level of the compound 132, which is suitable for forming an exciplex.

As described in the above structure example of the light-emitting layer, the compound 132 is the TADF material; thus, the compound 132 that does not form an exciplex has a function of converting triplet excitation energy into singlet excitation energy by upconversion (Route $A_{21}$ in FIG. 4B). The singlet excitation energy of the compound 132 can be rapidly transferred to the compound 133 (Route $A_{22}$ in FIG. 4B). At this time, $S_{C2} \geq S_G$ is preferable.

As described in the above structure example of the light-emitting layer, in the light-emitting element of one embodiment of the present invention, there are a path where the triplet excitation energy is transferred to the compound 133 serving as the guest material through Route $A_{17}$ to Route $A_{19}$ in FIG. 4B and a path where the triplet excitation energy is transferred to the compound 133 through Route $A_{21}$ and Route $A_{22}$ in FIG. 4B. The path through which the triplet excitation energy is transferred to a fluorescent compound can increase the emission efficiency of a fluorescent light-emitting element. In addition, a plurality of paths through each of which the triplet excitation energy is transferred to a fluorescent compound can further increase the emission efficiency.

The triplet excitation energy transferred from $T_{C1}$ to $T_G$ is deactivated (Route $A_{20}$ in FIG. 4B). Thus, the amount of energy transfer through Route $A_{20}$ is preferably small. In order to avoid energy transfer through Route $A_{20}$, the weight ratio of the compound 133 to the total of the compounds 131, 132, and 134 is preferably low. Specifically, the weight ratio of the compound 133 to the total of the compounds 131, 132, and 134 is preferably greater than or equal to 0.001 and less than or equal to 0.05, further preferably greater than or equal to 0.001 and less than or equal to 0.01.

In addition, $T_G$ is preferably 2.0 eV or lower, in which case a highly reliable light-emitting element can be obtained.

<Energy Transfer Mechanism>

Here, factors controlling the processes of the intermolecular energy transfer are described. As mechanisms of the intermolecular energy transfer, two mechanisms, i.e., the Förster mechanism (dipole-dipole interaction) and the Dexter mechanism (electron exchange interaction), have been proposed. Here, as for supply of excitation energy from a first material in an excited state to a second material in a ground state, an energy transfer process between molecules of the first material and the second material is described; the same can be applied to the case where one of the materials is an exciplex.

<<Förster Mechanism>>

In the Förster mechanism, energy transfer does not require direct contact between molecules and energy is transferred through a resonant phenomenon of dipolar oscillation between a first material and a second material. By the resonant phenomenon of dipolar oscillation, the first material provides energy to the second material, and thus, the first material in an excited state is brought into a ground state and the second material in a ground state is brought into an excited state. Note that the rate constant $k_{h^* \to g}$ of the Förster mechanism is expressed by Formula (1).

[Formula 1]

$$k_{h^* \to g} = \frac{9000c^4 K^2 \phi \ln 10}{128\pi^5 n^4 N \tau R^6} \int \frac{f'_h(v)\varepsilon_g(v)}{v^4} dv \quad (1)$$

In Formula (1), ν denotes a frequency, $f'_h(v)$ denotes a normalized emission spectrum of the first material (a fluorescent spectrum in the case where energy transfer from a singlet excited state is discussed, and a phosphorescent spectrum in the case where energy transfer from a triplet excited state is discussed), $\varepsilon_g(v)$ denotes a molar absorption coefficient of the second material, N denotes Avogadro's number, n denotes a refractive index of a medium, R denotes an intermolecular distance between the first material and the second material, τ denotes a measured lifetime of an excited state (fluorescence lifetime or phosphorescence lifetime), c denotes the speed of light, ϕ denotes an emission quantum yield (a fluorescence quantum yield in the case where energy transfer from a singlet excited state is discussed, and a phosphorescence quantum yield in the case where energy transfer from a triplet excited state is discussed), and $K^2$ denotes a coefficient (0 to 4) of orientation of a transition dipole moment between the first material and the second material. Note that $K^2=2/3$ in random orientation.

<<Dexter Mechanism>>

In the Dexter mechanism, the first material and the second material are close to a contact effective range where their orbitals overlap, and the first material in an excited state and the second material in a ground state exchange their electrons, which leads to energy transfer. Note that the rate constant $k_{h^* \to g}$ of the Dexter mechanism is expressed by Formula (2).

[Formula 2]

$$k_{h^* \to g} = \left(\frac{2\pi}{h}\right) K^2 \exp\left(-\frac{2R}{L}\right) \int f'_h(v)\varepsilon'_g(v) dv \quad (2)$$

In Formula (2), h denotes a Planck constant, K denotes a constant having an energy dimension, ν denotes a frequency, $f'_h(v)$ denotes a normalized emission spectrum of the first material (the fluorescent spectrum in the case where energy transfer from a singlet excited state is discussed, and the phosphorescent spectrum in the case where energy transfer from a triplet excited state is discussed), $\varepsilon'_g(v)$ denotes a normalized absorption spectrum of the second material, L denotes an effective molecular radius, and R denotes an intermolecular distance between the first material and the second material.

Here, the efficiency of energy transfer from the first material to the second material (energy transfer efficiency $\phi_{ET}$) is expressed by Formula (3). In the formula, $k_r$ denotes a rate constant of a light-emission process (fluorescence in the case where energy transfer from a singlet excited state is discussed, and phosphorescence in the case where energy transfer from a triplet excited state is discussed) of the first material, $k_n$ denotes a rate constant of a non-light-emission process (thermal deactivation or intersystem crossing) of the second material, and τ denotes a measured lifetime of an excited state of the first material.

[Formula 3]

$$\phi_{ET} = \frac{k_{h^* \to g}}{k_r + k_n + k_{h^* \to g}} = \frac{k_{h^* \to g}}{\left(\frac{1}{\tau}\right) + k_{h^* \to g}} \quad (3)$$

According to Formula (3), it is found that the energy transfer efficiency $\phi_{ET}$ can be increased by increasing the rate constant $k_{h^* \to g}$ of energy transfer so that another competing rate constant $k_r + k_n$ (=1/r) becomes relatively small.

<<Concept for Promoting Energy Transfer>>

First, energy transfer by the Förster mechanism is considered. When Formula (1) is substituted into Formula (3), $\tau$ can be eliminated. Thus, in the Förster mechanism, the energy transfer efficiency $\phi_{ET}$ does not depend on the lifetime $\tau$ of the excited state of the first material. Furthermore, it can be said that high energy transfer efficiency $\phi_{ET}$ is obtained when the emission quantum yield $\phi$ (the fluorescence quantum yield in the case where energy transfer from a singlet excited state is discussed, and the phosphorescence quantum yield in the case where energy transfer from a triplet excited state is discussed) is high.

Furthermore, it is preferable that the emission spectrum of the first material (the fluorescent spectrum in the case where energy transfer from a singlet excited state is discussed, and the phosphorescent spectrum in the case where energy transfer from a triplet excited state is discussed) largely overlap with the absorption spectrum of the second material (absorption corresponding to transition from a singlet ground state to a singlet excited state). Moreover, it is preferable that the molar absorption coefficient of the second material be also high. This means that the emission spectrum of the first material overlaps with the absorption band of the second material which is on the longest wavelength side. Since direct transition from the singlet ground state to the triplet excited state of the second material is forbidden, the molar absorption coefficient of the second material in the triplet excited state can be ignored. Thus, a process of energy transfer from an excited state of the first material to a triplet excited state of the second material by the Förster mechanism can be ignored, and only a process of energy transfer to a singlet excited state of the second material is considered.

Next, energy transfer by the Dexter mechanism is considered. According to Formula (2), in order to increase the rate constant $k_{h^* \to g}$, it is preferable that the emission spectrum of the first material (the fluorescent spectrum in the case where energy transfer from a singlet excited state is discussed, and the phosphorescent spectrum in the case where energy transfer from a triplet excited state is discussed) largely overlap with an absorption spectrum of the second material (absorption corresponding to transition from a singlet ground state to a singlet excited state). Therefore, the energy transfer efficiency can be optimized by making the emission spectrum of the first material overlap with the absorption band of the second material which is on the longest wavelength side.

When Formula (2) is substituted into Formula (3), it is found that the energy transfer efficiency $\phi_{ET}$ in the Dexter mechanism depends on $\tau$. In the Dexter mechanism, which is a process of energy transfer based on the electron exchange, as well as the energy transfer from the singlet excited state of the first material to the singlet excited state of the second material, energy transfer from the triplet excited state of the first material to the triplet excited state of the second material occurs.

In a manner similar to that of the energy transfer from the first material to the second material, the energy transfer by both the Förster mechanism and the Dexter mechanism also occurs in the energy transfer process from the exciplex to the fluorescent compound.

In the light-emitting element of one embodiment of the present invention in which the second material is a fluorescent compound, the efficiency of energy transfer to the triplet excited state of the second material is preferably low. That is, the energy transfer efficiency based on the Dexter mechanism from the first material to the second material is preferably low and the energy transfer efficiency based on the Förster mechanism from the first material to the second material is preferably high.

As described above, the energy transfer efficiency in the Förster mechanism does not depend on the lifetime $\tau$ of the excited state of the first material. In contrast, the energy transfer efficiency in the Dexter mechanism depends on the excitation lifetime $\tau$ of the first material. To reduce the energy transfer efficiency in the Dexter mechanism, the excitation lifetime $\tau$ of the first material is preferably short.

In view of the above, in one embodiment of the present invention, an exciplex or a TADF material is used for the first material, and one of the compounds that form the exciplex is capable of converting triplet excitation energy into light emission. With the structure of one embodiment of the present invention, reverse intersystem crossing from the triplet excited state to the singlet excited state of an exciplex (first material) can be promoted, and the excitation lifetime $\tau$ of the triplet excited state of the exciplex (first material) can be short. Furthermore, transition from the triplet excited state to the singlet ground state of the exciplex (first material) can be promoted, and the excitation lifetime $\tau$ of the triplet excited state of the exciplex (first material) can be short. As a result, the energy transfer efficiency from the triplet excited state of the exciplex (first material) to the triplet excited state of the fluorescent compound (second material) in the Dexter mechanism can be reduced, and thus, one embodiment of the present invention can provide a light-emitting element having high emission efficiency.

In addition, the fluorescence lifetime of a thermally activated delayed fluorescent component in light emitted from the exciplex is preferably short, and specifically, preferably 10 ns or longer and 50 µs or shorter, further preferably 10 ns or longer and 20 µs or shorter, and still further preferably 10 ns or longer and 10 µs or shorter.

The rate constant of the Förster mechanism is inversely proportional to the 6th power of the distance between the first material and the second material, and the rate constant of the Dexter mechanism is inversely proportional to the exponential function of the distance between the first material and the second material. Thus, when the distance between the two molecules is approximately 1 nm or less, the Dexter mechanism is dominant, and when the distance is approximately 1 nm or more, the Förster mechanism is dominant. To reduce the energy transfer efficiency in the Dexter mechanism, the distance between the first material and the second material is preferably large, and specifically, 0.7 nm or more, further preferably 0.9 nm or more, and still further preferably 1 nm or more. Furthermore, to efficiently cause the energy transfer by the Förster mechanism, the distance between the first material and the second material is preferably 5 nm or less.

Thus, in one embodiment of the present invention, the compound 133, which is a fluorescent compound, preferably includes at least two alkyl groups each having 2 or more carbon atoms. Alternatively, the compound 133 preferably includes at least two branched alkyl groups each having 3 to 10 carbon atoms. Alternatively, the compound 133 preferably includes at least two cyclic hydrocarbon groups each having 3 to 10 carbon atoms or at least two bridged cyclic hydrocarbon groups each having 3 to 10 carbon atoms. Furthermore, the compound 133 preferably includes condensed aromatic hydrocarbon having 3 to 12 carbon atoms.

<Material>

Next, components of a light-emitting element of one embodiment of the present invention are described in detail below.

<<Light-Emitting Layer>>

Materials that can be used for the light-emitting layer 130 are described below.

Examples of the compound 132 include a TADF material. The energy difference between the S1 level and the T1 level of the compound 132 is preferably small, and specifically, greater than 0 eV and less than or equal to 0.2 eV.

The compound 132 preferably includes a skeleton having a hole-transport property and a skeleton having an electron-transport property. Alternatively, the compound 132 preferably includes a π-electron deficient skeleton and one of a π-electron rich skeleton and an aromatic amine skeleton. Thus, a donor-acceptor excited state is easily formed in a molecule. Furthermore, to increase both the donor property and the acceptor property in the molecule of the compound 132, a structure where the skeleton having an electron-transport property and the skeleton having a hole-transport property are directly bonded to each other is preferably included. Alternatively, a structure where a π-electron deficient skeleton is directly bonded to one of a π-electron rich skeleton and an aromatic amine skeleton is preferably included. By increasing both the donor property and the acceptor property in the molecule, an overlap between a region where the HOMO is distributed and a region where the LUMO is distributed in the compound 132 can be small, and the energy difference between the singlet excitation energy level and the triplet excitation energy level of the compound 132 can be small. Moreover, the triplet excitation energy level of the compound 132 can be kept high.

In the case where the thermally activated delayed fluorescent material is composed of one kind of material, any of the following materials can be used, for example.

First, a fullerene, a derivative thereof, an acridine derivative such as proflavine, eosin, and the like can be given. Other examples include a metal-containing porphyrin, such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$(OEP)).

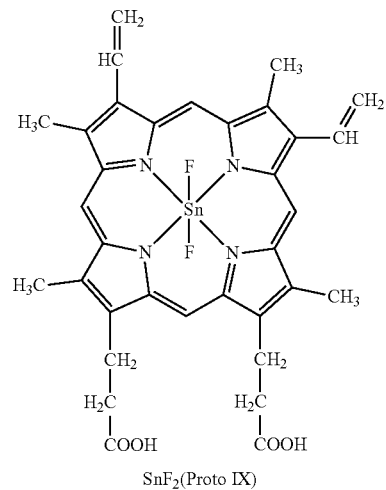

SnF$_2$(Proto IX)

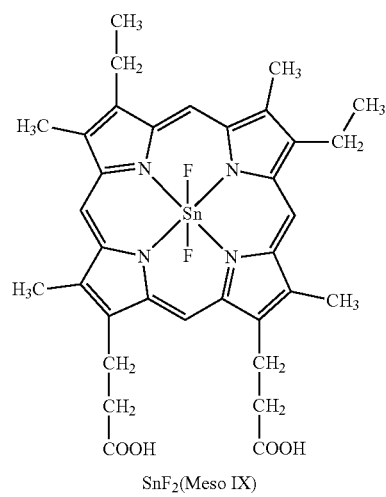

SnF$_2$(Meso IX)

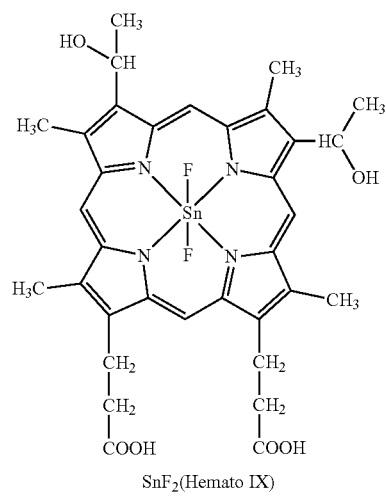

SnF$_2$(Hemato IX)

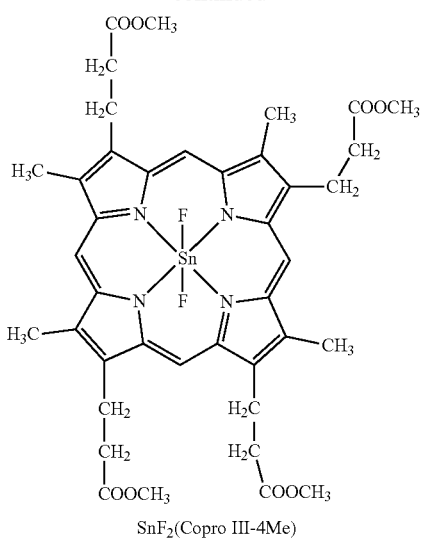

SnF₂(Copro III-4Me)

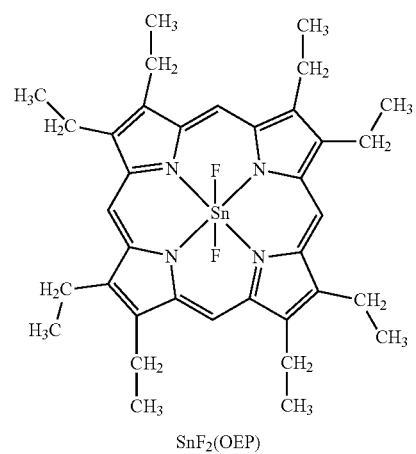

SnF₂(OEP)

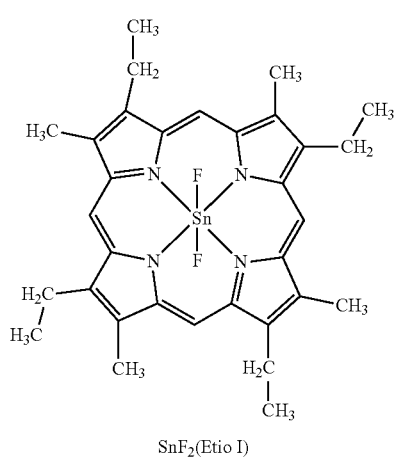

SnF₂(Etio I)

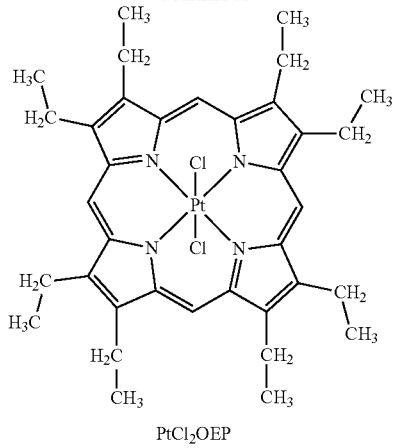

PtCl₂OEP

As the thermally activated delayed fluorescent material composed of one kind of material, a heterocyclic compound including a π-electron rich skeleton and a π-electron deficient skeleton can also be used. Specifically, 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: 0-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), 4-(9'-phenyl-3,3'-bi-9H-carbazol-9-yl)benzofuro[3,2-d]pyrimidine (abbreviation: 4PCCzBfpm), 4-[4-(9'-phenyl-3,3'-bi-9H-carbazol-9-yl)phenyl]benzofuro[3,2-d]pyrimidine (abbreviation: 4PCCzPBfpm), 9-[3-(4,6-diphenyl-1,3,5-triazin-2-yl)phenyl]-9'-phenyl-2,3'-bi-9H-carbazole (abbreviation: mPCCzPTzn-02), or the like can be used. The heterocyclic compound is preferable because of its high electron-transport and hole-transport properties due to the π-electron rich skeleton and the π-electron deficient skeleton contained therein. Among the π-electron deficient skeletons, a pyridine skeleton, a diazine skeleton (a pyrimidine skeleton, a pyrazine skeleton, or a pyridazine skeleton), and a triazine skeleton have high stability and reliability and are particularly preferable. In particular, a benzofuropyrimidine skeleton, a benzothienopyrimidine skeleton, a benzofuropyrazine skeleton, and a benzothienopyrazine skeleton are preferable because of their high acceptor properties and reliability. Among the π-electron rich skeletons, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. As a furan skeleton, a dibenzofuran skeleton is preferable. As a thiophene skeleton, a dibenzothiophene skeleton is preferable. As a pyrrole skeleton, an indole skeleton, a carbazole skeleton, a bicarbazole skeleton, and a 3-(9-phenyl-9H-carbazol-3-yl)-9H-carbazol e skeleton are particularly preferable. Note that a substance in which the π-electron rich skeleton is directly bonded to the π-electron deficient skeleton is particularly preferable because the donor property of the π-electron rich skeleton and the acceptor property of the π-electron deficient skeleton are both high and the difference between the level of the singlet excited state and the level of the triplet excited state becomes small. Note that an aromatic ring to which an electron-withdrawing group such as a cyano group is bonded may be used as the π-electron deficient skeleton.
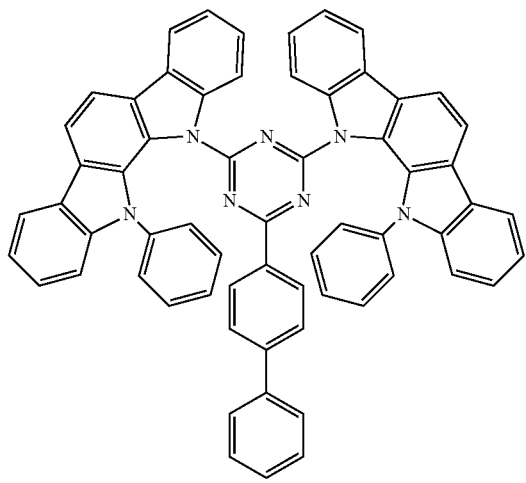
PIC-TRZ
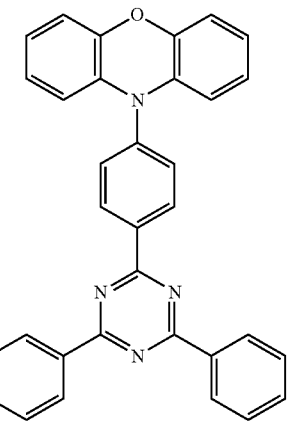
PXZ-TRZ
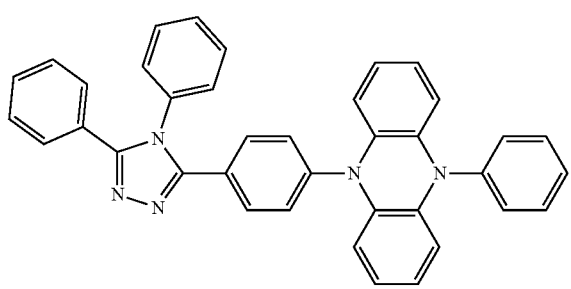
PPZ-3TPT
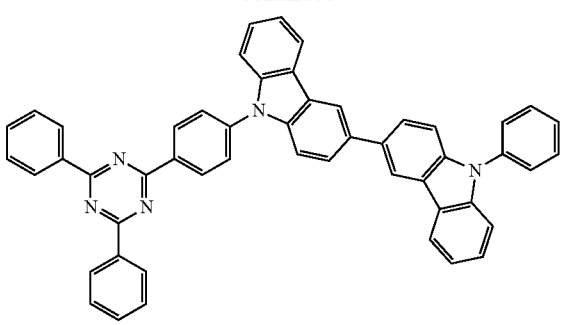
PCCzPTzn
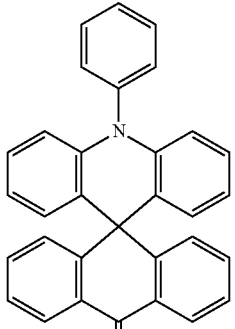
ACRSA
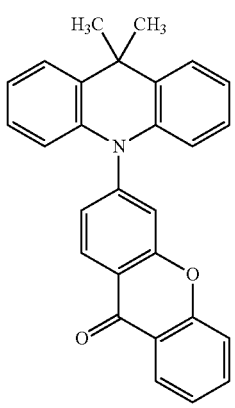
ACRXTN
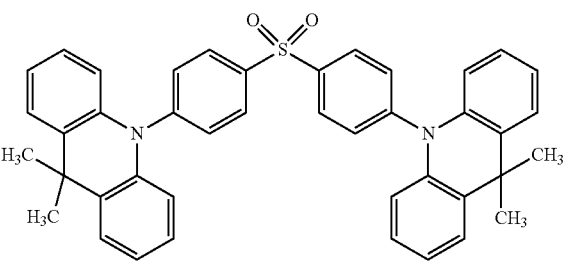
DMAC-DPS

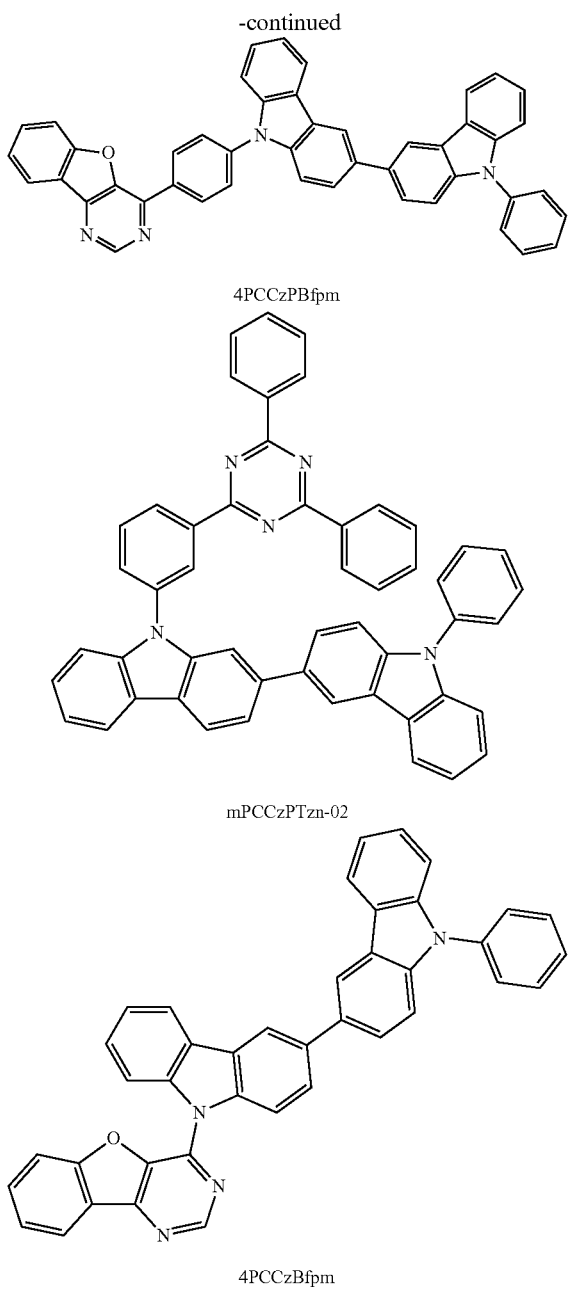

4PCCzPBfpm mPCCzPTzn-02

4PCCzBfpm

Next, as described above, the compound 131 preferably has a function of converting triplet excitation energy into light emission. Examples of an organic compound having this function include a phosphorescent material and a thermally activated delayed fluorescent material.

As the phosphorescent compound, an iridium-, rhodium-, or platinum-based organometallic complex or metal complex can be used. Furthermore, a platinum complex or organoiridium complex having a porphyrin ligand can be used; specifically, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, and the like can be used. In this case, the compound 131 (phosphorescent compound) has an absorption band of triplet metal to ligand charge transfer (MLCT) transition.

Examples of the substance that has an emission peak in the blue or green wavelength range include organometallic iridium complexes having a 4H-triazole skeleton, such as tris{2-[5-(2-methylphenyl)-4-(2,6-dimethylphenyl)-4H-1,2,4-triazol-3-yl-κN²]phenyl-κC}iridium(III) (abbreviation: Ir(mpptz-dmp)₃), tris(5-methyl-3,4-diphenyl-4H-1,2,4-triazolato)iridium(III) (abbreviation: Ir(Mptz)₃), tris[4-(3-biphenyl)-5-isopropyl-3-phenyl-4H-1,2,4-triazolato]iridium (III) (abbreviation: Ir(iPrptz-3b)₃), and tris[3-(5-biphenyl)-5-isopropyl-4-phenyl-4H-1,2,4-triazolato]iridium(III) (abbreviation: Ir(iPr5btz)₃); organometallic iridium complexes having a 1H-triazole skeleton, such as tris[3-methyl-1-(2-methylphenyl)-5-phenyl-1H-1,2,4-triazolato]iridium (III) (abbreviation: Ir(Mptz1-mp)₃) and tris(1-methyl-5-phenyl-3-propyl-1H-1,2,4-triazolato)iridium(III) (abbreviation: Ir(Prptz1-Me)₃); organometallic iridium complexes having an imidazole skeleton, such as fac-tris[1-(2,6-diisopropylphenyl)-2-phenyl-1H-imidazole]iridium(III) (abbreviation: Ir(iPrpmi)₃) and tris[3-(2,6-dimethylphenyl)-7-methylimidazo[1,2-f]phenanthridinato]iridium(III) (abbreviation: Ir(dmpimpt-Me)₃); and organometallic iridium complexes in which a phenylpyridine derivative having an electron-withdrawing group is a ligand, such as bis[2-(4',6'-difluorophenyl)pyridinato-N,C²']iridium(III) tetrakis(1-pyrazolyl)borate (abbreviation: FIr6), bis[2-(4',6'-difluorophenyl)pyridinato-N,C²']iridium(III) picolinate (abbreviation: FIrpic), bis{2-[3',5'-bis(trifluoromethyl)phenyl]pyridinato-N,C²'}iridium(III) picolinate (abbreviation: Ir(CF₃ppy)₂(pic)), and bis[2-(4',6'-difluorophenyl)pyridinato-N,C²']iridium(III) acetylacetonate (abbreviation: FIr(acac)). Among the materials given above, the organometallic iridium complexes having a nitrogen-containing five-membered heteroaromatic ring skeleton, such as a 4H-triazole skeleton, a 1H-triazole skeleton, or an imidazole skeleton have high triplet excitation energy, reliability, and emission efficiency and are thus particularly preferable.

Examples of the substance that has an emission peak in the green or yellow wavelength range include organometallic iridium complexes having a pyrimidine skeleton, such as tris(4-methyl-6-phenylpyrimidinato)iridium(III) (abbreviation: Ir(mppm)₃), tris(4-t-butyl-6-phenylpyrimidinato)iridium(III) (abbreviation: Ir(tBuppm)₃), (acetylacetonato)bis(6-methyl-4-phenylpyrimidinato)iridium(III) (abbreviation: Ir(mppm)₂(acac)), (acetylacetonato)bis(6-tert-butyl-4-phenylpyrimidinato)iridium(III) (abbreviation: Ir(tBuppm)₂(acac)), (acetyl acetonato)bis[4-(2-norbornyl)-6-phenylpyrimidinato]iridium(III) (abbreviation: Ir(nbppm)₂(acac)), (acetyl acetonato)bis[5-methyl-6-(2-methylphenyl)-4-phenylpyrimidinato]iridium(III) (abbreviation: Ir(mpmppm)₂(acac)), (acetylacetonato)bis {4,6-dimethyl-2-[6-(2,6-dimethylphenyl)-4-pyrimidinyl-κN³]phenyl-κC}iridium(III) (abbreviation: Ir(dmppm-dmp)₂(acac)), and (acetyl acetonato)bis(4,6-diphenylpyrimidinato)iridium (III) (abbreviation: Ir(dppm)₂(acac)); organometallic iridium complexes having a pyrazine skeleton, such as (acetylacetonato)bis(3,5-dimethyl-2-phenylpyrazinato) iridium(III) (abbreviation: Ir(mppr-Me)₂(acac)) and (acetylacetonato)bis(5-isopropyl-3-methyl-2-phenylpyrazinato) iridium(III) (abbreviation: Ir(mppr-iPr)₂(acac)); organometallic iridium complexes having a pyridine skeleton, such as tris(2-phenylpyridinato-N,C²')iridium(III) (abbreviation: Ir(ppy)₃), bis(2-phenylpyridinato-N,C²')iridium (III) acetylacetonate (abbreviation: Ir(ppy)₂(acac)), bis (benzo[h]quinolinato)iridium(III) acetyl acetonate (abbreviation: Ir(bzq)₂(acac)), tris(benzo[h]quinolinato) iridium(III) (abbreviation: Ir(bzq)₃), tris(2-phenyl quinolinato-N,C²')iridium(III) (abbreviation: Ir(pq)₃), and bis(2- phenylquinolinato-N,C$^{2'}$)iridium(III) acetyl acetonate (abbreviation: Ir(pq)$_2$(acac)); organometallic iridium complexes such as bis(2,4-diphenyl-1,3-oxazolato-N,C$^{2'}$)iridium (III) acetyl acetonate (abbreviation: Ir(dpo)$_2$(acac)), bis{2-[4'-(perfluorophenyl)phenyl]pyridinato-N,C$^{2'}$}iridium(III) acetylacetonate (abbreviation: Ir(p-PF-ph)$_2$(acac)), and bis (2-phenylbenzothiazolato-N,C$^{2'}$)iridium(III) acetylacetonate (abbreviation: Ir(bt)$_2$(acac)); and a rare earth metal complex such as tris(acetylacetonato)(monophenanthroline) terbium(III) (abbreviation: Tb(acac)$_3$(Phen)).

Among the materials given above, the organometallic iridium complexes having a pyrimidine skeleton have distinctively high reliability and emission efficiency and are thus particularly preferable.

Examples of the substance that has an emission peak in the yellow or red wavelength range include organometallic iridium complexes having a pyrimidine skeleton, such as (diisobutyrylmethanato)bis[4,6-bis(3-methylphenyl)pyrimidinato]iridium(III) (abbreviation: Ir(5mdppm)$_2$(dibm)), bis [4,6-bis(3-methylphenyl)pyrimidinato](dipivaloylmethanato)iridium(III) (abbreviation: Ir(5mdppm)$_2$(dpm)), and bis[4,6-di(naphthalen-1-yl)pyrimidinato](dipivaloylmethanato)iridium(III) (abbreviation: Ir(d1npm)$_2$(dpm)); organometallic iridium complexes having a pyrazine skeleton, such as (acetylacetonato)bis(2,3,5-triphenylpyrazinato)iridium (III) (abbreviation: Ir(tppr)$_2$(acac)), bis(2,3,5-triphenylpyrazinato)(dipivaloylmethanato)iridium(III) (abbreviation: Ir(tppr)$_2$(dpm)), and (acetyl acetonato)bis[2,3-bis(4-fluorophenyl)quinoxalinato]iridium(III) (abbreviation: Ir(Fdpq)$_2$(acac)); organometallic iridium complexes having a pyridine skeleton, such as tris(1-phenylisoquinolinato-N, C$^{2'}$)iridium(III) (abbreviation: Ir(piq)$_3$) and bis(1-phenylisoquinolinato-N,C$^{2'}$)iridium(III) acetylacetonate (abbreviation: Ir(piq)$_2$(acac)); a platinum complex such as 2,3,7,8,12, 13,17,18-octaethyl-21H,23H-porphyrin platinum(II) (abbreviation: PtOEP); and rare earth metal complexes such as tris(1,3-diphenyl-1,3-propanedionato)(monophenanthroline)europium(III) (abbreviation: Eu(DBM)$_3$(Phen)) and tris [1-(2-thenoyl)-3,3,3-trifluoroacetonato](monophenanthroline)europium(III) (abbreviation: Eu(TTA)$_3$(Phen)). Among the materials given above, the organometallic iridium complexes having a pyrimidine skeleton have distinctively high reliability and emission efficiency and are thus particularly preferable. Furthermore, the organometallic iridium complexes having a pyrazine skeleton can provide red light emission with favorable chromaticity.

Examples of a material that can be used as the compound 131 include the thermally activated delayed fluorescent material.

Furthermore, a fluorescent compound is preferably used as the compound 133 in the light-emitting layer 130. The fluorescent compound is preferably, but not particularly limited to, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like.

Specific examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis [3-(9-phenyl-9H-fluoren-9-yl)phenyl]pyrene-1,6-diamine (abbreviation: 1,6mMemFLPAPrn), N,N-bis[4-(9-phenyl-9H-fluoren-9-yl)phenyl]-N,N'-bis(4-tert-butylphenyl) pyrene-1,6-diamine (abbreviation: 1,6tBu-FLPAPrn), N,N-diphenyl-N,N'-bis[4-(9-phenyl-9H-fluoren-9-yl)phenyl]-3, 8-dicyclohexylpyrene-1,6-diamine (abbreviation: ch-1, 6FLPAPrn), N,N-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N"-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N,N,N',N',N",N"-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 6, coumarin 545T, N,N'-diphenylquinacridone (abbreviation: DPQd), rubrene, 2,8-di-tert-butyl-5,11-bis(4-tert-butylphenyl)-6,12-diphenyltetracene (abbreviation: TBRb), Nile red, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl) tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H, 5H-benzo[4]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H, 5H-benzo[ij]quinolizin-9-yl)ethenyl]-4H-pyran-4-ylidene}propanedinitrile (abbreviation: DCJTB), 2-(2,6-bis {2-[4-(dimethylamino)phenyl]ethenyl}-4H-pyran-4-ylidene)propanedinitrile (abbreviation: BisDCM), 2-{2,6-bis[2-(8-m ethoxy-1,1,7,7-tetramethyl-2,3,6,7-tetrahydro-1H,5H-benzo[4]quinolizin-9-yl)ethenyl]-4H-pyran-4-ylidene}propanedinitrile (abbreviation: BisDCJTM), and 5,10,15,20-tetraphenylbisbenzo[5,6]indeno[1,2,3-cd:1',2', 3'-lm]perylene.

In the case where an exciplex is formed by the compound 131 and the compound 132, it is preferable that the compound 131, the compound 132, and the compound 133 be selected such that the emission peak of the formed exciplex overlaps with an absorption band on the longest wavelength side (low energy side) of the compound 133 serving as a light-emitting material. This makes it possible to provide a light-emitting element with drastically improved emission efficiency.

The light-emitting layer 130 can include two or more layers. For example, in the case where the light-emitting layer 130 is formed by stacking a first light-emitting layer and a second light-emitting layer in this order from the hole-transport layer side, the first light-emitting layer is formed using a substance having a hole-transport property as the host material and the second light-emitting layer is formed using a substance having an electron-transport property as the host material.

As illustrated in FIGS. 4A and 4B, the light-emitting layer 130 may contain a material (compound 134) in addition to the compounds 131, 132, and 133. In that case, an exciplex is preferably formed by the compound 132 and the compound 134. To make this condition, one of the compounds 132 and 134 preferably has the highest HOMO level among the materials of the light-emitting layer 130, and the other of the compounds 132 and 134 preferably has the lowest LUMO level among the materials of the light-emitting layer 130. That is, the HOMO level of one of the compounds 132 and 134 is preferably higher than the HOMO level of the other of the compounds 132 and 134 and the HOMO level of the compound 131, and the LUMO level of the other of the compounds 132 and 134 is preferably lower than the LUMO level of the one of the compounds 132 and 134 and the LUMO level of the compound 131. With such conditions, a reaction for forming an exciplex by the compound 132 and the compound 131 can be inhibited.

As the compound 134, any of the following hole-transport materials and electron-transport materials can be used, for example.

A material having a property of transporting more holes than electrons can be used as the hole-transport material, and a material having a hole mobility of $1\times10^{-6}$ cm$^2$/Vs or higher is preferable. Specifically, an aromatic amine, a carbazole derivative, or the like can be used. Furthermore, the hole-transport material may be a high molecular compound.

Examples of the material having a high hole-transport property include aromatic amine compounds such as N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B).

Specific examples of the carbazole derivative include 3-[N-(4-diphenylaminophenyl)-N-phenylamino]-9-phenyl-carbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Other examples of the carbazole derivative include 4,4'-di(N-carbazolyl)biphenyl (abbreviation: CBP), 1,3,5-tris[4-(N-carbazolyl)phenyl]benzene (abbreviation: TCPB), and 1,4-bis[4-(N-carb azolyl)phenyl]-2,3,5,6-tetraphenylbenzene.

Examples of the material having a high hole-transport property include aromatic amine compounds such as 4,4'-bis[N-(1-naphthyl)-N-phenylamino]biphenyl (abbreviation: NPB or α-NPD), N,N-bis(3-methylphenyl)-N,N'-diphenyl-[1,1'-biphenyl]-4,4'-diamine (abbreviation: TPD), 4,4',4"-tris(carbazol-9-yl)triphenylamine (abbreviation: TCTA), 4,4',4"-tris[N-(1-naphthyl)-N-phenylamino]triphenylamine (abbreviation: TNATA), 4,4',4"-tris(N,N-diphenylamino)triphenylamine (abbreviation: TDATA), 4,4',4"-tris[N-(3-methylphenyl)-N-phenylamino]triphenylamine (abbreviation: m-MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N-phenyl-N-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N-bis(9-phenylcarbazol-3-yl)-N,N'-diphenylbenzene-1,3-diamine (abbreviation: PCA2B), N,N,N"-triphenyl-N,N',N"-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]-spiro-9,9'-bifluorene (abbreviation: DPA2SF), N-[4-(9H-carbazol-9-yl)phenyl]-N-(4-phenyl)phenylaniline (abbreviation: YGA1BP), and N,N'-bis[4-(carbazol-9-yl)phenyl]-N,N'-diphenyl-9,9-dimethylfluorene-2,7-diamine (abbreviation: YGA2F). Other examples include amine compounds, carbazole compounds, thiophene compounds, furan compounds, fluorene compounds, triphenylene compounds, phenanthrene compounds, and the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 4-{3-[3-(9-phenyl-9H-fluoren-9-yl)phenyl]phenyl}dibenzofuran (abbreviation: mmDBFFLBi-II), 4,4',4"-(benzene-1,3,5-triyl)tri(dibenzofuran) (abbreviation: DBF3P-II), 1,3,5-tri(dibenzothiophen-4-yl)-benzene (abbreviation: DBT3P-II), 2,8-diphenyl-4-[4-(9-phenyl-9H-fluoren-9-yl)phenyl]dibenzothiophene (abbreviation: DB TFLP-III), 4-[4-(9-phenyl-9H-fluoren-9-yl)phenyl]-6-phenyldibenzothiophene (abbreviation: DB TFLP-IV), and 4-[3-(triphenylen-2-yl)phenyl]dibenzothiophene (abbreviation: mDBTPTp-II). The substances described here are mainly substances having a hole mobility of $1\times10^{-6}$ cm$^2$/Vs or higher. Note that other than these substances, any substance that has a property of transporting more holes than electrons may be used.

A material having a property of transporting more electrons than holes can be used as the electron-transport material, and a material having an electron mobility of $1\times10^{-6}$ cm$^2$/Vs or higher is preferable. As the compound which easily accepts electrons (the material having an electron-transport property), a π-electron deficient heteroaromatic compound such as a nitrogen-containing heteroaromatic compound, a metal complex, or the like can be used. Specific examples include a metal complex having a quinoline ligand, a benzoquinoline ligand, an oxazole ligand, or a thiazole ligand. Other examples include an oxadiazole derivative, a triazole derivative, a phenanthroline derivative, a pyridine derivative, a bipyridine derivative, a pyrimidine derivative, a benzofuropyrimidine derivative, and a benzothienopyrimidine derivative. Note that other than these substances, any substance that has a property of transporting more electrons than holes may be used for the electron-transport layer.

Specific examples of the electron-transport material include a metal complex having a quinoline skeleton or a benzoquinoline skeleton, such as tris(8-quinolinolato)aluminum(III) (abbreviation: Alq), tris(4-methyl-8-quinolinolato) aluminum(III) (abbreviation: Almq3), bis(10-hydroxybenzo[h]quinolinato)beryllium(II) (abbreviation: BeBq2), bis(2-methyl-8-quinolinolato)(4-phenylphenolato)aluminum(III) (abbreviation: BAlq), or bis(8-quinolinolato)zinc(II) (abbreviation: Znq). Alternatively, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ) can be used. Other than such metal complexes, any of the following can be used: heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), 2-[3'-(dibenzothiophen-4-yl)phenyl]-1-phenyl-1H-benzimidazole (abbreviation: mDBTBIm-II), bathophenanthroline (abbreviation: BPhen), bathocuproine (abbreviation: BCP), and 2,9-bis(naphthalen-2-yl)-4,7-diphenyl-1,10-phenanthroline (abbreviation: NBPhen); heterocyclic compounds having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl] dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,6-bis[3-(9H-carbazol-9-yl)phenyl]pyrimidine (abbreviation: 4,6mCzP2Pm); heterocyclic compounds having a triazine skeleton, such as PCCzPTzn; heterocyclic compounds having a pyridine skeleton, such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB); and heteroaromatic compounds such as 4,4'-bis(5-methylbenzoxazol-2-yl)stilbene (abbreviation: BzOs). Further alternatively, a high molecular compound such as poly(2,5-pyridinediyl) (abbreviation: PPy), poly[(9,9-dihexylfluorene-2,7-diyl)-co-(pyridine-3,5-diyl)](abbreviation: PF-Py), or poly[(9,9-dioctylfluorene-2,7-diyl)-co-(2,2'-bipyridine-6,6'-diyl)] (abbreviation: PF-BPy) can be used. The substances described here are mainly substances having an electron mobility of $1\times10^{-6}$ cm$^2$/Vs or higher. Note that other than these substances, any substance that has a property of transporting more electrons than holes may be used.

In the case where an exciplex is formed by the compound 134 and the compound 132, it is preferable that the compound 131, the compound 132, and the compound 134 be selected such that the emission peak of the formed exciplex overlaps with an absorption band on the longest wavelength side (low energy side) of the compound 131. This achieves a light-emitting element with drastically improved emission efficiency.

<<Pair of Electrodes>>

The electrode 101 and the electrode 102 have functions of injecting holes and electrons into the light-emitting layer 130. The electrode 101 and the electrode 102 can be formed using a metal, an alloy, or a conductive compound, a mixture or a stack thereof, or the like. A typical example of the metal is aluminum (Al); besides, a transition metal such as silver (Ag), tungsten, chromium, molybdenum, copper, or titanium, an alkali metal such as lithium (Li) or cesium, or a Group 2 metal such as calcium or magnesium (Mg) can be used. As a transition metal, a rare earth metal such as ytterbium (Yb) may be used. An alloy containing any of the above metals can be used as the alloy, and MgAg and AlLi can be given as examples. Examples of the conductive compound include metal oxides such as indium tin oxide (hereinafter, referred to as ITO), indium tin oxide containing silicon or silicon oxide (ITSO), indium zinc oxide, indium oxide containing tungsten and zinc, and the like. It is also possible to use an inorganic carbon-based material such as graphene as the conductive compound. As described above, the electrode 101 and/or the electrode 102 may be formed by stacking two or more of these materials.

Light emitted from the light-emitting layer 130 is extracted through the electrode 101 and/or the electrode 102. Therefore, at least one of the electrodes 101 and 102 transmits visible light. As the conductive material transmitting light, a conductive material having a visible light transmittance higher than or equal to 40% and lower than or equal to 100%, preferably higher than or equal to 60% and lower than or equal to 100%, and a resistivity lower than or equal to $1\times10^{-2}$ Ω·cm can be used. The electrode on the light extraction side may be formed using a conductive material having functions of transmitting light and reflecting light. As the conductive material, a conductive material having a visible light reflectivity higher than or equal to 20% and lower than or equal to 80%, preferably higher than or equal to 40% and lower than or equal to 70%, and a resistivity lower than or equal to $1\times10^{-2}$ Ω·cm can be used. In the case where the electrode through which light is extracted is formed using a material with low light transmittance, such as metal or alloy, the electrode 101 and/or the electrode 102 is formed to a thickness that is thin enough to transmit visible light (e.g., a thickness of 1 nm to 10 nm).

In this specification and the like, as the electrode transmitting light, a material that transmits visible light and has conductivity is used. Examples of the material include, in addition to the above-described oxide conductor layer typified by an ITO, an oxide semiconductor layer and an organic conductive layer containing an organic substance. Examples of the organic conductive layer containing an organic substance include a layer containing a composite material in which an organic compound and an electron donor (donor) are mixed and a layer containing a composite material in which an organic compound and an electron acceptor (acceptor) are mixed. The resistivity of the transparent conductive layer is preferably lower than or equal to $1×10^5$ Ω·cm, further preferably lower than or equal to $1×10^4$ Ω·cm.

As a method for forming the electrode 101 and the electrode 102, a sputtering method, an evaporation method, a printing method, a coating method, a molecular beam epitaxy (MBE) method, a CVD method, a pulsed laser deposition method, an atomic layer deposition (ALD) method, or the like can be used as appropriate.

<<Hole-Injection Layer>>

The hole-injection layer 111 has a function of reducing a barrier for hole injection from one of the pair of electrodes (the electrode 101 or the electrode 102) to promote hole injection and is formed using a transition metal oxide, a phthalocyanine derivative, or an aromatic amine, for example. As the transition metal oxide, molybdenum oxide, vanadium oxide, ruthenium oxide, tungsten oxide, manganese oxide, or the like can be given. As the phthalocyanine derivative, phthalocyanine, metal phthalocyanine, or the like can be given. As the aromatic amine, a benzidine derivative, a phenylenediamine derivative, or the like can be given. It is also possible to use a high molecular compound such as polythiophene or polyaniline; a typical example thereof is poly(ethylenedioxythiophene)/poly(styrenesulfonic acid), which is self-doped polythiophene.

As the hole-injection layer 111, a layer containing a composite material of a hole-transport material and a material having a property of accepting electrons from the hole-transport material can also be used. Alternatively, a stack of a layer containing a material having an electron accepting property and a layer containing a hole-transport material may also be used. In a steady state or in the presence of an electric field, electric charge can be transferred between these materials. As examples of the material having an electron-accepting property, organic acceptors such as a quinodimethane derivative, a chloranil derivative, and a hexaazatriphenylene derivative can be given. A specific example is a compound having an electron-withdrawing group (a halogen group (e.g., a fluoro group) or a cyano group), such as 7,7,8,8-tetracyano-2,3,5,6-tetrafluoroquinodimethane (abbreviation: F$_4$-TCNQ), chloranil, 2,3,6,7,10,11-hexacyano-1,4,5,8,9,12-hexaazatriphenylene (abbreviation: HAT-CN), or 1,3,4,5,7,8-hexafluorotetracyanonaphthoquinodimethane (abbreviation: F$_6$-TCNNQ). A compound in which electron-withdrawing groups are bonded to a condensed aromatic ring having a plurality of heteroatoms, such as HAT-CN, is particularly preferable because it is thermally stable. A [3]radialene derivative including an electron-withdrawing group (in particular, a cyano group or a halogen group such as a fluoro group) has a very high electron-accepting property and thus is preferred. Specific examples include α,α',α"-1,2,3-cyclopropanetriylidenetris[4-cyano-2,3,5,6-tetrafluorobenzeneacetonitrile], α,β',α"-1,2,3-cyclopropanetriylidenetris[2,6-dichloro-3,5-difluoro-4-(trifluoromethyl) benzeneacetonitrile], and α,α',α"-1,2,3-cyclopropanetriylidenetris[2,3,4,5,6-pentafluorobenzeneacetonitrile]. Alternatively, a transition metal oxide such as an oxide of a metal from Group 4 to Group 8 can be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1×10^{-6}$ cm$^2$/Vs or higher is preferable. Specifically, any of the aromatic amines, carbazole derivatives, aromatic hydrocarbons, stilbene derivatives, and the like which are given above as examples of the hole-transport material that can be used in the light-emitting layer 130 can be used. Furthermore, the hole-transport material may be a high molecular compound.

Examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Other examples include pentacene and coronene. The aromatic hydrocarbon having a hole mobility of $1×10^{-6}$ cm$^2$/Vs or higher and having 14 to 42 carbon atoms is particularly preferable.

The aromatic hydrocarbon may have a vinyl skeleton. Examples of the aromatic hydrocarbon having a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA).

Other examples include high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: poly-TPD).

<<Hole-Transport Layer>>

The hole-transport layer 112 is a layer containing a hole-transport material and can be formed using any of the materials given as examples of the material of the hole-injection layer 111. In order that the hole-transport layer 112 has a function of transporting holes injected into the hole-injection layer 111 to the light-emitting layer 130, the HOMO level of the hole-transport layer 112 is preferably equal or close to the HOMO level of the hole-injection layer 111.

As the hole-transport material, any of the materials given as examples of the materials of the hole-injection layer 111 and the compound 134 can be used. As the hole-transport material, a substance having a hole mobility of $1×10^{-6}$ cm$^2$/Vs or higher is preferably used. Note that other than these substances, any substance that has a property of transporting more holes than electrons may be used. The layer containing a substance having a high hole-transport property is not limited to a single layer, and two or more layers containing the aforementioned substances may be stacked.

<<Electron-Transport Layer>>

The electron-transport layer 118 has a function of transporting, to the light-emitting layer 130, electrons injected from the other of the pair of electrodes (the electrode 101 or the electrode 102) through the electron-injection layer 119. A material having a property of transporting more electrons than holes can be used as the electron-transport material, and a material having an electron mobility of $1\times10^{-6}$ cm$^2$/Vs or higher is preferable. Note that other than these substances, any substance that has a property of transporting more electrons than holes may be used.

As the electron-transport material, any of the materials given as examples of the material of the compound 134 can be used. As the electron-transport material, a substance having an electron mobility of $1\times10'$ cm$^2$/Vs or higher is preferably used. Note that the electron-transport layer 118 is not limited to a single layer, and may be a stacked layer of two or more layers containing the aforementioned substances.

Between the electron-transport layer 118 and the light-emitting layer 130, a layer that controls transfer of electron carriers may be provided. The layer that controls transfer of electron carriers is formed by addition of a small amount of a substance having a high electron-trapping property to the aforementioned material having a high electron-transport property, and is capable of adjusting carrier balance by suppressing transfer of electron carriers. Such a structure is very effective in preventing a problem (such as a reduction in element lifetime) caused when electrons pass through the light-emitting layer.

<<Electron-Injection Layer>>

The electron-injection layer 119 has a function of reducing a barrier for electron injection from the electrode 102 to promote electron injection and can be formed using a Group 1 metal or a Group 2 metal, or an oxide, a halide, or a carbonate of any of the metals, for example. Alternatively, a composite material containing the aforementioned electron-transport material and a material having a property of donating electrons to the electron-transport material can be used. As the material having an electron-donating property, a Group 1 metal, a Group 2 metal, an oxide of any of the metals, or the like can be given. Specifically, an alkali metal, an alkaline earth metal, or a compound thereof, such as lithium fluoride (LiF), sodium fluoride (NaF), cesium fluoride (CsF), calcium fluoride (CaF$_2$), or lithium oxide (LiOx), can be used. Alternatively, a rare earth metal compound like erbium fluoride (ErF$_3$) can be used. Electride may be used for the electron-injection layer 119. Examples of the electride include a substance in which electrons are added at high concentration to calcium oxide-aluminum oxide. The electron-injection layer 119 may be formed using the substance that can be used for the electron-transport layer 118.

A composite material in which an organic compound and an electron donor (donor) are mixed may be used for the electron-injection layer 119. Such a composite material is excellent in an electron-injection property and an electron-transport property because electrons are generated in the organic compound by the electron donor. In this case, the organic compound is preferably a material that is excellent in transporting the generated electrons. Specifically, the above-listed substances for forming the electron-transport layer 118 (e.g., the metal complexes and heteroaromatic compounds) can be used, for example. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, ytterbium, and the like are given. In addition, an alkali metal oxide or an alkaline earth metal oxide is preferable, and lithium oxide, calcium oxide, barium oxide, and the like are given. Alternatively, a Lewis base such as magnesium oxide can be used. Further alternatively, an organic compound such as tetrathiafulvalene (abbreviation: TTF) can be used.

Note that the light-emitting layer, the hole-injection layer, the hole-transport layer, the electron-transport layer, and the electron-injection layer described above can each be formed by an evaporation method (including a vacuum evaporation method), an inkjet method, a coating method, a nozzle printing method, a gravure printing method, or the like. Other than the above-mentioned materials, an inorganic compound such as a quantum dot or a high molecular compound (e.g., an oligomer, a dendrimer, and a polymer) may be used in the light-emitting layer, the hole-injection layer, the hole-transport layer, the electron-transport layer, and the electron-injection layer.

The quantum dot may be a colloidal quantum dot, an alloyed quantum dot, a core-shell quantum dot, or a core quantum dot, for example. The quantum dot containing elements belonging to Groups 2 and 16, elements belonging to Groups 13 and 15, elements belonging to Groups 13 and 17, elements belonging to Groups 11 and 17, or elements belonging to Groups 14 and 15 may be used. Alternatively, the quantum dot containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

An example of the liquid medium used for the wet process is an organic solvent of ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; dimethylformamide (DMF); dimethyl sulfoxide (DMSO); or the like.

Examples of the high molecular compound that can be used for the light-emitting layer include a polyphenylenevinylene (PPV) derivative such as poly[2-methoxy-5-(2-ethylhexyloxy)-1,4-phenylenevinylene] (abbreviation: MEH-PPV) or poly(2,5-dioctyl-1,4-phenylenevinylene); a polyfluorene derivative such as poly(9,9-di-n-octylfluorenyl-2,7-diyl) (abbreviation: PF8), poly[(9,9-di-n-octylfluorenyl-2,7-diyl)-alt-(benzo[2,1,3]thiadiazole-4,8-diyl)] (abbreviation: F8BT), poly[(9,9-di-n-octylfluorenyl-2,7-diyl)-alt-(2,2'-bithiophene-5,5'-diyl)] (abbreviation: F8T2), poly [(9,9-dioctyl-2,7-divinylenefluorenylene)-alt-(9,10-anthracene)], or poly[(9,9-dihexylfluorene-2,7-diyl)-alt-(2, 5-dimethyl-1,4-phenylene)]; a polyalkylthiophene (PAT) derivative such as poly(3-hexylthiophene-2,5-diyl) (abbreviation: P3HT); and a polyphenylene derivative. These high molecular compounds, PVK, poly(2-vinylnaphthalene), poly[bis(4-phenyl)(2,4,6-trimethylphenyl)amine] (abbreviation: PTAA), or the like may be doped with a light-emitting compound and used for the light-emitting layer. As the light-emitting compound, any of the above-described light-emitting compounds can be used.

In one embodiment of the present invention, the light-emitting layer 130 is formed using a combination of three organic compounds of an organic compound having a benzofuropyrimidine skeleton or a benzothienopyrimidine skeleton, an organic compound that can convert triplet excitation energy into light emission, and an organic compound that emits fluorescence; alternatively, a high molecular compound that has the above skeleton or function can be used. For example, the light-emitting layer 130 may be formed using a high molecular compound that has a benzofuropyrimidine skeleton or a benzothienopyrimidine skeleton, a substituent that can convert triplet excitation energy into light emission, and a substituent that emits fluorescence. Alternatively, the light-emitting layer 130 may be formed using a combination of a high molecular compound having a benzofuropyrimidine skeleton or a benzothienopyrimidine skeleton and a substituent that can convert triplet excitation energy into light emission and a low molecular substance that emits fluorescence. The use of such a high molecular compound leads to an increase in material use efficiency and a reduction in manufacturing costs.

<<Substrate>>

A light-emitting element of one embodiment of the present invention may be formed over a substrate of glass, plastic, or the like. As the way of stacking layers over the substrate, layers may be sequentially stacked from the electrode 101 side or sequentially stacked from the electrode 102 side.

For the substrate over which the light-emitting element of one embodiment of the present invention can be formed, glass, quartz, plastic, or the like can be used, for example. Alternatively, a flexible substrate can be used. The flexible substrate is a substrate that can be bent, such as a plastic substrate made of polycarbonate or polyarylate, for example. A film, an inorganic vapor deposition film, or the like can also be used. Another material may be used as long as the substrate functions as a support in a manufacturing process of the light-emitting elements or has a function of protecting the light-emitting elements.

In this specification and the like, a light-emitting element can be formed using any of a variety of substrates, for example. The type of a substrate is not limited particularly. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, cellulose nanofiber (CNF) and paper which include a fibrous material, and a base material film. Examples of the glass substrate include a barium borosilicate glass substrate, an aluminoborosilicate glass substrate, and a soda lime glass substrate. Examples of the flexible substrate, the attachment film, the base material film, and the like include substrates of plastics typified by polyethylene terephthalate (PET), polyethylene naphthalate (PEN), polyether sulfone (PES), and polytetrafluoroethylene (PTFE). Another example is a resin such as acrylic. Furthermore, polypropylene, polyester, polyvinyl fluoride, and polyvinyl chloride can be given as examples. Other examples include polyamide, polyimide, aramid, epoxy, an inorganic vapor deposition film, and paper.

Alternatively, a flexible substrate may be used as the substrate such that the light-emitting element is provided directly on the flexible substrate. Further alternatively, a separation layer may be provided between the substrate and the light-emitting element. The separation layer can be used when part or the whole of a light-emitting element formed over the separation layer is separated from the substrate and transferred onto another substrate. In such a case, the light-emitting element can be transferred to a substrate having low heat resistance or a flexible substrate as well. For the above separation layer, a stack including inorganic films, which are a tungsten film and a silicon oxide film, or a structure in which a resin film of polyimide or the like is formed over a substrate can be used, for example.

In other words, after the light-emitting element is formed using a substrate, the light-emitting element may be transferred to another substrate. Examples of the substrate to which the light-emitting element is transferred include, in addition to the above substrates, a cellophane substrate, a stone substrate, a wood substrate, a cloth substrate (including a natural fiber (e.g., silk, cotton, and hemp), a synthetic fiber (e.g., nylon, polyurethane, and polyester), a regenerated fiber (e.g., acetate, cupra, rayon, and regenerated polyester), and the like), a leather substrate, and a rubber substrate. With the use of such a substrate, a light-emitting element with high durability, high heat resistance, reduced weight, or reduced thickness can be formed.

The light-emitting element 150 may be formed over an electrode electrically connected to, for example, a field-effect transistor (FET) that is formed over the above-described substrate. Accordingly, an active matrix display device in which the FET controls the driving of the light-emitting element 150 can be manufactured.

The structure described above in this embodiment can be combined with any of the structures described in the other embodiments as appropriate.

Embodiment 2

Figure 5:
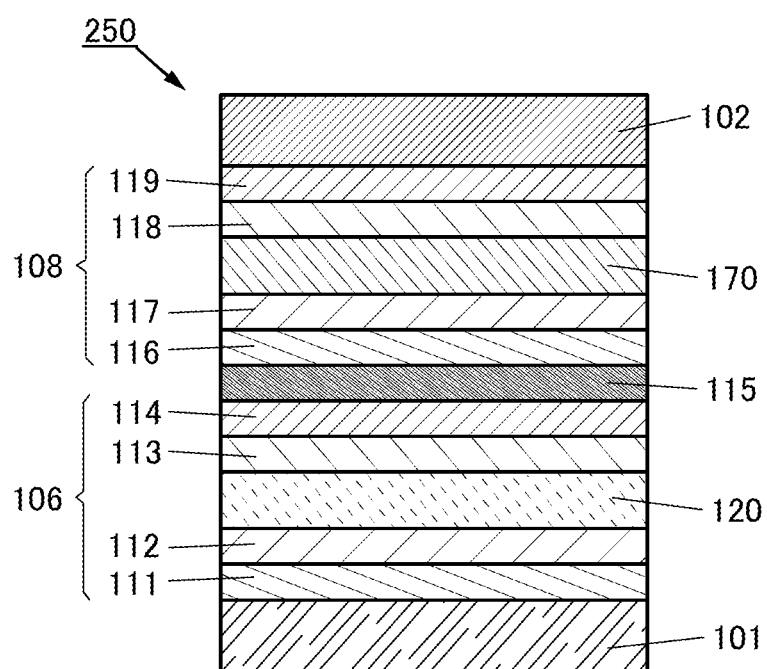
FIG. 5 is a schematic cross-sectional view of a light-emitting element of one embodiment of the present invention.

In this embodiment, a light-emitting element having a structure different from that described in Embodiment 1 will be described below with reference to FIG. 5. In FIG. 5, a portion having a function similar to that in FIG. 1A is represented by the same hatch pattern as in FIG. 1A and not particularly denoted by a reference numeral in some cases. In addition, common reference numerals are used for portions having similar functions, and a detailed description of the portions is omitted in some cases.

Structure Example 2 of Light-Emitting Element

FIG. 5 is a schematic cross-sectional view of a light-emitting element 250.

The light-emitting element 250 illustrated in FIG. 5 includes a plurality of light-emitting units (a light-emitting unit 106 and a light-emitting unit 108) between the pair of electrodes (the electrode 101 and the electrode 102). One of the light-emitting units preferably has the same structure as the EL layer 100 illustrated in FIG. 1A. That is, it is preferable that the light-emitting element 150 illustrated in FIG. 1A include one light-emitting unit while the light-emitting element 250 include a plurality of light-emitting units. Although the electrode 101 functions as an anode and the electrode 102 functions as a cathode in the following description of the light-emitting element 250, the functions may be interchanged in the light-emitting element 250.

In the light-emitting element 250 illustrated in FIG. 5, the light-emitting unit 106 and the light-emitting unit 108 are stacked, and a charge-generation layer 115 is provided between the light-emitting unit 106 and the light-emitting unit 108. Note that the light-emitting unit 106 and the light-emitting unit 108 may have the same structure or different structures. For example, it is preferable that a structure similar to that of the EL layer 100 be used in the light-emitting unit 108.

The light-emitting element 250 includes a light-emitting layer 120 and a light-emitting layer 170. The light-emitting unit 106 includes the hole-injection layer 111, the hole-transport layer 112, an electron-transport layer 113, and an electron-injection layer 114 in addition to the light-emitting layer 120. The light-emitting unit 108 includes a hole-injection layer 116, a hole-transport layer 117, the electron-transport layer 118, and the electron-injection layer 119 in addition to the light-emitting layer 170.

In the light-emitting element 250, any layer of each of the light-emitting unit 106 and the light-emitting unit 108 contains the organic compound of one embodiment of the present invention. Note that the layer containing the organic compound is preferably the electron-transport layer 113 or the electron-transport layer 118, and further preferably the light-emitting layer 120 or the light-emitting layer 170.

The charge-generation layer 115 may have either a structure in which an acceptor substance that is an electron acceptor is added to a hole-transport material or a structure in which a donor substance that is an electron donor is added to an electron-transport material. Alternatively, both of these structures may be stacked.

In the case where the charge-generation layer 115 contains a composite material of an organic compound and an acceptor substance, the composite material that can be used for the hole-injection layer 111 described in Embodiment 1 may be used as the composite material. As the organic compound, a variety of compounds such as an aromatic amine compound, a carbazole compound, an aromatic hydrocarbon, and a high molecular compound (such as an oligomer, a dendrimer, or a polymer) can be used. A material having a hole mobility of $1 \times 10^{-6}$ cm$^2$/Vs or higher is preferably used as the organic compound. Note that other than these substances, any substance that has a property of transporting more holes than electrons may be used. Since the composite material of an organic compound and an acceptor substance has excellent carrier-injection and carrier-transport properties, low-voltage driving and low-current driving can be achieved. Note that when a surface of a light-emitting unit on the anode side is in contact with the charge-generation layer 115, the charge-generation layer 115 can also serve as a hole-injection layer or a hole-transport layer of the light-emitting unit; thus, a hole-injection layer or a hole-transport layer is not necessarily included in the light-emitting unit. When a surface of the light-emitting unit on the cathode side is in contact with the charge-generation layer 115, the charge-generation layer 115 can also serve as an electron-injection layer or an electron-transport layer of the light-emitting unit; thus, an electron-injection layer or an electron-transport layer is not necessarily included in the light-emitting unit.

The charge-generation layer 115 may have a stacked structure of a layer containing the composite material of an organic compound and an acceptor substance and a layer containing another material. For example, the charge-generation layer 115 may be formed using a combination of a layer containing the composite material of an organic compound and an acceptor substance with a layer containing one compound selected from among electron-donating substances and a compound having a high electron-transport property. Furthermore, the charge-generation layer 115 may be formed using a combination of a layer containing the composite material of an organic compound and an acceptor substance with a layer containing a transparent conductive film.

The charge-generation layer 115 provided between the light-emitting unit 106 and the light-emitting unit 108 is configured so that electrons are injected into one of the light-emitting units and holes are injected into the other light-emitting unit when a voltage is applied between the electrode 101 and the electrode 102. For example, in FIG. 5, the charge-generation layer 115 injects electrons into the light-emitting unit 106 and holes into the light-emitting unit 108 when a voltage is applied such that the potential of the electrode 101 is higher than that of the electrode 102.

Note that in terms of outcoupling efficiency, the charge-generation layer 115 preferably has a visible light transmittance (specifically, a visible light transmittance of higher than or equal to 40%). The charge-generation layer 115 functions even when having lower conductivity than the pair of electrodes (the electrodes 101 and 102).

The charge-generation layer 115 formed by using any of the above materials can suppress an increase in driving voltage caused by the stack of the light-emitting layers.

The light-emitting element having two light-emitting units has been described with reference to FIG. 5; however, a similar structure can be used for a light-emitting element in which three or more light-emitting units are stacked. When a plurality of light-emitting units partitioned by a charge-generation layer are arranged between a pair of electrodes as in the light-emitting element 250, it is possible to provide a light-emitting element which can emit high-luminance light with the current density kept low and has a long lifetime. In addition, a light-emitting element with low power consumption can be provided.

Note that in each of the above-described structures, the emission colors of the guest materials used in the light-emitting unit 106 and the light-emitting unit 108 may be the same or different. In the case where guest materials emitting light of the same color are used for the light-emitting unit 106 and the light-emitting unit 108, the light-emitting element 250 can exhibit high emission luminance at a small current value, which is preferable. In the case where guest materials emitting light of different colors are used for the light-emitting unit 106 and the light-emitting unit 108, the light-emitting element 250 can exhibit multi-color light emission, which is preferable. In that case, when a plurality of light-emitting materials with different emission wavelengths are used in one or both of the light-emitting layers 120 and 170, the light-emitting element 250 emits light obtained by synthesizing lights with different emission peaks. That is, the emission spectrum of the light-emitting element 250 has at least two local maximum values.

The above structure is also suitable for obtaining white light emission. When the light-emitting layer 120 and the light-emitting layer 170 emit light of complementary colors, white light emission can be obtained. It is particularly favorable to select the guest materials so that white light emission with high color rendering properties or light emission of at least red, green, and blue can be obtained.

One or both of the light-emitting layer 120 and the light-emitting layer 170 preferably have the structure of the light-emitting layer 130 described in Embodiment 1, in which case a light-emitting element with high emission efficiency and high reliability can be obtained. The guest material contained in the light-emitting layer 130 is a fluorescent light-emitting material. Thus, when one or both of the light-emitting layer 120 and the light-emitting layer 170 have the structure of the light-emitting layer 130 described in Embodiment 1, a light-emitting element that emits light with a sharp emission spectrum and high color purity can be obtained.

In the case of a light-emitting element in which three or more light-emitting units are stacked, the emission colors of the guest materials used in the light-emitting units may be the same or different. In the case where a light-emitting element includes a plurality of light-emitting units that exhibit the same emission color, the emission color of the light-emitting units can have higher emission luminance at a smaller current value than another emission color of a light-emitting unit. Such a structure is suitable for adjusting light emission colors. The structure is particularly suitable when guest materials that have different emission efficiency and exhibit different emission colors are used. For example, when the light-emitting element has a three-layer structure of two light-emitting units containing a fluorescent material and emitting light of the same color and one light-emitting unit containing a phosphorescent material and emitting light of a color different from the color of the fluorescent material, the intensity of fluorescence and phosphorescence can be adjusted. That is, the intensity of emitted light of each color can be adjusted by changing the number of light-emitting units.

When a light-emitting element includes two fluorescence-emitting units and one phosphorescence-emitting unit, preferable combinations of the light-emitting units are as follows: a combination of two light-emitting units containing a blue fluorescent material and one light-emitting unit containing a yellow phosphorescent material; a combination of two light-emitting units containing a blue fluorescent material and one light-emitting unit containing a red phosphorescent material and a green phosphorescent material; and a combination of two light-emitting units containing a blue fluorescent material and one light-emitting unit containing a red phosphorescent material, a yellow phosphorescent material, and a green phosphorescent material. Such combinations are preferable because they enable efficient white light emission.

At least one of the light-emitting layers 120 and 170 may be divided into layers and each of the divided layers may contain different light-emitting materials. That is, at least one of the light-emitting layers 120 and 170 may consist of two or more layers. For example, in the case where the light-emitting layer is formed by stacking a first light-emitting layer and a second light-emitting layer in this order from the hole-transport layer side, the first light-emitting layer is formed using a material having a hole-transport property as the host material and the second light-emitting layer is formed using a material having an electron-transport property as the host material. A light-emitting material contained in the first light-emitting layer may be the same as or different from a light-emitting material contained in the second light-emitting layer. In addition, the materials may have functions of emitting light of the same color or light of different colors. White light emission with a high color rendering property that is formed of three primary colors or four or more colors can be obtained by using a plurality of light-emitting materials emitting light of different colors.

This embodiment can be combined with any of the other embodiments as appropriate.

Embodiment 3

In this embodiment, a light-emitting device including the light-emitting element described in Embodiment 1 and Embodiment 2 is described with reference to FIGS. 6A and 6B.

Figure 6A:
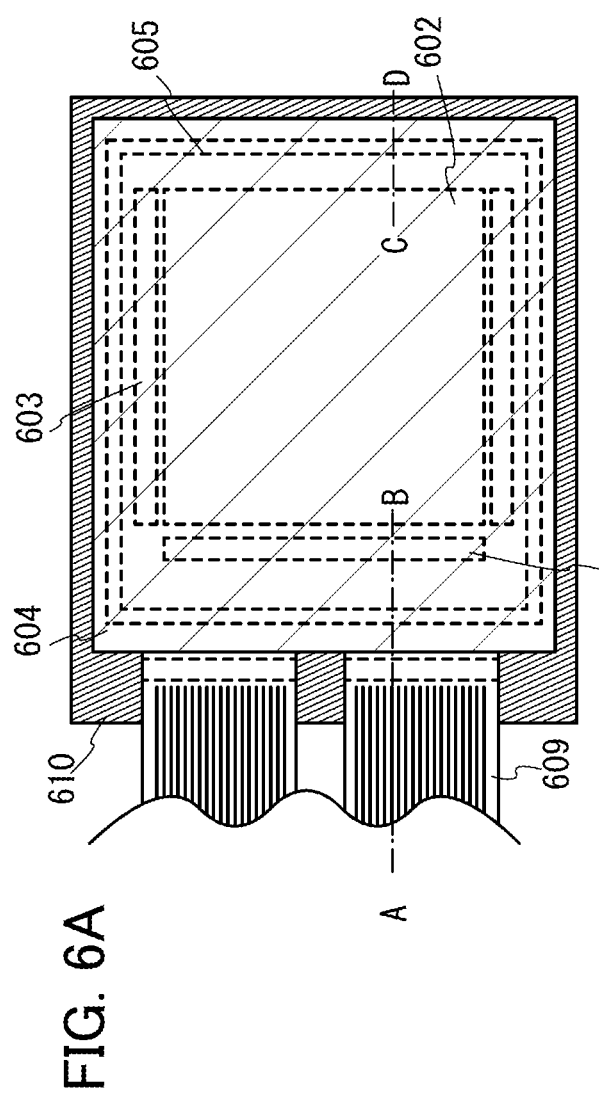
FIGS. 6A and 6B are a top view and a schematic cross-sectional view illustrating a display device of one embodiment of the present invention.
Figure 6B:
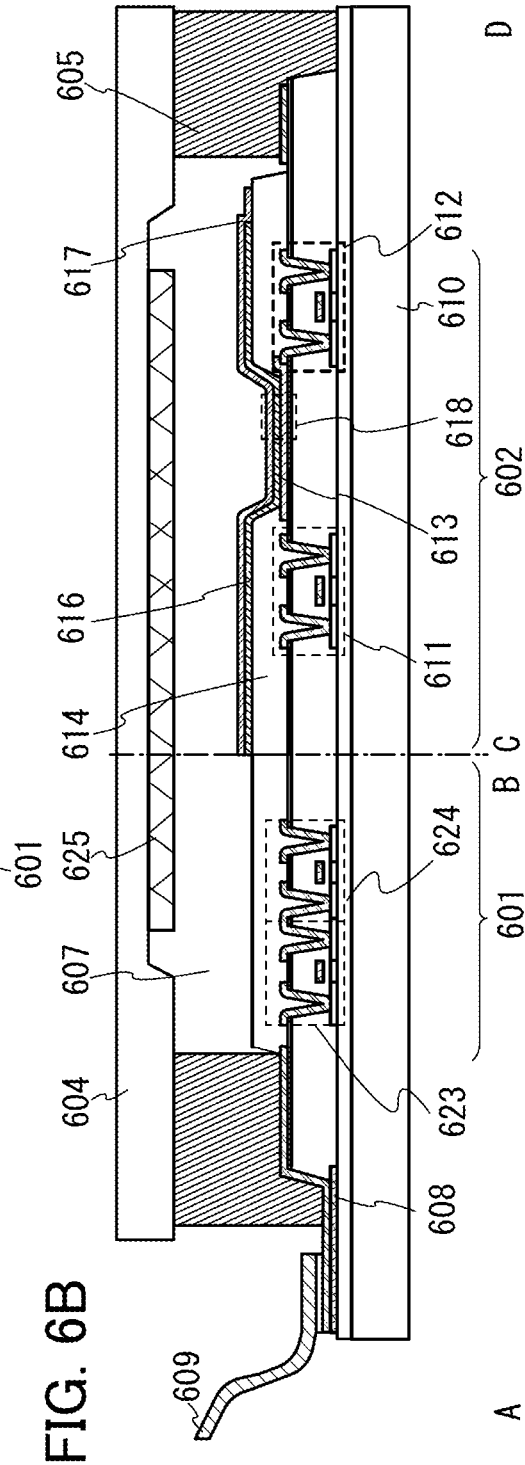

FIG. 6A is a top view of the light-emitting device and FIG. 6B is a cross-sectional view taken along the lines A-B and C-D in FIG. 6A. The light-emitting device includes a driver circuit portion (source side driver circuit) 601, a pixel portion 602, and a driver circuit portion (gate side driver circuit) 603, which control light emission of a light-emitting element and are illustrated with dotted lines. Moreover, a reference numeral 604 denotes a sealing substrate, a reference numeral 625 denotes a desiccant, and a reference numeral 605 denotes a sealant. A portion surrounded by the sealant 605 is a space 607.

Note that a lead wiring 608 is a wiring for transmitting signals to be input to the source side driver circuit 601 and the gate side driver circuit 603 and for receiving a video signal, a clock signal, a start signal, a reset signal, and the like from a flexible printed circuit (FPC) 609 functioning as an external input terminal. Although only the FPC is illustrated here, a printed wiring board (PWB) may be attached to the FPC. The light-emitting device in this specification includes, in its category, not only the light-emitting device itself but also the light-emitting device provided with the FPC or the PWB.

Next, a cross-sectional structure of the light-emitting device is described with reference to FIG. 6B. The driver circuit portion and the pixel portion are formed over an element substrate 610. Here, the source side driver circuit 601, which is the driver circuit portion, and one pixel of the pixel portion 602 are illustrated.

In the source side driver circuit 601, a CMOS circuit is formed in which an n-channel TFT 623 and a p-channel TFT 624 are combined. The driver circuit may be formed using various circuits such as a CMOS circuit, a PMOS circuit, or an NMOS circuit. Although a driver-integrated type in which the driver circuit is formed over the substrate is described in this embodiment, the driver circuit is not necessarily formed over the substrate and may be formed outside the substrate.

The pixel portion 602 includes a plurality of pixels each including a switching TFT 611, a current controlling TFT 612, and a first electrode 613 electrically connected to a drain of the current controlling TFT 612. Note that an insulator 614 is formed to cover an end portion of the first electrode 613. The insulator 614 can be formed using a positive photosensitive resin film.

In order to improve coverage with a film that is formed over the insulator 614, the insulator 614 is formed to have a curved surface with curvature at its upper or lower end portion. For example, in the case where photosensitive acrylic is used as a material of the insulator 614, only the upper end portion of the insulator 614 preferably has a curved surface. The radius of curvature of the curved surface is preferably greater than or equal to 0.2 µm and less than or equal to 0.3 µm. As the insulator 614, either a negative photosensitive material or a positive photosensitive material can be used.

An EL layer 616 and a second electrode 617 are formed over the first electrode 613. As a material used for the first electrode 613 which functions as an anode, a material having a high work function is preferably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack including a titanium nitride film and a film containing aluminum as its main component, a stack including three layers of a titanium nitride film, a film containing aluminum as its main component, and a titanium nitride film, or the like can be used. The stacked structure achieves low wiring resistance, a favorable ohmic contact, and a function as an anode.

The EL layer 616 is formed by any of a variety of methods such as an evaporation method using an evaporation mask, an inkjet method, and a spin coating method. As a material included in the EL layer 616, a low molecular compound or a high molecular compound (including an oligomer or a dendrimer) may be used.

As a material used for the second electrode 617, which is formed over the EL layer 616 and functions as a cathode, a material having a low work function (e.g., Al, Mg, Li, Ca, or an alloy or a compound thereof, such as MgAg, MgIn, or AlLi) is preferably used. In the case where light generated in the EL layer 616 passes through the second electrode 617, a stack including a thin metal film and a transparent conductive film (e.g., ITO, indium oxide containing zinc oxide at 2 wt % or higher and 20 wt % or lower, indium tin oxide containing silicon, or zinc oxide (ZnO)) is preferably used for the second electrode 617.

Note that a light-emitting element 618 is formed with the first electrode 613, the EL layer 616, and the second electrode 617. The light-emitting element 618 preferably has the structure described in Embodiment 1 and Embodiment 2. In the light-emitting device of this embodiment, the pixel portion, which includes a plurality of light-emitting elements, may include both the light-emitting element with the structure described in Embodiment 1 and Embodiment 2 and a light-emitting element with a different structure.

The sealing substrate 604 is attached to the element substrate 610 with the sealant 605, so that the light-emitting element 618 is provided in the space 607 surrounded by the element substrate 610, the sealing substrate 604, and the sealant 605. The space 607 is filled with a filler. The filler may be an inert gas (such as nitrogen or argon), or a resin and/or a desiccant.

An epoxy-based resin or glass frit is preferably used for the sealant 605. It is preferable that such a material do not transmit moisture or oxygen as much as possible. As the sealing substrate 604, a glass substrate, a quartz substrate, or a plastic substrate formed of fiber reinforced plastic (FRP), polyvinyl fluoride (PVF), polyester, acrylic, or the like can be used.

In the above manner, the light-emitting device including the light-emitting element described in Embodiment 1 and Embodiment 2 can be obtained.

Structure Example 1 of Light-Emitting Device

As an example of a light-emitting device, FIGS. 7A and 7B each illustrate a light-emitting device including a light-emitting element exhibiting white light emission and a coloring layer (a color filter).

FIG. 7A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting elements, a partition 1026, an EL layer 1028, a second electrode 1029 of the light-emitting elements, a sealing substrate 1031, a sealant 1032, a red pixel 1044R, a green pixel 1044G, a blue pixel 1044B, a white pixel 1044W, and the like.

In FIG. 7A, coloring layers (a red coloring layer 1034R, a green coloring layer 1034G, and a blue coloring layer 1034B) are provided on a transparent base material 1033. A black layer (a black matrix) 1035 may be additionally provided. The transparent base material 1033 provided with the coloring layers and the black layer is positioned and fixed to the substrate 1001. Note that the coloring layers and the black layer are covered with an overcoat layer 1036. In FIG. 7A, light emitted from some of the light-emitting layers does not pass through the coloring layers, while light emitted from the others of the light-emitting layers passes through the coloring layers. Since light that does not pass through the coloring layers is white and light that passes through any one of the coloring layers is red, blue, or green, an image can be displayed using pixels of the four colors.

FIG. 7B illustrates an example in which the red coloring layer 1034R, the green coloring layer 1034G, and the blue coloring layer 1034B are formed between the gate insulating film 1003 and the first interlayer insulating film 1020. As illustrated in FIG. 7B, the coloring layers may be provided between the substrate 1001 and the sealing substrate 1031.

The above-described light-emitting device has a structure in which light is extracted from the substrate 1001 side where the TFTs are formed (a bottom emission structure), but may have a structure in which light is extracted from the sealing substrate 1031 side (a top emission structure).

Structure Example 2 of Light-Emitting Device

FIGS. 8A and 8B are each a cross-sectional view of a light-emitting device having a top emission structure. In this case, a substrate that does not transmit light can be used as the substrate 1001. The process up to the step of forming of a connection electrode which connects the TFT and the anode of the light-emitting element is performed in a manner similar to that of the light-emitting device having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film 1021, or can be formed using any other various materials.

Lower electrodes 1025W, 1025R, 1025G, and 1025B of the light-emitting elements each function as an anode here, but may function as a cathode. Furthermore, in the case of the light-emitting device having a top emission structure as illustrated in FIGS. 8A and 8B, the lower electrodes 1025W, 1025R, 1025G, and 1025B are preferably reflective electrodes. Note that the second electrode 1029 preferably has a function of reflecting light and a function of transmitting light. It is preferable that a microcavity structure be used between the second electrode 1029 and the lower electrodes 1025W, 1025R, 1025G, and 1025B, in which case light having a specific wavelength is amplified. The EL layer 1028 is formed to have a structure similar to the structure described in Embodiment 1 and Embodiment 2, with which white light emission can be obtained.

In FIGS. 7A and 7B and FIGS. 8A and 8B, the structure of the EL layer for providing white light emission can be achieved by, for example, using a plurality of light-emitting layers or using a plurality of light-emitting units. Note that the structure providing white light emission is not limited to the above.

In the case of a top emission structure as illustrated in FIGS. 8A and 8B, sealing can be performed with the sealing substrate 1031 on which the coloring layers (the red coloring layer 1034R, the green coloring layer 1034G, and the blue coloring layer 1034B) are provided. The sealing substrate 1031 may be provided with the black layer (the black matrix) 1035 which is positioned between pixels. The coloring layers (the red coloring layer 1034R, the green coloring layer 1034G, and the blue coloring layer 1034B) and the black layer (the black matrix) may be covered with the overcoat layer. Note that a light-transmitting substrate is used as the sealing substrate 1031.

FIG. 8A illustrates a structure in which full color display is performed using three colors of red, green, and blue; alternatively, full color display may be performed using four colors of red, green, blue, and white as illustrated in FIG. 8B. Note that the structure for performing full color display is not limited to them. For example, full color display using four colors of red, green, blue, and yellow may be performed.

In the light-emitting element of one embodiment of the present invention, a fluorescent material is used as a guest material. Since a fluorescent material has a sharper spectrum than a phosphorescent material, light emission with high color purity can be obtained. Accordingly, with the use of the light-emitting element, the light-emitting device described in this embodiment can have high color reproducibility.

In the above manner, the light-emitting device including the light-emitting element described in Embodiment 1 and Embodiment 2 can be obtained.

This embodiment can be combined with any of the other embodiments as appropriate.

Embodiment 4

In this embodiment, electronic devices and display devices of one embodiment of the present invention are described.

According to one embodiment of the present invention, electronic devices and display devices including flat surfaces and having high emission efficiency and high reliability can be manufactured. According to one embodiment of the present invention, electronic devices and display devices including curved surfaces and having high emission efficiency and high reliability can be manufactured. The light-emitting element of one embodiment of the present invention can emit light with high color purity. Accordingly, with the use of the light-emitting element in the light-emitting device of this embodiment, an electronic device and a display device having high color reproducibility can be obtained.

Examples of the electronic devices include a television set, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

Figure 9A:
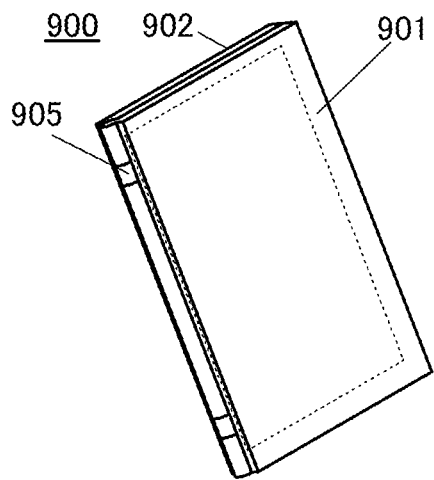
FIGS. 9A to 9D illustrate electronic devices of one embodiment of the present invention.
Figure 9B:
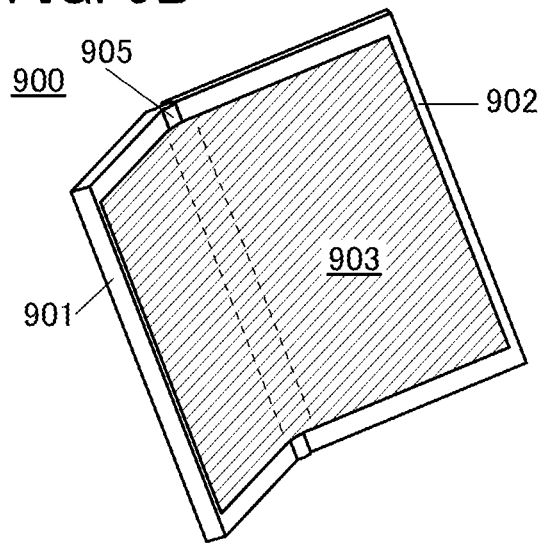

A portable information terminal 900 illustrated in FIGS. 9A and 9B includes a housing 901, a housing 902, a display portion 903, a hinge portion 905, and the like.

The housing 901 and the housing 902 are joined to each other by the hinge portion 905. The portable information terminal 900 can be opened as illustrated in FIG. 9B from a closed state (FIG. 9A). Thus, the portable information terminal 900 has high portability when carried and excellent visibility when used because of its large display region.

In the portable information terminal 900, the flexible display portion 903 is provided across the housing 901 and the housing 902 which are joined to each other by the hinge portion 905.

The light-emitting device manufactured using one embodiment of the present invention can be used for the display portion 903. Thus, the portable information terminal can have high reliability.

The display portion 903 can display at least one of document data, a still image, a moving image, and the like. When document data is displayed on the display portion, the portable information terminal 900 can be used as an e-book reader.

When the portable information terminal 900 is opened, the display portion 903 is gently curved. For example, the display portion 903 is held while including a curved portion with a radius of curvature of greater than or equal to 1 mm and less than or equal to 50 mm, preferably greater than or equal to 5 mm and less than or equal to 30 mm. Part of the display portion 903 can display an image while being bent since pixels are continuously arranged from the housing 901 to the housing 902.

The display portion 903 functions as a touch panel and can be controlled with a finger, a stylus, or the like.

The display portion 903 is preferably formed using one flexible display. Thus, a continuous image can be displayed between the housing 901 and the housing 902. Note that each of the housing 901 and the housing 902 may be provided with a display.

The hinge portion 905 preferably includes a locking mechanism so that an angle formed between the housing 901 and the housing 902 does not become larger than a predetermined angle when the portable information terminal 900 is opened. For example, an angle at which the housing 901 and the housing 902 become locked (they are not opened any further) is preferably greater than or equal to 90° and less than 180° and can be typically 90°, 120°, 135°, 150°, 175°, or the like. In that case, the convenience, safety, and reliability of the portable information terminal 900 can be improved.

When the hinge portion 905 includes a locking mechanism, excessive force is not applied to the display portion 903; thus, the breakage of the display portion 903 can be prevented. Therefore, a highly reliable portable information terminal can be provided.

A power button, an operation button, an external connection port, a speaker, a microphone, or the like may be provided for the housing 901 and the housing 902.

One of the housing 901 and the housing 902 is provided with a wireless communication module, and data can be transmitted and received through a computer network such as the Internet, a local area network (LAN), or Wi-Fi (registered trademark).

Figure 9C:
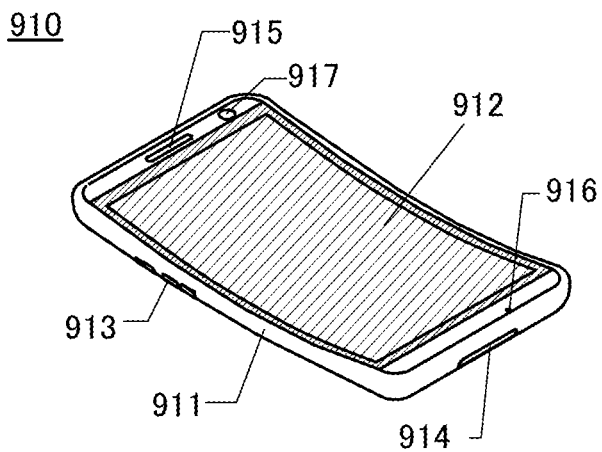

A portable information terminal 910 illustrated in FIG. 9C includes a housing 911, a display portion 912, an operation button 913, an external connection port 914, a speaker 915, a microphone 916, a camera 917, and the like.

The light-emitting device manufactured using one embodiment of the present invention can be used for the display portion 912. Thus, the portable information terminal can be manufactured with high yield.

The portable information terminal 910 includes a touch sensor in the display portion 912. Operations such as making a call and inputting a character can be performed by touch on the display portion 912 with a finger, a stylus, or the like.

With the operation button 913, the power can be turned on or off. In addition, types of images displayed on the display portion 912 can be switched; for example, switching an image from a mail creation screen to a main menu screen is performed with the operation button 913.

When a detection device such as a gyroscope sensor or an acceleration sensor is provided inside the portable information terminal 910, the direction of display on the screen of the display portion 912 can be automatically changed by determining the orientation of the portable information terminal 910 (whether the portable information terminal 910 is placed horizontally or vertically). Furthermore, the direction of display on the screen can be changed by a touch on the display portion 912, operation with the operation button 913, sound input using the microphone 916, or the like.

The portable information terminal 910 functions as, for example, one or more of a telephone set, a notebook, and an information browsing system. Specifically, the portable information terminal 910 can be used as a smartphone. The portable information terminal 910 is capable of executing a variety of applications such as mobile phone calls, e-mailing, viewing and editing texts, music reproduction, reproducing a moving image, Internet communication, and computer games, for example.

Figure 9D:
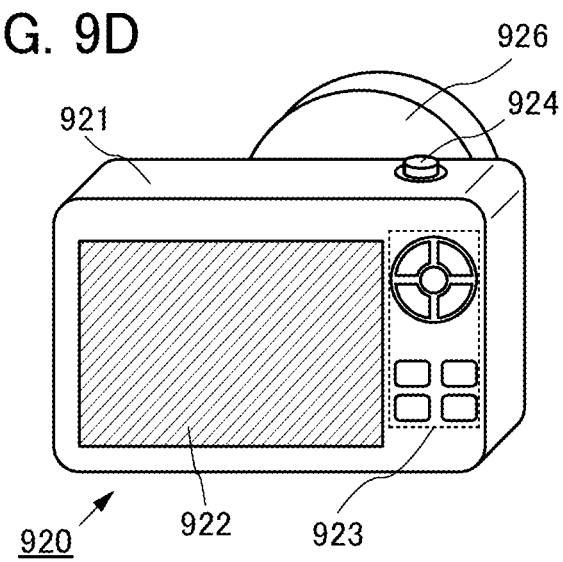

A camera 920 illustrated in FIG. 9D includes a housing 921, a display portion 922, operation buttons 923, a shutter button 924, and the like. Furthermore, an attachable lens 926 is attached to the camera 920.

The light-emitting device manufactured using one embodiment of the present invention can be used for the display portion 922. Thus, the camera can be highly reliable.

Although the lens 926 of the camera 920 illustrated here is detachable from the housing 921 for replacement, the lens 926 may be incorporated into the housing 921.

A still image or a moving image can be taken with the camera 920 at the press of the shutter button 924. In addition, images can be taken by a touch on the display portion 922 which has a function of a touch panel.

Note that a stroboscope, a viewfinder, or the like can be additionally attached to the camera 920. Alternatively, these may be incorporated into the housing 921.

Figure 10A:
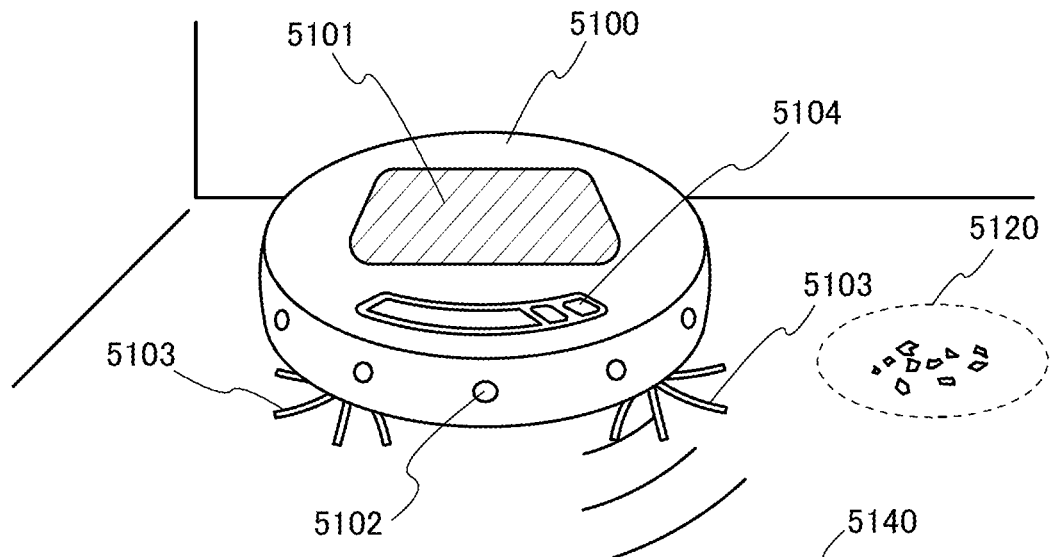
FIGS. 10A to 10C illustrate electronic devices of one embodiment of the present invention.

FIG. 10A is a schematic view illustrating an example of a cleaning robot.

A cleaning robot 5100 includes a display 5101 on its top surface, a plurality of cameras 5102 on its side surface, a brush 5103, and an operation button 5104. Although not illustrated, the bottom surface of the cleaning robot 5100 is provided with a tire, an inlet, and the like.

Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a radio communication means.

The cleaning robot 5100 is self-propelled, detects dust 5120, and vacuums the dust through the inlet provided on the bottom surface.

The cleaning robot 5100 can judge whether or not there is an obstacle such as a wall, furniture, or a step by analyzing an image taken by the cameras 5102. In the case where the cleaning robot 5100 detects an object that is likely to be caught in the brush 5103, such as a wiring, by analyzing an image, the rotation of the brush 5103 can be stopped.

The display 5101 can display the remaining capacity of a battery, the amount of vacuumed dust, and the like. The display 5101 may display a path in which the cleaning robot 5100 has run. The display 5101 may be a touch panel and the operation button 5104 may be provided on the display 5101.

The cleaning robot 5100 can communicate with a portable electronic device 5140 such as a smartphone. The portable electronic device 5140 can display an image taken by the cameras 5102. Thus, an owner of the cleaning robot 5100 can monitor his/her room even from the outside. The owner can also check the display on the display 5101 with the portable electronic device 5140 such as a smartphone.

The light-emitting device of one embodiment of the present invention can be used for the display 5101.

Figure 10B:
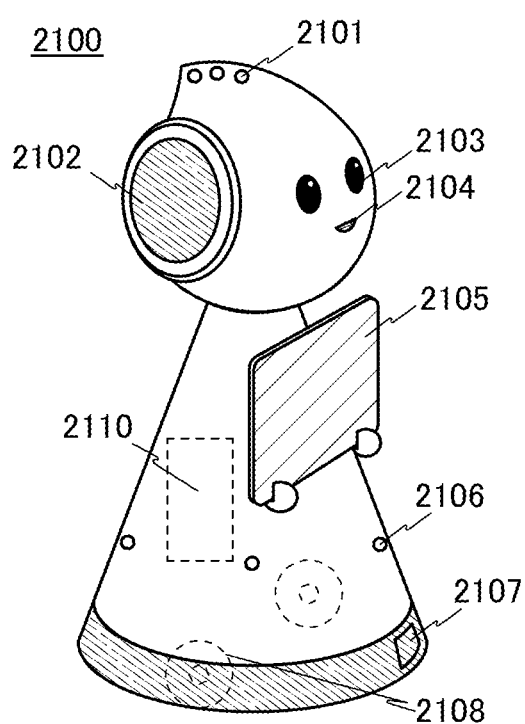

A robot 2100 illustrated in FIG. 10B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. The display 2105 may be a detachable information terminal, in which case the display can be charged and transmit and receive data when in the home position of the robot 2100.

The upper camera 2103 and the lower camera 2106 each have a function of capturing an image of the surroundings of the robot 2100. The obstacle sensor 2107 can detect an obstacle in the direction where the robot 2100 advances with the moving mechanism 2108. The robot 2100 can move safely by recognizing an ambient environment with the upper camera 2103, the lower camera 2106, and the obstacle sensor 2107.

The light-emitting device of one embodiment of the present invention can be used for the display 2105.

Figure 10C:
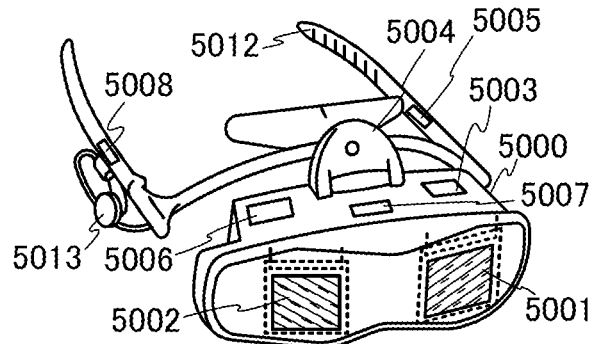

FIG. 10C illustrates an example of a goggle-type display. The goggle-type display includes, for example, a housing 5000, a display portion 5001, a speaker 5003, an LED lamp 5004, operation keys 5005 (including a power switch and an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, a second display portion 5002, a support 5012, an earphone 5013, and the like.

The light-emitting device of one embodiment of the present invention can be used for the display portion 5001 and the second display portion 5002.

Figure 11A:
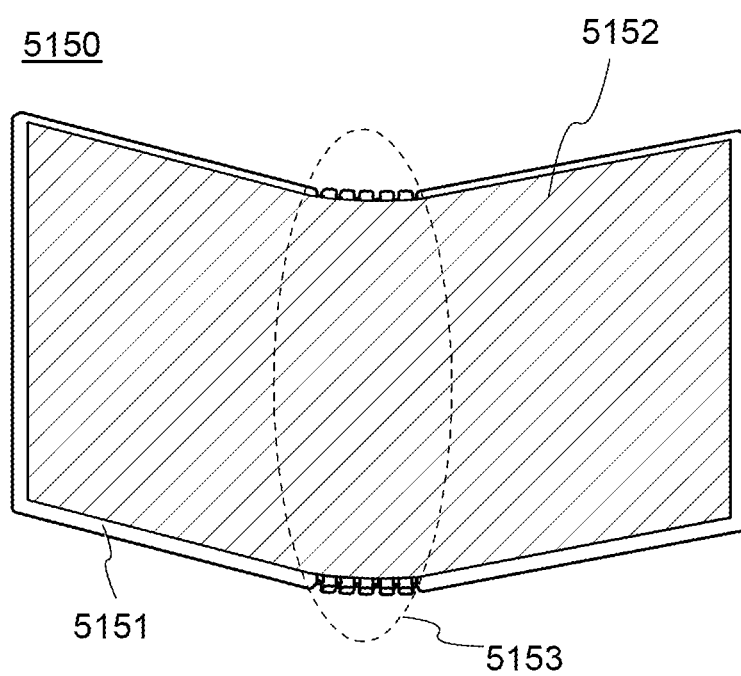
FIGS. 11A and 11B illustrate an electronic device of one embodiment of the present invention.
Figure 11B:
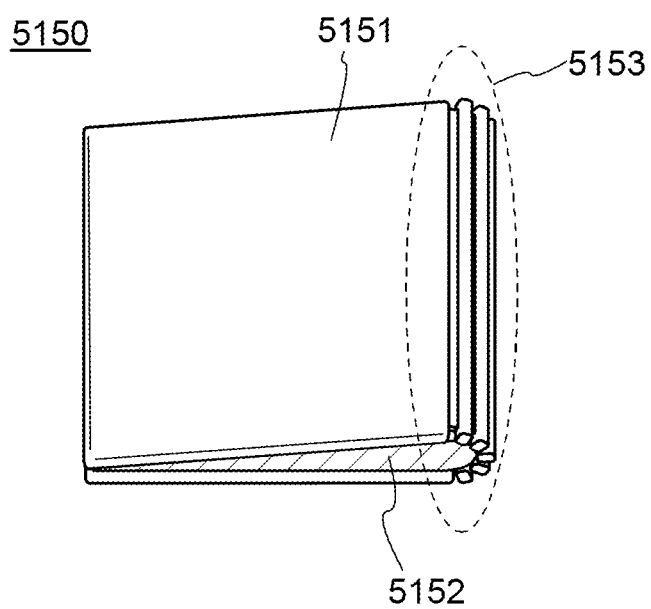

FIGS. 11A and 11B illustrate a foldable portable information terminal 5150. The foldable portable information terminal 5150 includes a housing 5151, a display region 5152, and a bend portion 5153. FIG. 11A illustrates the portable information terminal 5150 that is opened. FIG. 11B illustrates the portable information terminal 5150 that is folded. Despite its large display region 5152, the portable information terminal 5150 is compact in size and has excellent portability when folded.

The display region 5152 can be folded in half with the bend portion 5153. The bend portion 5153 includes a flexible member and a plurality of supporting members. When the display region is folded, the flexible member expands and the bend portion 5153 has a radius of curvature of 2 mm or more, preferably 5 mm or more.

Note that the display region 5152 may be a touch panel (an input/output device) including a touch sensor (an input device). The light-emitting device of one embodiment of the present invention can be used for the display region 5152.

This embodiment can be combined with any of the other embodiments as appropriate.

Embodiment 5

In this embodiment, examples in which the light-emitting element of one embodiment of the present invention is used for various lighting devices will be described with reference to FIG. 12. With the use of the light-emitting element of one embodiment of the present invention, a highly reliable lighting device with high emission efficiency can be manufactured.

An electronic device or a lighting device that has a light-emitting region with a curved surface can be obtained with use of the light-emitting element of one embodiment of the present invention which is fabricated over a substrate having flexibility.

Furthermore, a light-emitting device in which the light-emitting element of one embodiment of the present invention is used can also be used for lighting for motor vehicles, examples of which are lighting for a windshield, a ceiling, and the like.

Figure 12:
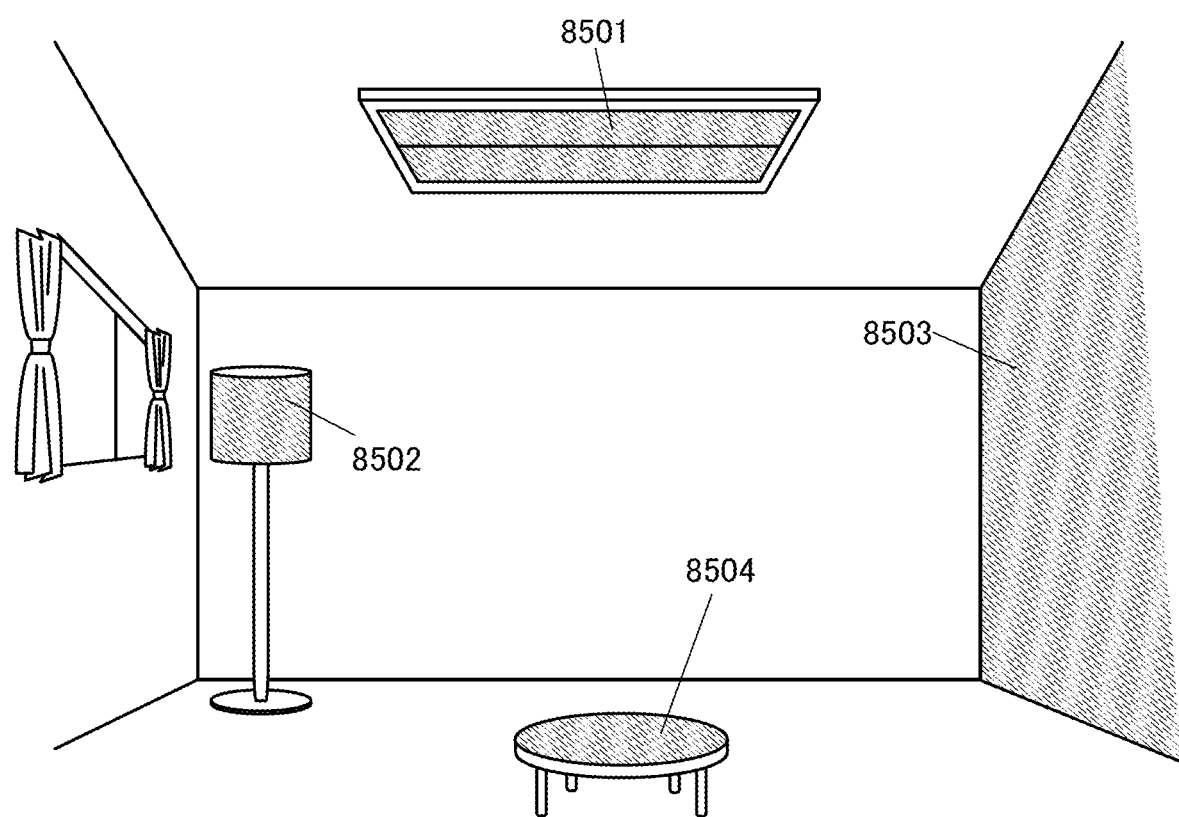
FIG. 12 illustrates a lighting device of one embodiment of the present invention.

FIG. 12 illustrates an example in which the light-emitting element is used for an indoor lighting device 8501. Since the light-emitting element can have a larger area, a lighting device having a large area can also be formed. In addition, a lighting device 8502 in which a light-emitting region has a curved surface can also be formed with use of a housing with a curved surface. A light-emitting element described in this embodiment is in the form of a thin film, which allows the housing to be designed more freely. Therefore, the lighting device can be elaborately designed in a variety of ways. Furthermore, a wall of the room may be provided with a large-sized lighting device 8503. Touch sensors may be provided in the lighting devices 8501, 8502, and 8503 to control the power on/off of the lighting devices.

Moreover, when the light-emitting element is used on the surface side of a table, a lighting device 8504 which functions as a table can be obtained. When the light-emitting element is used as part of other furniture, a lighting device which functions as the furniture can be obtained.

As described above, lighting devices and electronic devices can be obtained with use of the light-emitting element of one embodiment of the present invention. Note that the light-emitting element can be used for lighting devices and electronic devices in a variety of fields without being limited to the lighting devices and the electronic devices described in this embodiment.

The structures described in this embodiment can be combined with any of the structures described in the other embodiments as appropriate.

Example 1

In this example, fabrication examples of light-emitting elements of one embodiment of the present invention will be described. The structure of each of the light-emitting elements fabricated in this example is the same as that illustrated in FIG. 1A. Table 1 shows the details of the element structures. The structures and abbreviations of compounds used here are shown below. Refer to the above embodiment for the structures and abbreviations of the other compounds.

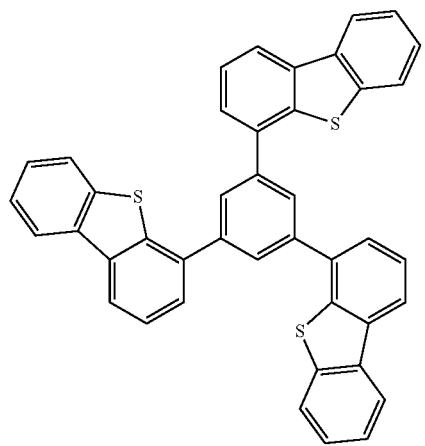

DBT3P-II

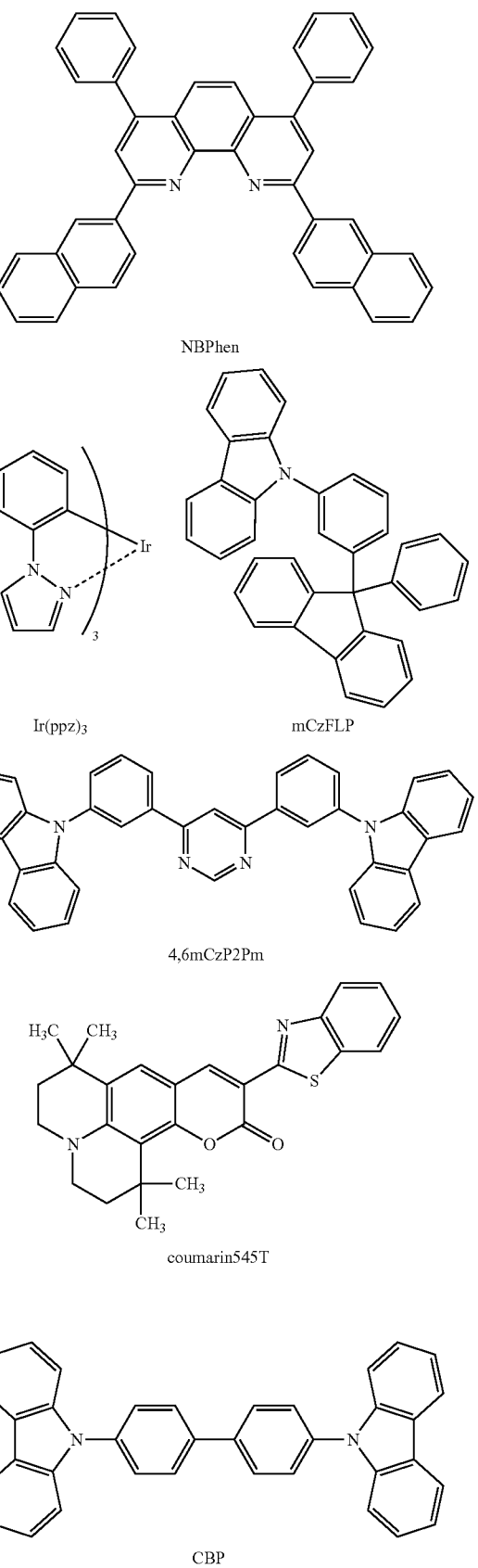

-continued

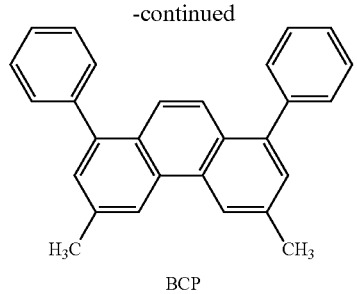

BCP

Then, as the hole-transport layer 112, 9-[3-(9-phenyl-9H-fluoren-9-yl)phenyl]-9H-carbazole (abbreviation: mCzFLP) was deposited by evaporation over the hole-injection layer 111 to a thickness of 20 nm.

Next, as the light-emitting layer 130, 4PCCzBfpm, tris[2-(1H-pyrazol-1-yl-κN$^2$)phenyl-κC]iridium(III) (abbreviation: Ir(ppz)$_3$), and 10-(2-benzothiazolyl)-2,3,6,7-tetrahydro-1,1,7,7-tetramethyl-1H,5H,11H-[1]benzopyrano[6,7,8-ij]quinolizin-11-one (abbreviation: coumarin 545T) were deposited by co-evaporation over the hole-transport layer 112 to a thickness of 30 nm with a weight ratio of 4PCCzBfpm to Ir(ppz)$_3$ and coumarin 545T being 0.8:0.2:

TABLE 1

| | Layer | Reference numeral | Thickness (nm) | Material | Weight ratio |
|---|---|---|---|---|---|
| Light-emitting element 1 | Electrode | 102 | 200 | Al | — |
| | Electron-injection layer | 119 | 1 | LiF | — |
| | Electron-transport layer | 118 (2) | 10 | NBPhen | — |
| | | 118 (1) | 20 | 4,6mCzP2Pm | — |
| | Light-emitting layer | 130 | 30 | 4PCCzBfpm:Ir(ppz)$_3$:coumarin 545T | 0.8:0.2:0.005 |
| | Hole-transport layer | 112 | 20 | mCzFLP | — |
| | Hole-injection layer | 111 | 40 | DBT3P-II:MoO$_3$ | 1:0.5 |
| | Anode | 101 | 70 | ITSO | — |
| Comparative light-emitting element 2 | Electrode | 102 | 200 | Al | — |
| | Electron-injection layer | 119 | 1 | LiF | — |
| | Electron-transport layer | 118 (2) | 10 | NBPhen | — |
| | | 118 (1) | 20 | 4,6mCzP2Pm | — |
| | Light-emitting layer | 130 | 30 | 4PCCzBfpm:Ir(ppz)$_3$ | 0.8:0.2 |
| | Hole-transport layer | 112 | 20 | mCzFLP | — |
| | Hole-injection layer | 111 | 40 | DBT3P-II:MoO$_3$ | 1:0.5 |
| | Anode | 101 | 70 | ITSO | — |
| Light-emitting element 3 | Electrode | 102 | 200 | Al | — |
| | Electron-injection layer | 119 | 1 | LiF | — |
| | Electron-transport layer | 118 (2) | 10 | NBPhen | — |
| | | 118 (1) | 20 | 4,6mCzP2Pm | — |
| | Light-emitting layer | 130 | 30 | 4PCCzPBfpm:Ir(ppz)$_3$:coumarin 545T | 0.8:0.2:0.005 |
| | Hole-transport layer | 112 | 20 | mCzFLP | — |
| | Hole-injection layer | 111 | 40 | DBT3P-II:MoO$_3$ | 1:0.5 |
| | Anode | 101 | 70 | ITSO | — |
| Comparative light-emitting element 4 | Electrode | 102 | 200 | Al | — |
| | Electron-injection layer | 119 | 1 | LiF | — |
| | Electron-transport layer | 118 (2) | 10 | NBPhen | — |
| | | 118 (1) | 20 | 4,6mCzP2Pm | — |
| | Light-emitting layer | 130 | 30 | 4PCCzPBfpm:Ir(ppz)$_3$ | 0.8:0.2 |
| | Hole-transport layer | 112 | 20 | mCzFLP | — |
| | Hole-injection layer | 111 | 40 | DBT3P-II:MoO$_3$ | 1:0.5 |
| | Anode | 101 | 70 | ITSO | — |
| Comparative light-emitting element 5 | Electrode | 102 | 200 | Al | — |
| | Electron-injection layer | 119 | 1 | LiF | — |
| | Electron-transport layer | 118 (2) | 15 | NBPhen | — |
| | | 118 (1) | 10 | BCP | — |
| | Light-emitting layer | 130 | 30 | CBP:Ir(ppz)$_3$:coumarin 545T | 0.8:0.2:0.005 |
| | Hole-transport layer | 112 | 20 | mCzFLP | — |
| | Hole-injection layer | 111 | 40 | DBT3P-II:MoO$_3$ | 1:0.5 |
| | Anode | 101 | 70 | ITSO | — |

<Fabrication of Light-Emitting Elements>

Fabrication methods of the light-emitting elements in this example will be described below.

<<Fabrication of Light-Emitting Element 1>>

As the electrode 101, an ITSO film was formed to a thickness of 70 nm over a glass substrate. Note that the electrode area of the electrode 101 was set to 4 mm$^2$ (2 mm×2 mm).

Next, as the hole-injection layer 111, DBT3P-II and molybdenum oxide (MoO$_3$) were deposited by co-evaporation over the electrode 101 to a thickness of 40 nm with a weight ratio of DBT3P-II to MoO$_3$ being 1:0.5.

0.005. In the light-emitting layer 130, coumarin 545T is a fluorescent compound and Ir(ppz)$_3$ is a phosphorescent compound.

Subsequently, as the electron-transport layer 118, 4,6mCzP2Pm and NBPhen were sequentially deposited by evaporation over the light-emitting layer 130 to thicknesses of 20 nm and 10 nm, respectively. Then, as the electron-injection layer 119, LiF was deposited by evaporation over the electron-transport layer 118 to a thickness of 1 nm.

Next, as the electrode 102, aluminum (Al) was deposited over the electron-injection layer 119 to a thickness of 200 nm.

Then, in a glove box containing a nitrogen atmosphere, the light-emitting element 1 was sealed by fixing a glass substrate for sealing to the glass substrate over which the organic materials were deposited using a sealant for organic EL. Specifically, after the sealant was applied to surround the organic materials over the glass substrate and the glass substrate was bonded to the glass substrate for sealing, irradiation with ultraviolet light having a wavelength of 365 nm at 6 J/cm$^2$ and heat treatment at 80° C. for one hour were performed. Through the above steps, the light-emitting element 1 was fabricated.

<<Fabrication of comparative light-emitting element 2>>

A comparative light-emitting element 2 was fabricated through the same steps as those for the above-described light-emitting element 1 except for the step of forming the light-emitting layer 130.

As the light-emitting layer 130 of the comparative light-emitting element 2, 4PCCzBfpm and Ir(ppz)$_3$ were deposited by co-evaporation to a thickness of 30 nm with a weight ratio of 4PCCzBfpm to Ir(ppz)$_3$ being 0.8:0.2. The difference between the comparative light-emitting element 2 and the light-emitting element 1 is whether the fluorescent compound is contained, and the other components are the same.

<<Fabrication of Light-Emitting Element 3>>

A light-emitting element 3 was fabricated through the same steps as those for the above-described light-emitting element 1 except for the step of forming the light-emitting layer 130.

As the light-emitting layer 130 of the light-emitting element 3, 4-[4-(9'-phenyl-3,3'-bi-9H-carbazol-9-yl)phenyl]benzofuro[3,2-d]pyrimidine (abbreviation: 4PCCzPBfpm), Ir(ppz)$_3$, and coumarin 545T were deposited by co-evaporation to a thickness of 30 nm with a weight ratio of 4PCCzPBfpm to Ir(ppz)$_3$ and coumarin 545T being 0.8:0.2:0.005.

<<Fabrication of Comparative Light-Emitting Element 4>>

A comparative light-emitting element 4 was fabricated through the same steps as those for the above-described light-emitting element 3 except for the step of forming the light-emitting layer 130.

As the light-emitting layer 130 of the comparative light-emitting element 4, 4PCCzPBfpm and Ir(ppz)$_3$ were deposited by co-evaporation to a thickness of 30 nm with a weight ratio of 4PCCzPBfpm to Ir(ppz)$_3$ being 0.8:0.2. The difference between the comparative light-emitting element 4 and the light-emitting element 3 is whether the fluorescent compound is contained, and the other components are the same.

<<Fabrication of Comparative Light-Emitting Element 5>>

A comparative light-emitting element 5 was fabricated through the same steps as those for the above-described light-emitting element 1 except for the steps of forming the light-emitting layer 130 and the electron-transport layer 118.

As the light-emitting layer 130 of the comparative light-emitting element 5, 4,4'-bis(9-carbazolyl)biphenyl (abbreviation: CBP), Ir(ppz)$_3$, and coumarin 545T were deposited by co-evaporation to a thickness of 30 nm with a weight ratio of CBP to Ir(ppz)$_3$ and coumarin 545T being 0.8:0.2:0.005. A difference between the comparative light-emitting element 5 and the light-emitting element 1 is the host material. The comparative light-emitting element 5 was fabricated using CBP, which is not a TADF material, as the host material.

Next, as the electron-transport layer 118, bathocuproine (abbreviation: BCP) and NBPhen were sequentially deposited by evaporation over the light-emitting layer 130 to thicknesses of 10 nm and 15 nm, respectively.

<Characteristics of Light-Emitting Elements>

Next, the characteristics of the fabricated light-emitting elements 1 and 3 and comparative light-emitting elements 2, 4, and 5 were measured. Luminance and CIE chromaticity were measured with a luminance colorimeter (BM-5A manufactured by TOPCON TECHNOHOUSE CORPORATION), and electroluminescence spectra were measured with a multi-channel spectrometer (PMA-11 manufactured by Hamamatsu Photonics K.K.).

Figure 13:
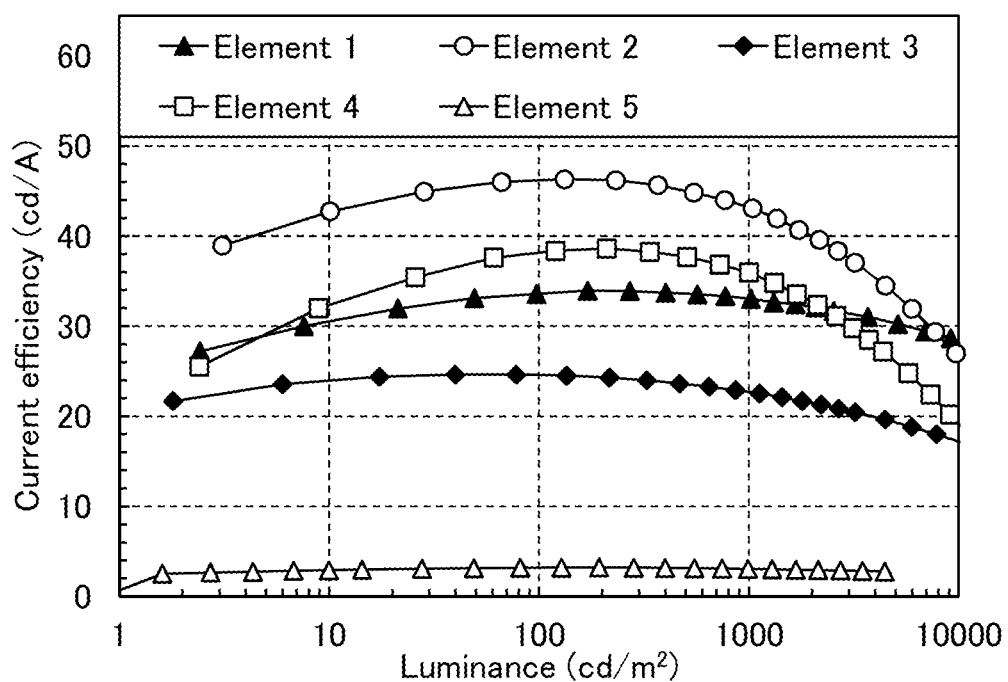
FIG. 13 shows luminance—current efficiency characteristics of light-emitting elements in Example.
Figure 14:
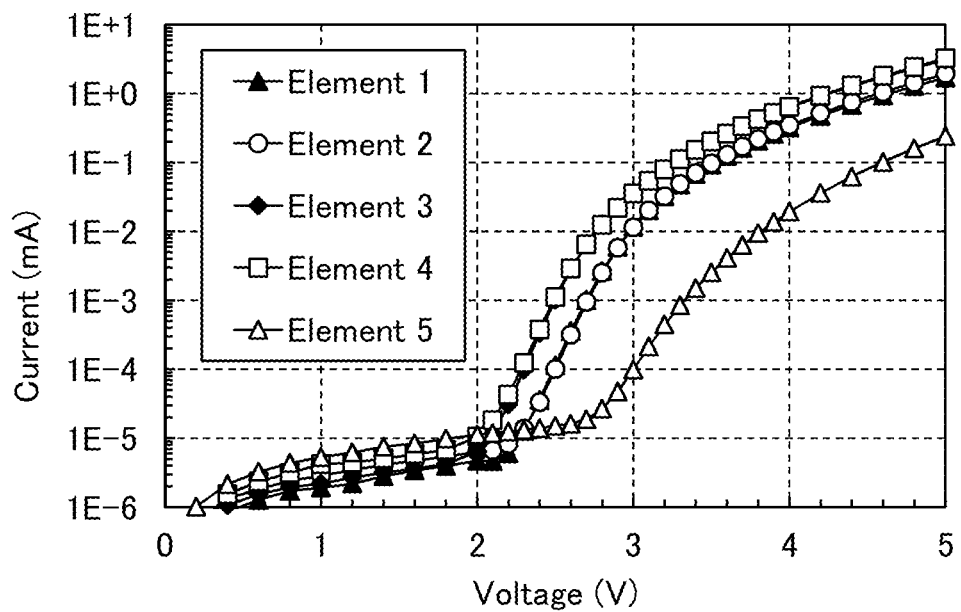
FIG. 14 shows voltage—current characteristics of light-emitting elements in Example.
Figure 15:
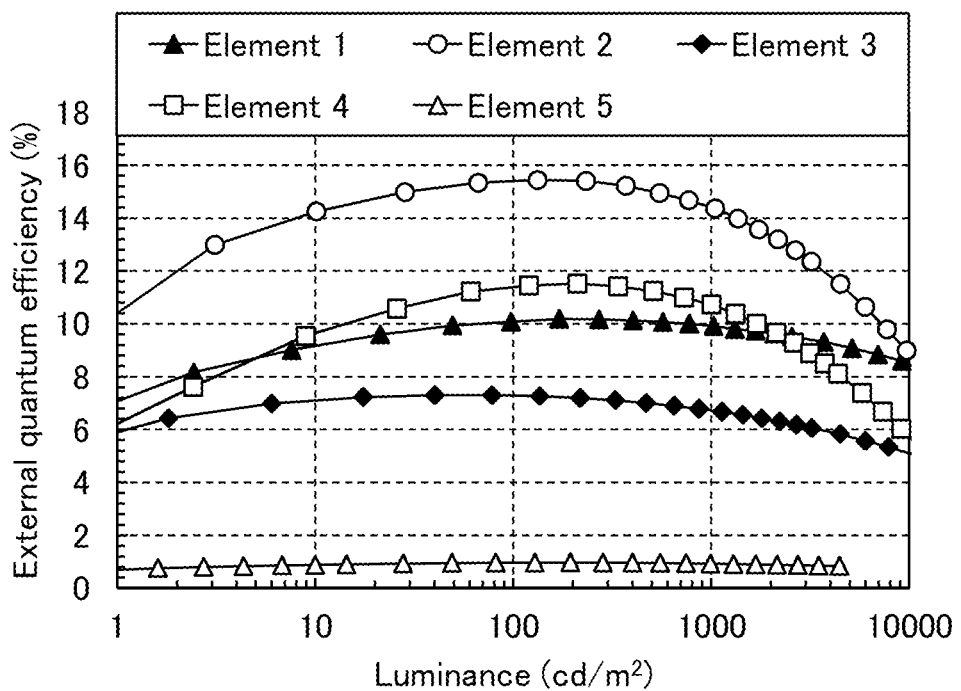
FIG. 15 shows luminance—external quantum efficiency characteristics of light-emitting elements in Example.
Figure 16:
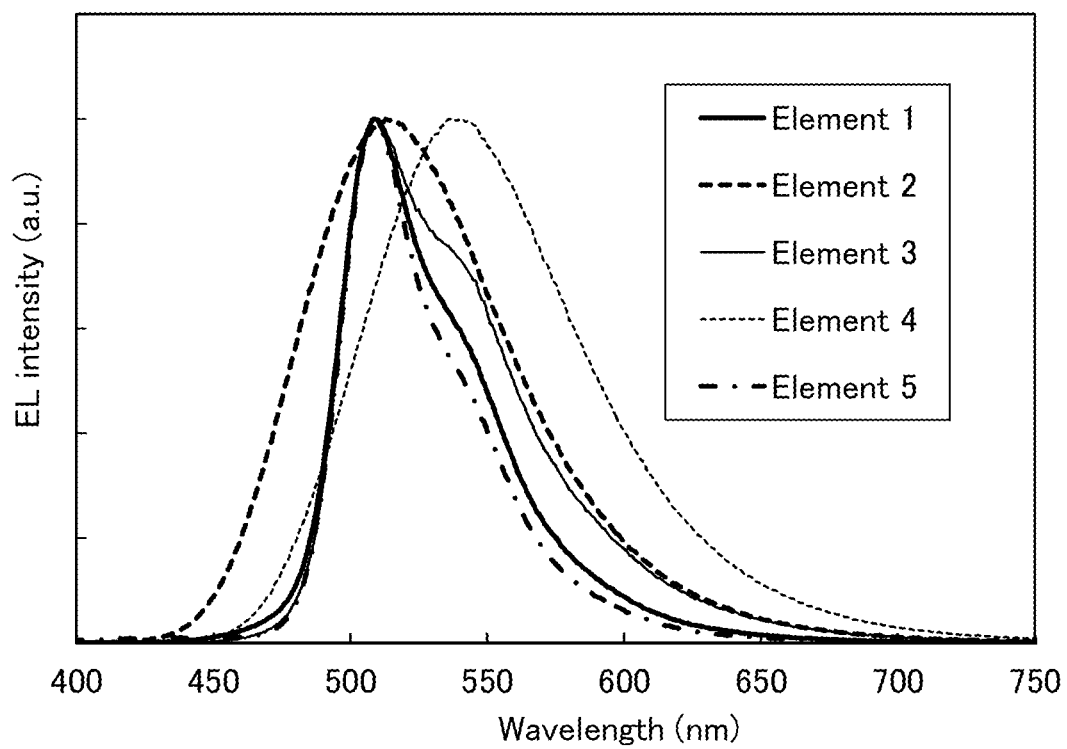
FIG. 16 shows emission spectra of light-emitting elements in Example.

FIG. 13, FIG. 14, and FIG. 15 show luminance—current efficiency characteristics, voltage—current characteristics, and luminance—external quantum efficiency characteristics, respectively, of the light-emitting elements 1 and 3 and the comparative light-emitting elements 2, 4, and 5. FIG. 16 shows the electroluminescence spectra when current at a current density of 2.5 mA/cm$^2$ was supplied to the light-emitting elements 1 and 3 and the comparative light-emitting elements 2, 4, and 5. Note that the measurements of the light-emitting elements were performed at room temperature (in an atmosphere kept at 23° C.).

Table 2 shows the element characteristics of the light-emitting elements 1 and 3 and the comparative light-emitting elements 2, 4, and 5 at around 1000 cd/m$^2$.

TABLE 2

| | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
| --- | --- | --- | --- | --- | --- | --- | --- |
| Light-emitting element 1 | 3.60 | 3.10 | (0.231, 0.652) | 1020 | 33.0 | 28.8 | 9.92 |
| Comparative light-emitting element 2 | 3.50 | 2.42 | (0.249, 0.541) | 1040 | 43.1 | 38.7 | 14.4 |
| Light-emitting element 3 | 3.50 | 5.02 | (0.276, 0.644) | 1130 | 22.5 | 20.2 | 6.67 |
| Comparative light-emitting element 4 | 3.30 | 2.78 | (0.342, 0.592) | 1000 | 36.0 | 34.2 | 10.7 |
| Comparative light-emitting element 5 | 6.00 | 32.4 | (0.212, 0.658) | 991 | 3.1 | 1.6 | 0.9 |

As shown in FIG. 16, the electroluminescence spectra of the light-emitting elements 1 and 3 and the comparative light-emitting element 5 each have a peak wavelength of 509 nm. This indicates that the light-emitting elements 1 and 3 and the comparative light-emitting element 5 emits green light derived from the fluorescent compound coumarin 545T. Thus, the light-emitting elements 1 and 3 of one embodiment of the present invention each have the electroluminescence spectrum with a peak at a short wavelength and a small full width at half maximum and can emit light with high color purity as compared to the comparative light-emitting elements 2 and 4. Accordingly, the light-emitting elements of one embodiment of the present invention are suitable for display devices.

As shown in FIG. 13, FIG. 15, and Table 2, the light-emitting elements 1 and 3 have high emission efficiency (current efficiency, power efficiency, and external quantum efficiency). Since the maximum generation probability of singlet excitons by recombination of carriers (holes and electrons) injected from a pair of electrodes is 25%, the maximum external quantum efficiency based on the assumption that the light extraction efficiency is 25% would be 6.25%. Although the light-emitting elements 1 and 3 are each a fluorescent light-emitting element, the external quantum efficiency thereof is higher than 6.25%. This is because, in the light-emitting elements 1 and 3 of one embodiment of the present invention, not only singlet excitons but also triplet excitons can contribute to fluorescence by a heavy-atom effect produced by the phosphorescent compound $Ir(ppz)_3$ and reverse intersystem crossing caused by a TADF material.

The emission efficiency of the light-emitting elements 1 and 3 is higher than that of the comparative light-emitting element 5. As described above, the comparative light-emitting element 5 contains CBP, which is not a TADF material, in the light-emitting layer 130; thus, the comparative light-emitting element 5 does not have a function of converting triplet excitons into singlet excitons, which is made possible through reverse intersystem crossing caused by a TADF material. By contrast, the light-emitting elements 1 and 3 of one embodiment of the present invention contain a TADF material in the light-emitting layers 130; thus, triplet excitons can be converted into singlet excitons by reverse intersystem crossing in the light-emitting elements 1 and 3. Accordingly, the light-emitting elements 1 and 3 can have high emission efficiency.

<Time-Resolved Emission Measurement>

Next, time-resolved emission measurement was performed on the light-emitting elements 1 and 3 and the comparative light-emitting elements 2 and 4.

Figure 17:
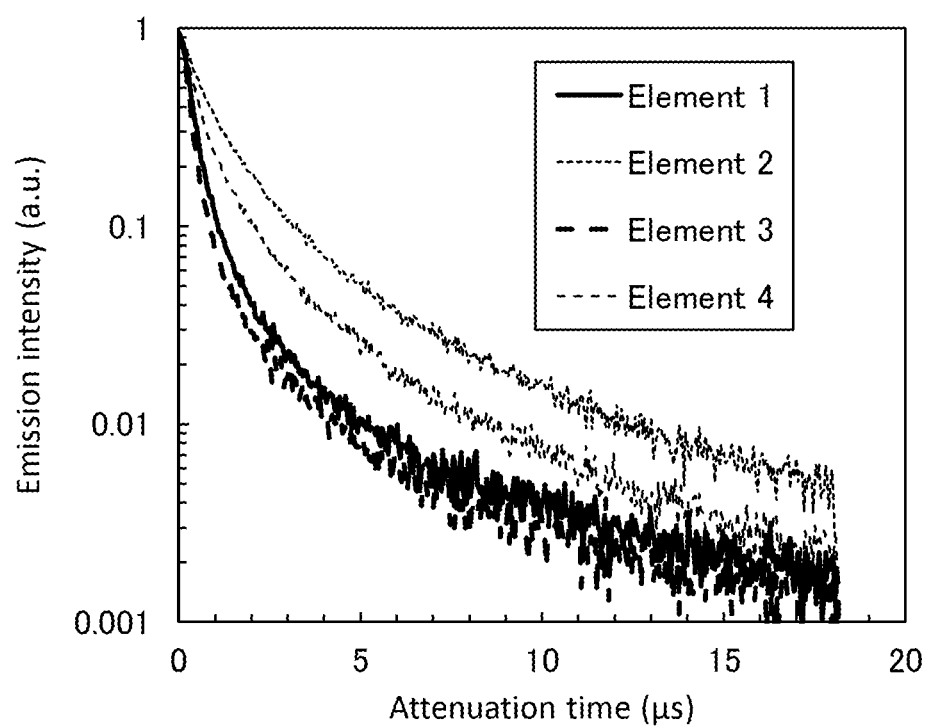
FIG. 17 shows results of time-resolved emission measurement in Example.

A picosecond fluorescence lifetime measurement system (manufactured by Hamamatsu Photonics K.K.) was used for the measurement. For measurement of fluorescence lifetimes of the light-emitting elements, a square wave pulse voltage was applied to the light-emitting elements, and time-resolved measurement of light, which was attenuated from the falling of the voltage, was performed with a streak camera. The pulse voltage was applied at a frequency of 10 Hz. By integrating data obtained by repeated measurements, data with a high SN ratio was obtained. The measurement was performed at room temperature (300 K) under the following conditions: a pulse voltage of around 3 V to 4 V was applied so that the luminance of the light-emitting elements became close to 1000 $cd/m^2$, the pulse time width was 100 μsec, a negative bias voltage was −5 V (at the time when the elements were not driven), and the measurement time was 20 μsec. FIG. 17 shows the measurement results.

Note that in FIG. 17, the vertical axis represents the emission intensity normalized to that in a state where carriers are steadily injected (i.e., the pulse voltage is applied), and the horizontal axis represents time elapsed after the falling of the pulse voltage.

As shown in FIG. 17, the attenuation rate of light emitted from the light-emitting elements 1 and 3 is higher than that of light emitted from the comparative light-emitting elements 2 and 4. This means, in the light-emitting elements 1 and 3, that the excitation energy is rapidly converted into light emission and thus emitted light can be extracted efficiently even when the density of excitons is high (a large amount of current flows) in the light-emitting layers. For that reason, the light-emitting elements 1 and 3 show small roll-offs as shown in FIG. 13 and FIG. 15. The external quantum efficiency of the light-emitting element 1, the comparative light-emitting element 2, the light-emitting element 3, and the comparative light-emitting element 4 at around 15000 $cd/m^2$ in the high-luminance region are 8.0%, 7.3%, 4.8%, and 4.2%, respectively. That is, the light-emitting element 1 has higher efficiency than the comparative light-emitting element 2, and the light-emitting element 3 has higher efficiency than the comparative light-emitting element 4. Such small roll-off is one of the features of the light-emitting element of one embodiment of the present invention.

<CV Measurement Results>

Then, the electrochemical characteristics (oxidation reaction characteristics and reduction reaction characteristics) of the materials used for the light-emitting layers of the light-emitting elements were measured by cyclic voltammetry (CV) measurement. Note that for the measurement, an electrochemical analyzer (ALS 600A or 600C, produced by BAS Inc.) was used, and the measurement was performed on a solution obtained by dissolving each material in N,N-dimethylformamide (abbreviation: DMF). In the measurement, the potential of a working electrode with respect to a reference electrode was changed within an appropriate range, so that the oxidation peak potential and the reduction peak potential were obtained. In addition, the HOMO and LUMO levels of each compound were calculated from the estimated redox potential (−4.94 eV) of the reference electrode and the obtained peak potentials.

The HOMO level and the LUMO level of $Ir(ppz)_3$ calculated from the CV measurement results were −5.39 eV and −1.77 eV, respectively. The HOMO level and the LUMO level of 4PCCzBfpm were −5.70 eV and −2.84 eV, respectively. The HOMO level and the LUMO level of 4PCCzPBfpm were −5.64 eV and −3.01 eV, respectively.

As described above, the LUMO levels of 4PCCzBfpm and 4PCCzPBfpm are lower than the LUMO level of $Ir(ppz)_3$, and the HOMO level of $Ir(ppz)_3$ is higher than the HOMO levels of 4PCCzBfpm and 4PCCzPBfpm. Thus, when these compounds are used for a light-emitting layer as in the light-emitting elements 1 and 3, electrons and holes serving as carriers are efficiently injected from a pair of electrodes into 4PCCzBfpm or 4PCCzPBfpm and $Ir(ppz)_3$; thus, 4PCCzBfpm or 4PCCzPBfpm and $Ir(ppz)_3$ can form an exciplex. Hence, the light-emitting elements 1 and 3 are each a light-emitting element utilizing ExEF.

The exciplex formed by 4PCCzBfpm and $Ir(ppz)_3$ has the LUMO level in 4PCCzBfpm and the HOMO level in $Ir(ppz)_3$. The energy difference between the LUMO level of 4PCCzBfpm and the HOMO level of $Ir(ppz)_3$ is 2.55 eV. This value is substantially equal to light emission energy (2.42 eV) calculated from the peak wavelength of the emission spectrum of the comparative light-emitting element 2 in FIG. 16. This implies that the emission spectrum of the comparative light-emitting element 2 corresponds to light emission due to the exciplex formed by 4PCCzBfpm and Ir(ppz)$_3$. In the exciplex, the difference between the S1 level and the T1 level is small; thus, the light emission energy can be regarded as the energy (2.42 eV) of each of the S1 level and the T1 level of the exciplex.

Similarly, the exciplex formed by 4PCCzPBfpm and Ir(ppz)$_3$ has the LUMO level in 4PCCzPBfpm and the HOMO level in Ir(ppz)$_3$. The energy difference between the LUMO level of 4PCCzPBfpm and the HOMO level of Ir(ppz)$_3$ is 2.38 eV. This value is substantially equal to light emission energy (2.30 eV) calculated from the peak wavelength of the emission spectrum of the comparative light-emitting element 4 in FIG. 16. This implies that the emission spectrum of the comparative light-emitting element 4 corresponds to light emission due to the exciplex formed by 4PCCzPBfpm and Ir(ppz)$_3$. In the exciplex, the difference between the S1 level and the T1 level is small; thus, the light emission energy can be regarded as the energy (2.30 eV) of each of the S1 level and the T1 level of the exciplex.

<Relationship Between Emission Spectrum of Exciplex and Absorption Spectrum of Guest Material>

Figure 18:
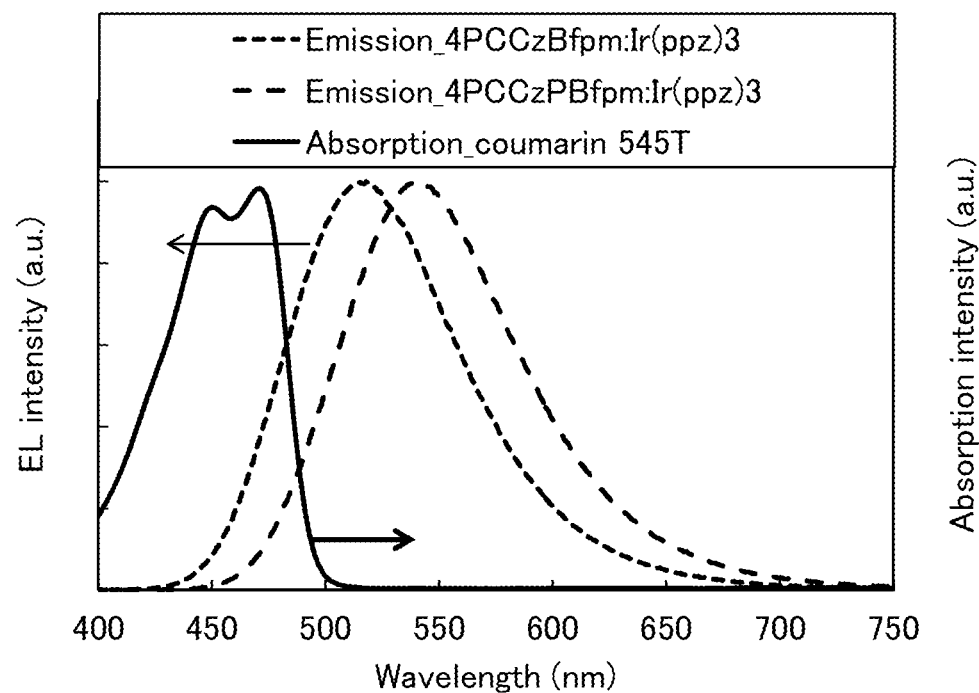
FIG. 18 shows a relationship between an emission spectrum and an absorption spectrum in Example.

FIG. 18 shows the measurement results of the absorption spectrum of a toluene solution of coumarin 545T, and the emission spectra of the exciplexes in the comparative light-emitting elements 2 and 4. Note that the absorption spectrum was measured with an ultraviolet-visible spectrophotometer (V-550, produced by JASCO Corporation) at room temperature (in an atmosphere kept at 23° C.).

As shown in FIG. 18, the absorption spectrum of coumarin 545T and the emission spectra of the exciplexes in the comparative light-emitting elements 2 and 4 partly overlap with each other. Thus, the excitation energy can be efficiently supplied from the exciplex formed by 4PCCzBfpm and Ir(ppz)$_3$ and the exciplex formed by 4PCCzPBfpm and Ir(ppz)$_3$ to the fluorescent compound coumarin 545T. Accordingly, a light-emitting element that emits light with a peak wavelength shorter than that of the electroluminescence spectrum of the exciplex, like the light-emitting elements 1 and 3 having the electroluminescence spectra shown in FIG. 16, can be provided.

<Measurement of T1 Level>

Next, the T1 levels of 4PCCzBfpm and 4PCCzPBfpm were measured. The measurement method will be described later. As a result, the T1 levels of 4PCCzBfpm and 4PCCzPBfpm were 2.58 eV and 2.46 eV, respectively.

Moreover, for estimation of the T1 level of Ir(ppz)$_3$, an absorption spectrum and an emission spectrum were measured. A dichloromethane solution in which Ir(ppz)$_3$ was dissolved was prepared, and the absorption spectrum was measured using a quartz cell. The absorption spectrum was measured with an ultraviolet-visible spectrophotometer (V-550, produced by JASCO Corporation). The absorption spectra of the quartz cell and the solvent were subtracted from the measured spectrum of the sample. The measurement was performed at room temperature (in an atmosphere kept at 23° C.).

The absorption edge was calculated from the data of the aforementioned absorption spectrum, and the transition energy was estimated on the assumption of direct transition. As a result, the transition energy of Ir(ppz)$_3$ was calculated to be 3.27 eV. Since Ir(ppz)$_3$ is a phosphorescent compound, the absorption edge on the lowest energy side is an absorption band based on the transition from the triplet excited state. Therefore, from the absorption edge, the T1 level of Ir(ppz)$_3$ was calculated to be 3.27 eV.

The above measurement results demonstrate that the T1 level of 4PCCzBfpm (2.58 eV) and the T1 level of 4PCCzPBfpm (2.46 eV) are lower than that of Ir(ppz)$_3$ (3.27 eV), and the T1 level of 4PCCzBfpm (2.58 eV) and the T1 level of 4PCCzPBfpm (2.46 eV) are higher than that of the exciplex (2.42 eV) formed by 4PCCzBfpm and Ir(ppz)$_3$ and that of the exciplex (2.30 eV) formed by 4PCCzPBfpm and Ir(ppz)$_3$. Thus, the triplet excitation energy of the exciplex formed by 4PCCzBfpm and Ir(ppz)$_3$ is not deactivated by 4PCCzBfpm or Ir(ppz)$_3$, and the triplet excitation energy of the exciplex formed by 4PCCzPBfpm and Ir(ppz)$_3$ is not deactivated by 4PCCzPBfpm or Ir(ppz)$_3$. Consequently, the triplet excitation energy of each of the exciplexes can be converted into light emission, converted into the singlet excitation energy by reverse intersystem crossing, or transferred to the fluorescent compound.

In addition, when the emission spectrum of Ir(ppz)$_3$ was measured at room temperature, light emitted from Ir(ppz)$_3$ was not observed. Non-Patent Document 1 discloses that the emission quantum yield of Ir(ppz)$_3$ is lower than 1% at room temperature. This indicates that Ir(ppz)$_3$ is a material that does not emit light at room temperature. Thus, even in the case of using a compound with a low emission quantum yield lower than 1%, a light-emitting element with high emission efficiency can be obtained.

<Transient Fluorescent Characteristics of Host Material>

Here, transient fluorescent characteristics of 4PCCzBfpm and 4PCCzPBfpm, which were used for the light-emitting element 1 and the light-emitting element 3, respectively, were examined by time-resolved emission measurement to determine whether 4PCCzBfpm and 4PCCzPBfpm are TADF materials.

The time-resolved emission measurement was performed on a thin-film sample formed over a quartz substrate by co-evaporation of bis[2-(diphenylphosphino)phenyl] etheroxide (abbreviation: DPEPO) and 4PCCzBfpm to a thickness of 50 nm with a weight ratio of DPEPO to 4PCCzBfpm being 0.8:0.2 and a thin-film sample formed over a quartz substrate by co-evaporation of DPEPO and 4PCCzBfpm to a thickness of 50 nm with a weight ratio of DPEPO to 4PCCzBfpm being 0.8:0.2.

A picosecond fluorescence lifetime measurement system (manufactured by Hamamatsu Photonics K.K.) was used for the measurement. For measurement of fluorescence lifetimes of the thin films, the thin films were irradiated with pulsed laser light, and time-resolved measurement of light, which was attenuated from the laser light irradiation, was performed using a streak camera. A nitrogen gas laser with a wavelength of 337 nm was used as the pulsed laser. The thin films were irradiated with the pulsed laser light with a pulse width of 500 ps at a repetition rate of 10 Hz. By integrating data obtained by repeated measurements, data with a high S/N ratio was obtained. The measurement was performed at room temperature (in an atmosphere kept at 23° C.).

Figure 19A:
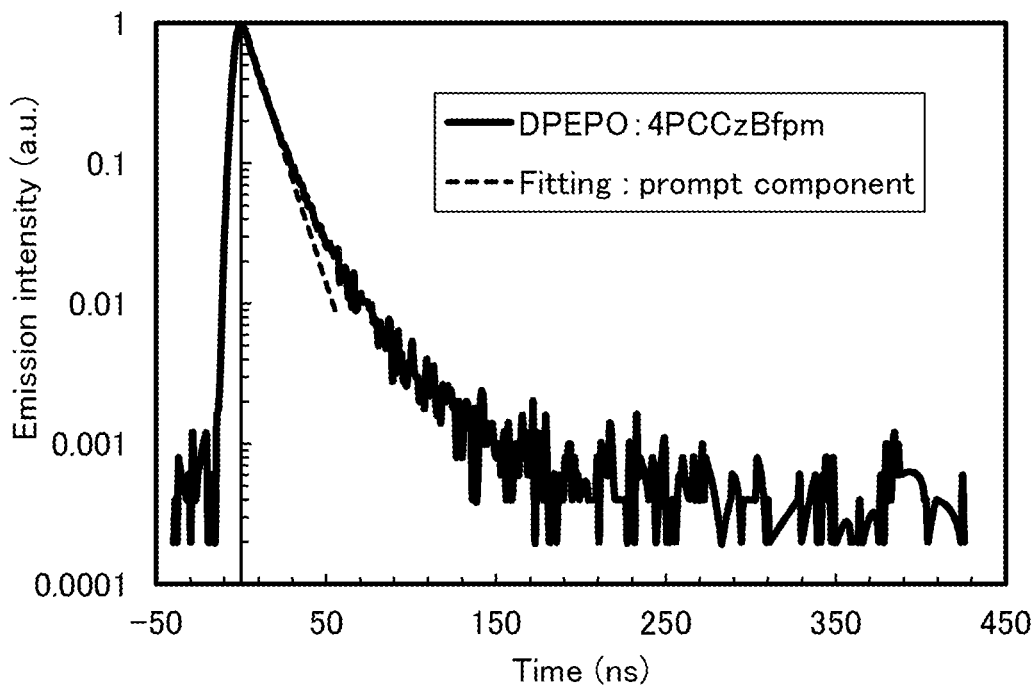
FIGS. 19A and 19B show transient fluorescent characteristics in Example.
Figure 19B:
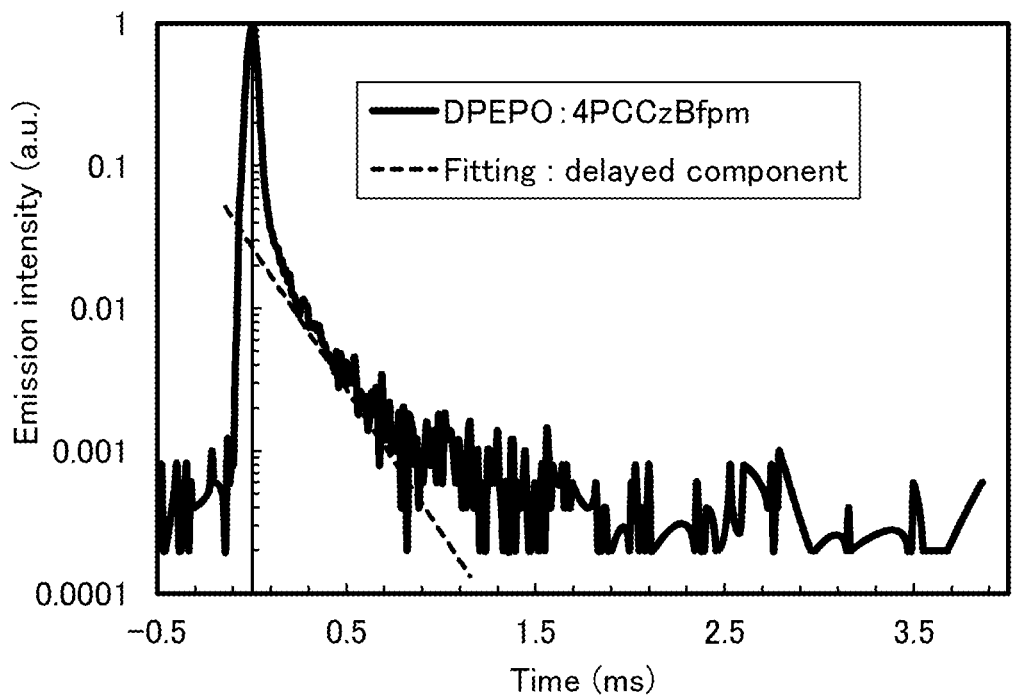

FIGS. 19A and 19B show transient fluorescent characteristics of 4PCCzBfpm obtained by the measurement. Note that FIG. 19A shows measurement results of emission components having a short emission lifetime, and FIG. 19B shows measurement results of emission components having a long emission lifetime. Although not shown, the transient fluorescent characteristics of 4PCCzPBfpm were measured in the same manner as those of 4PCCzBfpm and calculated as follows.

The attenuation curves shown in FIGS. 19A and 19B were fitted with Formula 4.

[Formula 4]

$$L = \sum_{n=1}^{} A_n \exp\left(-\frac{t}{a_n}\right) \quad (4)$$

In Formula 4, L represents normalized emission intensity and t represents elapsed time. The results of the fitting of the attenuation curves show that light emitted from the thin-film samples of 4PCCzBfpm and 4PCCzPBfpm contains a plurality of emission components having different fluorescence lifetimes. The emission components of the thin-film sample of 4PCCzBfpm contain at least a prompt fluorescence component having a fluorescence lifetime of 11.7 ns and a delayed fluorescence component having a lifetime of 217 µs which is the longest, and the emission components of the thin-film sample of 4PCCzPBfpm contain at least a prompt fluorescence component having a fluorescence lifetime of 11.0 ns and a delayed fluorescence component having a lifetime of 301 µs which is the longest. That is, 4PCCzBfpm and 4PCCzPBfpm are thermally activated delayed fluorescent materials exhibiting delayed fluorescence at room temperature.

<Measurements of S1 Level and T1 Level>

In order that reverse intersystem crossing leading to thermally activated delayed fluorescence be efficiently caused, the energy difference between the S1 level and the T1 level is preferably greater than 0 eV and less than or equal to 0.3 eV, further preferably greater than 0 eV and less than or equal to 0.2 eV. Calculations were performed to measure the S1 levels and the T1 levels of 4PCCzBfpm and 4PCCzPBfpm.

Figure 20:
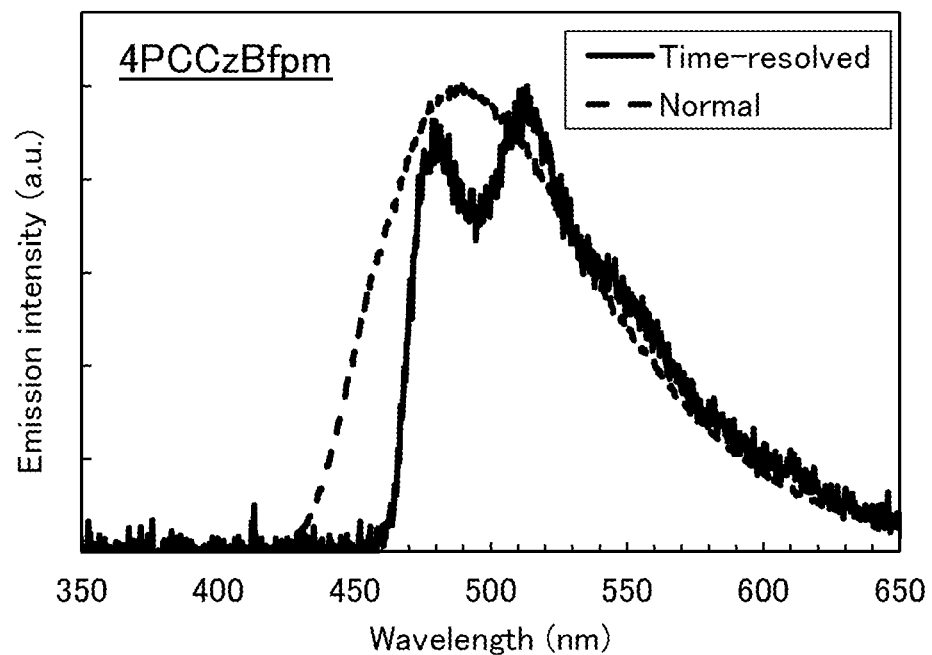
FIG. 20 shows emission spectra of a compound in Example.
Figure 21:
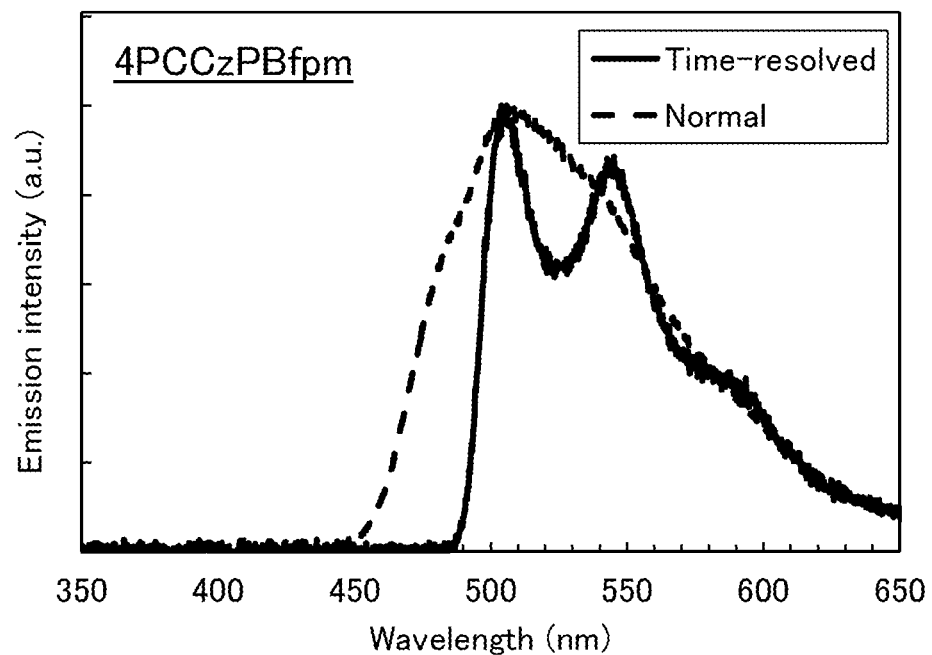
FIG. 21 shows emission spectra of a compound in Example.

Emission spectra of 4PCCzBfpm and 4PCCzPBfpm were measured to calculate the S1 levels and the T1 levels thereof. FIG. 20 shows measurement results of the emission spectrum of 4PCCzBfpm, and FIG. 21 shows the measurement results of the emission spectrum of 4PCCzPBfpm.

The emission spectra were measured at a measurement temperature of 10 K with a PL microscope, LabRAM HR-PL (produced by HORIBA, Ltd.), He—Cd laser light (325 nm) as excitation light, and a CCD detector. For the measurement, a thin film was formed over a quartz substrate to a thickness of 50 nm and another quartz substrate was attached to the deposition surface in a nitrogen atmosphere.

Note that in the measurement of the emission spectra, in addition to the measurement of normal emission spectra, the measurement of time-resolved emission spectra in which light emission with a long lifetime is focused on was also performed. Since the measurement temperature was set at a low temperature (10 K) in the measurement of the emission spectra, phosphorescence was observed in the measurement of the normal emission spectra, in addition to fluorescence that is the main emission component. Furthermore, in the measurement of the time-resolved emission spectra in which light emission with a long lifetime is focused on, phosphorescence was mainly observed.

The measurement results of the emission spectra show that, in the emission spectrum of 4PCCzBfpm, the wavelengths of peaks (including shoulders) of the fluorescence component and the phosphorescence component on the shortest wavelength side were 455 nm and 480 nm, respectively. In the emission spectrum of 4PCCzPBfpm, the wavelengths of peaks (including shoulders) of the fluorescence component and the phosphorescence component on the shortest wavelength side were 480 nm and 505 nm, respectively.

Thus, the S1 level and the T1 level of 4PCCzBfpm, which are calculated from the wavelengths of the peaks (including shoulders), are 2.72 eV and 2.58 eV, respectively, and therefore the energy difference between the S1 level and the T1 level is 0.14 eV. In addition, the S1 level and the T1 level of 4PCCzPBfpm are 2.58 eV and 2.46 eV, respectively, and therefore the energy difference between the S1 level and the T1 level is 0.12 eV.

As can be seen from the measurement results of the emission spectra, in the emission spectrum of 4PCCzBfpm, the wavelengths of the rising portions of the fluorescence component and the phosphorescence component on the shorter wavelength side are 435 nm and 464 nm, respectively. In addition, in the emission spectrum of 4PCCzPBfpm, the wavelengths of the rising portions of the fluorescence component and the phosphorescence component on the shorter wavelength side are 458 nm and 491 nm, respectively. Note that the wavelength of the rising portion on the shorter wavelength side of the emission spectrum is a wavelength at the intersection of the horizontal axis and a tangent to the spectrum at a point where the slope of the tangent has a maximum value.

The S1 level and the T1 level of 4PCCzBfpm, which are thus calculated from the wavelengths of the rising portions, are 2.85 eV and 2.67 eV, respectively, and therefore the energy difference between the S1 level and the T1 level is 0.18 eV. In addition, the S1 level and the T1 level of 4PCCzPBfpm are 2.71 eV and 2.53 eV, respectively, and therefore the energy difference between the S1 level and the T1 level is 0.18 eV.

As described above, the energy difference between the S1 level and the T1 level of each of 4PCCzPBfpm and 4PCCzBfpm is greater than 0 eV and less than or equal to 0.2 eV, which is extremely small, when calculated either from the wavelengths of the peaks (including shoulders) on the shortest wavelength sides of the emission spectra or from the wavelengths of the rising portions on the shorter wavelength sides of the emission spectra. Therefore, 4PCCzPBfpm and 4PCCzBfpm each have a function of converting triplet excitation energy into singlet excitation energy by reverse intersystem crossing and a function of exhibiting thermally activated delayed fluorescence.

<Reliability of Light-Emitting Elements>

Figure 22:
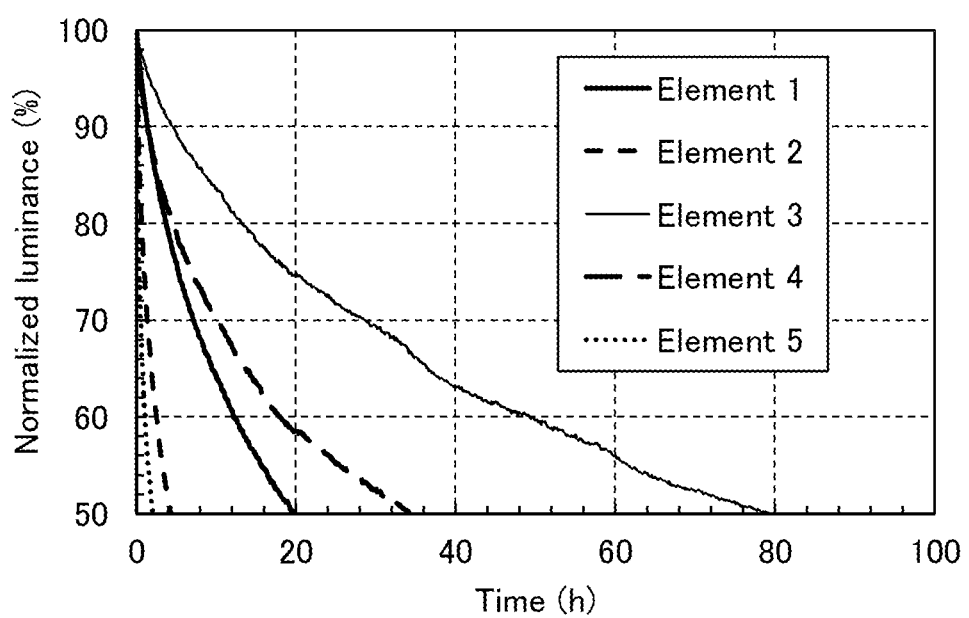
FIG. 22 shows reliability test results of light-emitting elements in Example.

FIG. 22 shows the results of driving tests at a constant current of 0.5 mA that were performed on the light-emitting elements 1 and 3 and the comparative light-emitting elements 2, 4, and 5. As shown in FIG. 22, the light-emitting element 1 has higher reliability than the comparative light-emitting element 2, and the light-emitting element 3 has higher reliability than the comparative light-emitting element 4. The difference between the light-emitting element 1 and the comparative light-emitting element 2 and the difference between the light-emitting element 3 and the comparative light-emitting element 4 are whether the fluorescent compound is contained. As described above, light from the fluorescent compound was obtained in the light-emitting elements 1 and 3, and light from the exciplex was obtained in the comparative light-emitting elements 2 and 4. This demonstrates that the reliability is improved when light emission is obtained from the fluorescent compound as in the light-emitting elements of one embodiment of the present invention. Furthermore, the light-emitting elements 1 and 3 have higher reliability than the comparative light-emitting element 5. This indicates that the use of a host material having a TADF property makes it possible to obtain a light-emitting element having high reliability.

Example 2

In this example, fabrication examples of a light-emitting element of one embodiment of the present invention and comparative light-emitting elements will be described. The structure of each of the light-emitting elements fabricated in this example is the same as that illustrated in FIG. 1A. Table 3 shows the details of the element structures. The structures and abbreviations of compounds used here are shown below. Note that refer to Example 1 and the above embodiment for the structures and abbreviations of the other compounds.

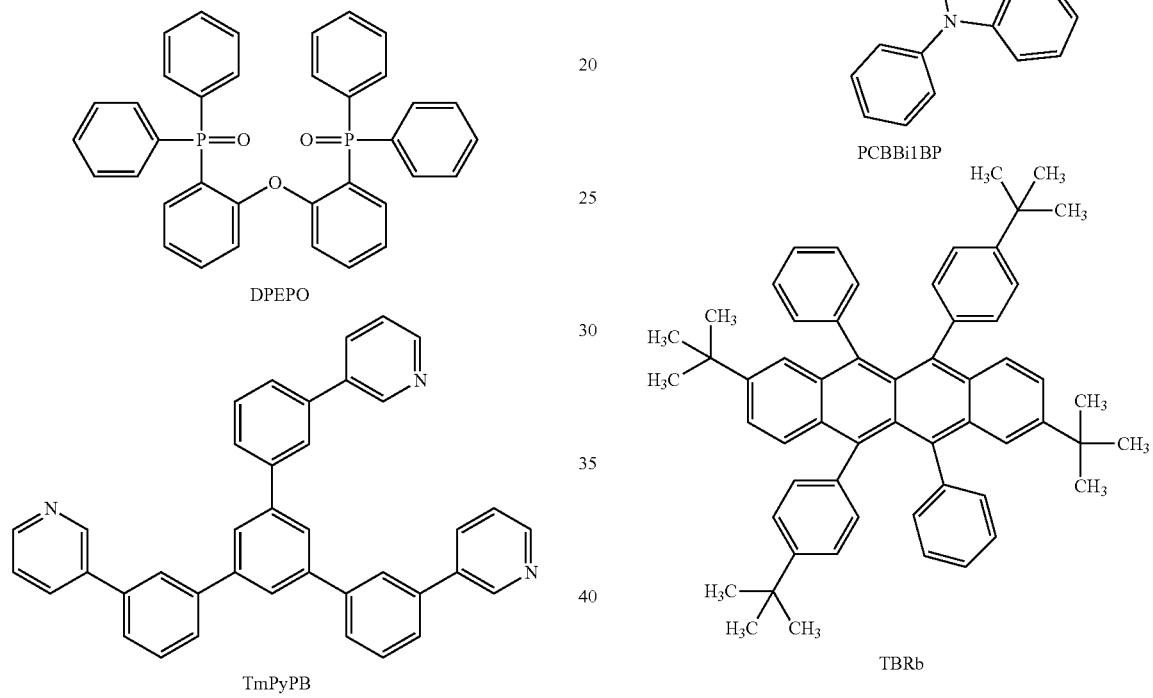

DPEPO

TmPyPB

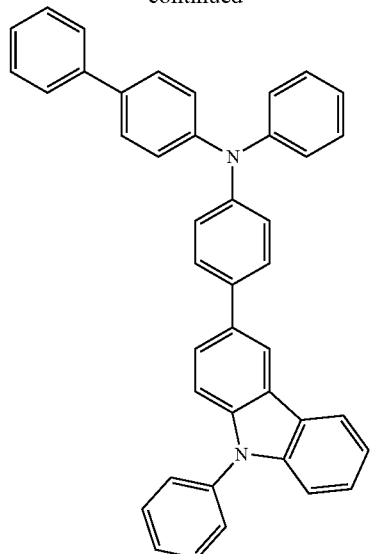

PCBBi1BP

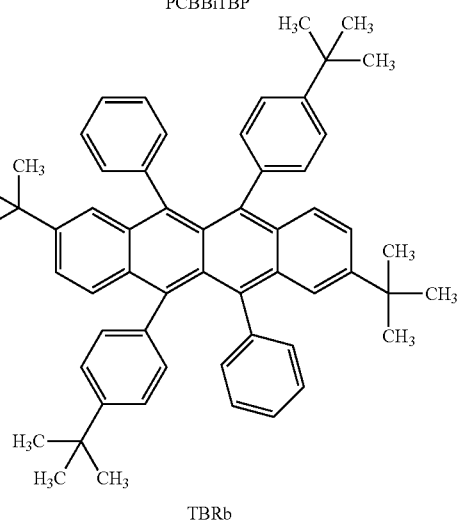

TBRb

TABLE 3

| | Layer | Reference numeral | Thickness (nm) | Material | Weight ratio |
|---|---|---|---|---|---|
| Light-emitting element 6 | Electrode | 102 | 200 | Al | — |
| | Electron-injection layer | 119 | 1 | LiF | — |
| | Electron-transport layer | 118 (2) | 10 | NBPhen | — |
| | | 118 (1) | 20 | 4,6mCzP2Pm | — |
| | Light-emitting layer | 130 | 40 | 4PCCzBfpm:GD270:TBRb | 0.8:0.2:0.01 |
| | Hole-transport layer | 112 | 20 | PCBBi1BP | — |
| | Hole-injection layer | 111 | 45 | DBT3P-II:MoO$_3$ | 1:0.5 |
| | Anode | 101 | 70 | ITSO | — |
| Comparative light-emitting element 7 | Electrode | 102 | 200 | Al | — |
| | Electron-injection layer | 119 | 1 | LiF | — |
| | Electron-transport layer | 118 (2) | 10 | NBPhen | — |
| | | 118 (1) | 20 | 4,6mCzP2Pm | — |
| | Light-emitting layer | 130 | 40 | 4PCCzBfpm:GD270 | 0.8:0.2 |
| | Hole-transport layer | 112 | 20 | PCBBi1BP | — |
| | Hole-injection layer | 111 | 45 | DBT3P-II:MoO$_3$ | 1:0.5 |
| | Anode | 101 | 70 | ITSO | — |

TABLE 3-continued

|  | Layer | Reference numeral | Thickness (nm) | Material | Weight ratio |
|---|---|---|---|---|---|
| Comparative light-emitting element 8 | Electrode | 102 | 200 | Al | — |
|  | Electron-injection layer | 119 | 1 | LiF | — |
|  |  | 118 (2) | 15 | NBPhen | — |
|  | Electron-transport layer | 118 (1) | 10 | BCP | — |
|  | Light-emitting layer | 130 | 30 | CBP:GD270:TBRb | 0.8:0.2:0.01 |
|  | Hole-transport layer | 112 | 20 | mCzFLP | — |
|  | Hole-injection layer | 111 | 45 | DBT3P-II:MoO$_3$ | 1:0.5 |
|  | Anode | 101 | 70 | ITSO | — |
| Comparative light-emitting element 9 | Electrode | 102 | 200 | Al | — |
|  | Electron-injection layer | 119 | 1 | LiF | — |
|  |  | 118 (2) | 20 | TmPyPB | — |
|  | Electron-transport layer | 118 (1) | 5 | DPEPO | — |
|  | Light-emitting layer | 130 | 30 | DPEPO:4PCCzBfpm:TBRb | 0.8:0.2:0.01 |
|  | Hole-transport layer | 112 | 20 | mCzFLP | — |
|  | Hole-injection layer | 111 | 45 | DBT3P-II:MoO$_3$ | 1:0.5 |
|  | Anode | 101 | 70 | ITSO | — |

<Fabrication of Light-Emitting Elements>

Fabrication methods of the light-emitting elements in this example will be described below.

<<Fabrication of Light-Emitting Element 6>>

As the electrode 101, an ITSO film was formed to a thickness of 70 nm over a glass substrate. Note that the electrode area of the electrode 101 was set to 4 mm$^2$ (2 mm×2 mm).

Next, as the hole-injection layer 111, DBT3P-II and molybdenum oxide (MoO$_3$) were deposited by co-evaporation over the electrode 101 to a thickness of 45 nm with a weight ratio of DBT3P-II to MoO$_3$ being 1:0.5.

Then, as the hole-transport layer 112, PCBBi1BP was deposited by evaporation over the hole-injection layer 111 to a thickness of 20 nm.

Next, as the light-emitting layer 130, 4PCCzBfpm, GD270 (manufactured by Jilin Optical and Electronic Materials Co., Ltd.), and 2,8-di-tert-butyl-5,11-bis(4-tert-butylphenyl)-6,12-diphenyltetracene (abbreviation: TBRb) were deposited by co-evaporation over the hole-transport layer 112 to a thickness of 40 nm with a weight ratio of 4PCCzBfpm to GD270 and TBRb being 0.8:0.2:0.01. In the light-emitting layer 130, GD270 is a phosphorescent compound and TBRb is a fluorescent compound.

Subsequently, as the electron-transport layer 118, 4,6mCzP2Pm and NBPhen were sequentially deposited by evaporation over the light-emitting layer 130 to thicknesses of 20 nm and 10 nm, respectively. Then, as the electron-injection layer 119, LiF was deposited by evaporation over the electron-transport layer 118 to a thickness of 1 nm.

Next, as the electrode 102, aluminum (Al) was deposited over the electron-injection layer 119 to a thickness of 200 nm.

Then, in a glove box containing a nitrogen atmosphere, the light-emitting element 6 was sealed by fixing a glass substrate for sealing to the glass substrate over which the organic materials were deposited using a sealant for organic EL. Specifically, after the sealant was applied to surround the organic materials over the glass substrate and the glass substrate was bonded to the glass substrate for sealing, irradiation with ultraviolet light having a wavelength of 365 nm at 6 J/cm$^2$ and heat treatment at 80° C. for one hour were performed. Through the above steps, the light-emitting element 6 was fabricated.

<<Fabrication of Comparative Light-Emitting Element 7>>

A comparative light-emitting element 7 was fabricated through the same steps as those for the above-described light-emitting element 6 except for the step of forming the light-emitting layer 130.

As the light-emitting layer 130 of the comparative light-emitting element 7, 4PCCzBfpm and GD270 were deposited by co-evaporation to a thickness of 40 nm with a weight ratio of 4PCCzBfpm to GD270 being 0.8:0.2. Unlike in the light-emitting layer 130 of the light-emitting element 6, the fluorescent compound TBRb was not contained in the light-emitting layer 130 of the comparative light-emitting element 7.

<<Fabrication of Comparative Light-Emitting Element 8>>

As the electrode 101, an ITSO film was formed to a thickness of 70 nm over a glass substrate. Note that the electrode area of the electrode 101 was set to 4 mm$^2$ (2 mm×2 mm).

Next, as the hole-injection layer 111, DBT3P-II and molybdenum oxide (MoO$_3$) were deposited by co-evaporation over the electrode 101 to a thickness of 45 nm with a weight ratio of DBT3P-II to MoO$_3$ being 1:0.5.

Then, as the hole-transport layer 112, mCzFLP was deposited by evaporation over the hole-injection layer 111 to a thickness of 20 nm.

Next, as the light-emitting layer 130, CBP, GD270, and TBRb were deposited by co-evaporation over the hole-transport layer 112 to a thickness of 30 nm with a weight ratio of CBP to GD270 and TBRb being 0.8:0.2:0.01. The light-emitting layer 130 of the comparative light-emitting element 8 differs from that of the light-emitting element 6 in the host material. The light-emitting element 6 was fabricated using a TADF material, and the comparative light-emitting element 8 was fabricated using CBP, which is not a TADF material.

Subsequently, as the electron-transport layer 118, bathocuproine (abbreviation: BCP) and NBPhen were sequentially deposited by evaporation over the light-emitting layer 130 to thicknesses of 10 nm and 15 nm, respectively. Then, as the electron-injection layer 119, LiF was deposited by evaporation over the electron-transport layer 118 to a thickness of 1 nm.

Next, as the electrode 102, aluminum (Al) was deposited over the electron-injection layer 119 to a thickness of 200 nm.

Then, in a glove box containing a nitrogen atmosphere, the comparative light-emitting element 8 was sealed by fixing a glass substrate for sealing to the glass substrate over which the organic materials were deposited using a sealant for organic EL. Specifically, after the sealant was applied to surround the organic materials over the glass substrate and the glass substrate was bonded to the glass substrate for sealing, irradiation with ultraviolet light having a wavelength of 365 nm at 6 J/cm$^2$ and heat treatment at 80° C. for one hour were performed. Through the above steps, the comparative light-emitting element 8 was fabricated.

<<Fabrication of Comparative Light-Emitting Element 9>>

A comparative light-emitting element 9 was fabricated through the same steps as those for the above-described comparative light-emitting element 8 except for the steps of forming the light-emitting layer 130 and the electron-transport layer 118.

As the light-emitting layer 130 of the comparative light-emitting element 9, bis[2-(diphenylphosphino)phenyl] etheroxide (abbreviation: DPEPO), 4PCCzBfpm, and TBRb were deposited by co-evaporation to a thickness of 30 nm with a weight ratio of DPEPO to 4PCCzBfpm and TBRb being 0.8:0.2:0.01. Unlike in the light-emitting layer 130 of the light-emitting element 6, the phosphorescent compound was not contained in the light-emitting layer 130 of the comparative light-emitting element 9.

Then, as the electron-transport layer 118, DPEPO and 1,3,5-tri[3-(3-pyridyl)phenyl]benzene (abbreviation: TmPyPB) were sequentially deposited by evaporation over the light-emitting layer 130 to thicknesses of 5 nm and 20 nm, respectively.

<Characteristics of Light-Emitting Elements>

Next, the characteristics of the fabricated light-emitting element 6 and comparative light-emitting elements 7 to 9 were measured. Note that the measurement method is similar to that used in Example 1.

Figure 23:
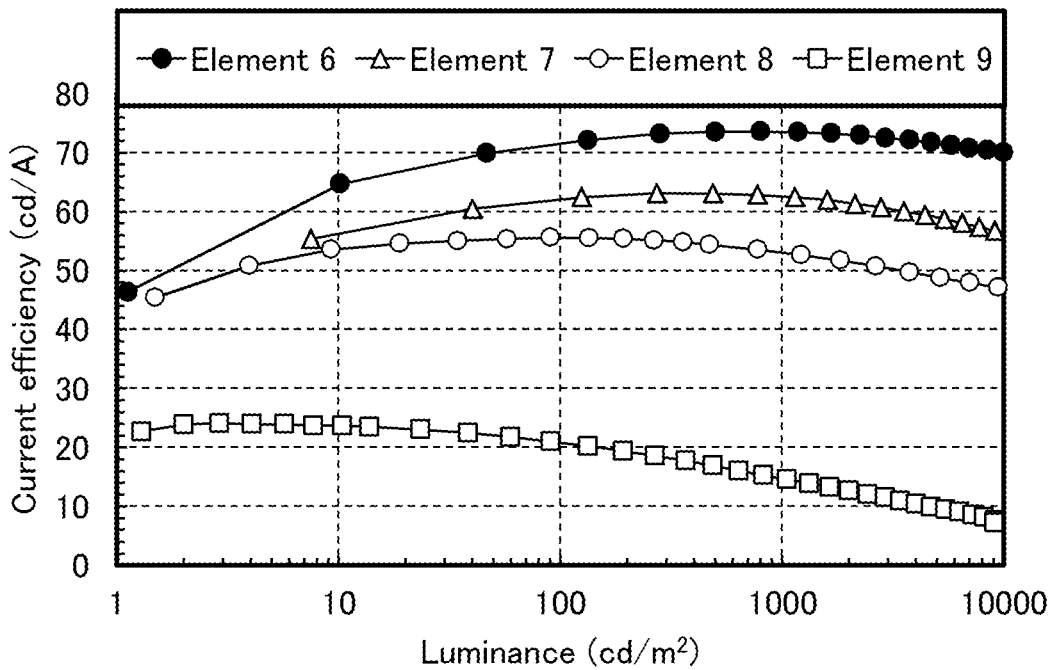
FIG. 23 shows luminance—current efficiency characteristics of light-emitting elements in Example.
Figure 24:
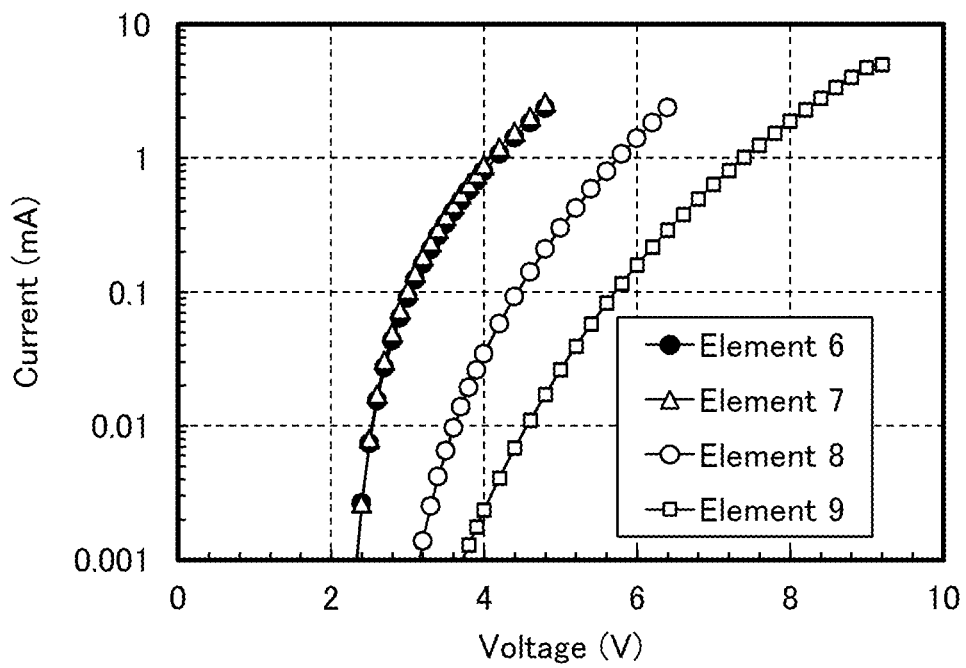
FIG. 24 shows voltage—current characteristics of light-emitting elements in Example.
Figure 25:
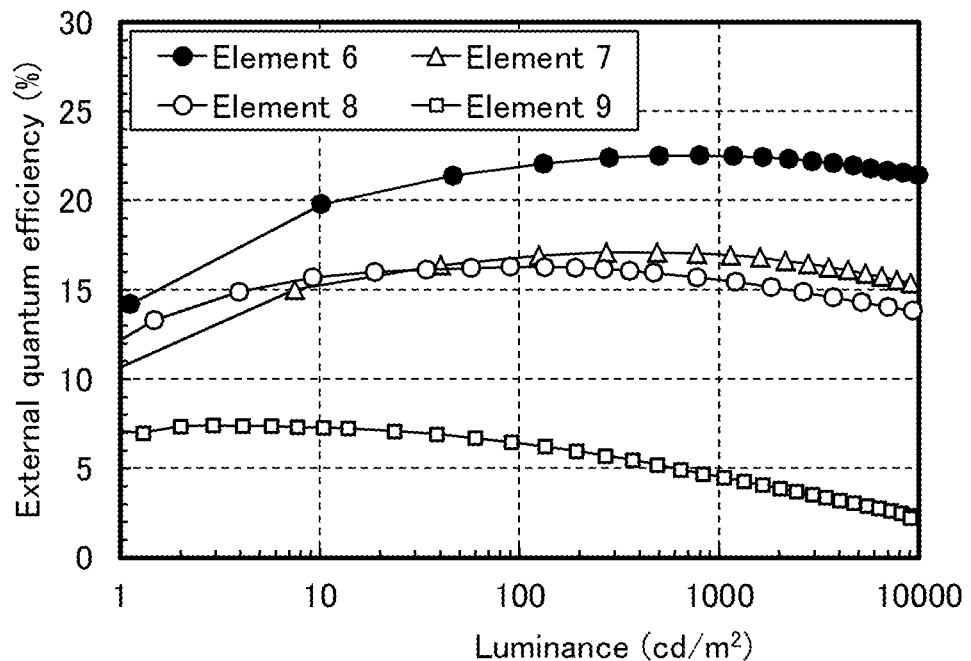
FIG. 25 shows luminance—external quantum efficiency characteristics of light-emitting elements in Example.
Figure 26:
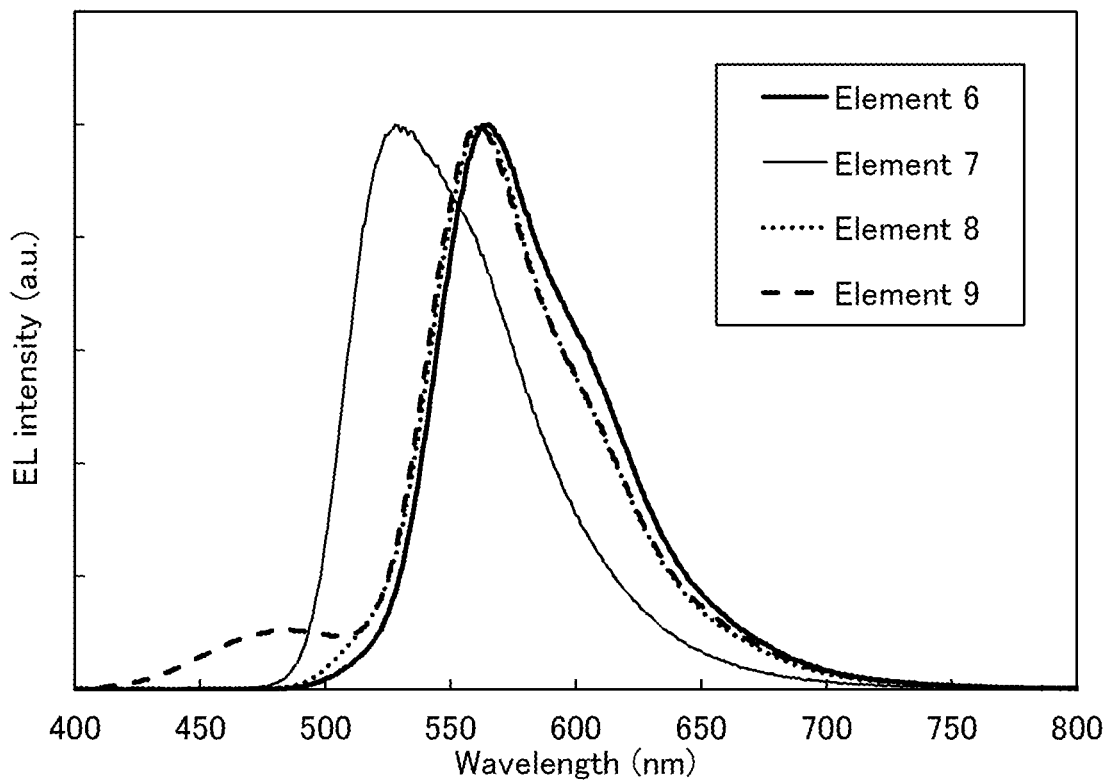
FIG. 26 shows emission spectra of light-emitting elements in Example.

FIG. 23, FIG. 24, and FIG. 25 show luminance—current efficiency characteristics, voltage—current characteristics, and luminance—external quantum efficiency characteristics, respectively, of the light-emitting element 6 and the comparative light-emitting elements 7 to 9. FIG. 26 shows the electroluminescence spectra when current at a current density of 2.5 mA/cm$^2$ was supplied to the light-emitting element 6 and the comparative light-emitting elements 7 to 9. Note that the measurements of the light-emitting elements were performed at room temperature (in an atmosphere kept at 23° C.).

Table 4 shows the element characteristics of the light-emitting element 6 and the comparative light-emitting elements 7 to 9 at around 1000 cd/m$^2$.

and the comparative light-emitting elements 8 and 9 emit yellow light. Therefore, light emitted from the light-emitting element 6 and the comparative light-emitting elements 8 and 9 was derived from the fluorescent compound TBRb. Note that the emission spectrum of the comparative light-emitting element 7 has a peak wavelength of 528 nm and a full width at half maximum of 76 nm. This indicates that the comparative light-emitting element 7 emits green light. Therefore, light emitted from the comparative light-emitting element 7 was derived from GD270. Thus, the light-emitting element 6 of one embodiment of the present invention has the emission spectrum with a small full width at half maximum of the peak wavelength and can emit light with high color purity as compared to the comparative light-emitting element 7. Accordingly, the light-emitting element of one embodiment of the present invention is suitable for a display device.

As shown in FIG. 23, FIG. 25, and Table 4, although the light-emitting element 6 is a fluorescent light-emitting element, the external quantum efficiency thereof is higher than 6.25%, which is the maximum external quantum efficiency of a fluorescent light-emitting element. This is because, in the light-emitting element 6 of one embodiment of the present invention, not only singlet excitons but also triplet excitons can contribute to fluorescence through the phosphorescent compound GD270. Furthermore, as described above, 4PCCzBfpm contained in the light-emitting element 6 is a TADF material; thus, triplet excitons can contribute to fluorescence by reverse intersystem crossing caused by the TADF material, resulting in an increase in emission efficiency.

The emission efficiency of the light-emitting element 6 is higher than that of the comparative light-emitting element 8. As described above, the comparative light-emitting element 8 contains CBP, which is not a TADF material, in the light-emitting layer 130; thus, the comparative light-emitting element 8 does not have a function of converting triplet excitons into singlet excitons, which is made possible through reverse intersystem crossing caused by a TADF material. By contrast, the light-emitting element 6 of one embodiment of the present invention contains a TADF material in the light-emitting layer 130; thus, triplet excitons can be converted into singlet excitons by reverse intersystem

TABLE 4

| | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Light-emitting element 6 | 2.90 | 1.61 | (0.468, 0.526) | 1182 | 73.4 | 79.6 | 22.5 |
| Comparative light-emitting element 7 | 2.90 | 1.83 | (0.338, 0.635) | 1143 | 62.5 | 67.7 | 16.9 |
| Comparative light-emitting element 8 | 4.40 | 2.31 | (0.446, 0.547) | 1218 | 52.7 | 37.6 | 15.4 |
| Comparative light-emitting element 9 | 6.40 | 7.25 | (0.423, 0.507) | 1057 | 14.6 | 7.2 | 4.5 |

As shown in FIG. 26, the emission spectra of the light-emitting element 6 and the comparative light-emitting elements 8 and 9 have peak wavelengths of 565 nm, 562 nm, and 561 nm, respectively, and have full widths at half maximum of approximately 72 nm, 67 nm, and 69 nm, respectively. This indicates that the light-emitting element 6 crossing caused by the TADF material in the light-emitting element 6. Accordingly, the light-emitting element 6 can have higher emission efficiency than the comparative light-emitting element 8.

The emission efficiency of the light-emitting element 6 is higher than that of the comparative light-emitting element 9.

As described above, the comparative light-emitting element 9 contains a TADF material but does not contain a phosphorescent compound in the light-emitting layer 130; thus, triplet excitons cannot contribute to fluorescence through the phosphorescent compound in the comparative light-emitting element 9. By contrast, the light-emitting element 6 of one embodiment of the present invention contains a phosphorescent compound as well as a TADF material in the light-emitting layer 130. This allows, in the light-emitting element 6, triplet excitons to contribute to fluorescence through the phosphorescent compound, in addition to an efficiency increasing effect by reverse intersystem crossing caused by the TADF material. Accordingly, the light-emitting element 6 can have higher emission efficiency than the comparative light-emitting element 9.

<Time-Resolved Emission Measurement>

Figure 27:
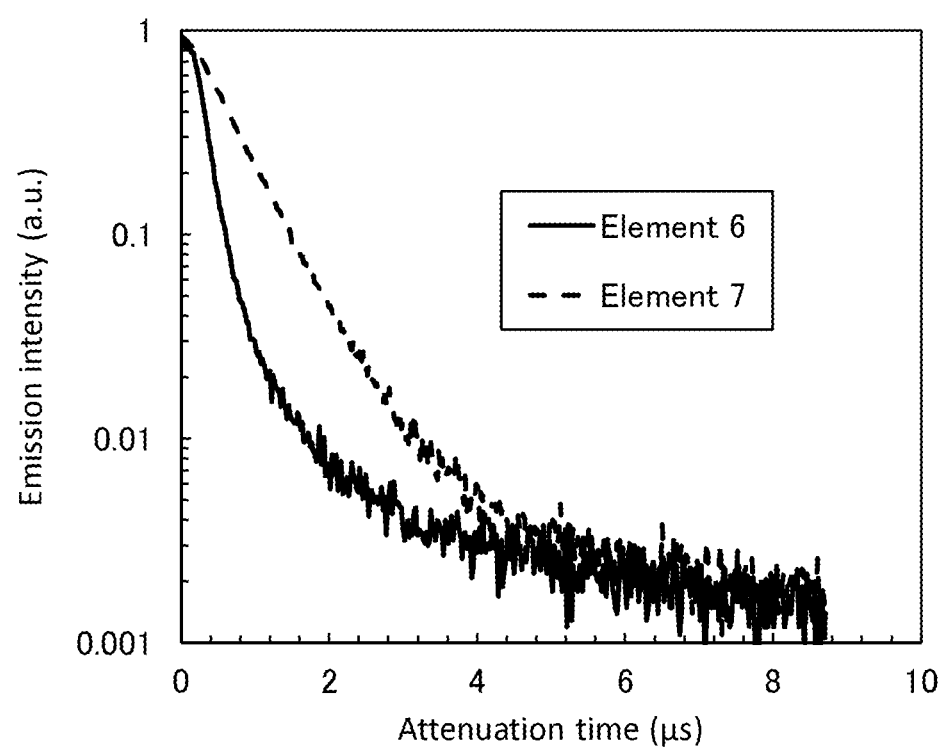
FIG. 27 shows results of time-resolved emission measurement in Example.

Next, time-resolved emission measurement was performed on the light-emitting element 6 and the comparative light-emitting element 7. The results are shown in FIG. 27. The measurement method is similar to that described in Example 1.

As shown in FIG. 27, the attenuation rate of light emitted from the light-emitting element 6 is higher than that of light emitted from the comparative light-emitting element 7. This means, in the light-emitting element 6, that the excitation energy is rapidly converted into light emission and thus emitted light can be extracted efficiently even when the density of excitons is high (a large amount of current flows) in the light-emitting layer. For that reason, the light-emitting element 6 shows a small roll-off as shown in FIG. 23 and FIG. 25. Furthermore, the emission efficiency of the light-emitting element 6 is higher than that of the comparative light-emitting element 7. The light-emitting layer 130 of the light-emitting element 6 has a structure in which the fluorescent compound TBRb is added to the light-emitting layer of the comparative light-emitting element 7. As shown in FIG. 27, the addition of the fluorescent compound increases the attenuation rate of light; thus, the deactivation of the excitons is inhibited. Accordingly, the emission efficiency of the light-emitting element 6 is higher than that of the comparative light-emitting element 7.

<Reliability of Light-Emitting Elements>

Figure 28:
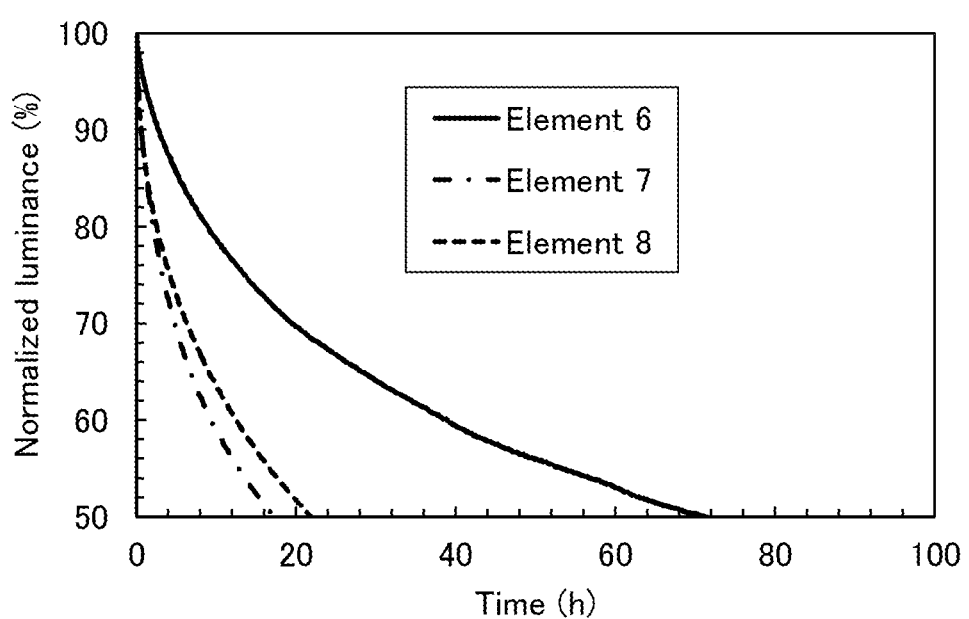
FIG. 28 shows reliability test results of light-emitting elements in Example.

FIG. 28 shows the results of driving tests at a constant current of 2.0 mA that were performed on the light-emitting element 6 and the comparative light-emitting elements 7 and 8. As shown in FIG. 28, the light-emitting element 6 has higher reliability than the comparative light-emitting element 7. The difference between the light-emitting element 6 and the comparative light-emitting element 7 is whether the fluorescent compound is contained. As described above, light from the fluorescent compound was obtained in the light-emitting element 6, and light from the phosphorescent compound was obtained in the comparative light-emitting element 7. This demonstrates that the reliability is improved when light emission is obtained from the fluorescent compound as in the light-emitting element of one embodiment of the present invention. Furthermore, the light-emitting element 6 has higher reliability than the comparative light-emitting element 8. This indicates that the use of a host material having a TADF property makes it possible to obtain a light-emitting element having high reliability.

Example 3

In this example, fabrication examples of a light-emitting element of one embodiment of the present invention and comparative light-emitting elements will be described. The structure of each of the light-emitting elements fabricated in this example is the same as that illustrated in FIG. 1A. Table 5 shows the details of the element structures. The structure and abbreviation of a compound used here are shown below. Note that refer to the above examples and embodiment for the structures and abbreviations of the other compounds.

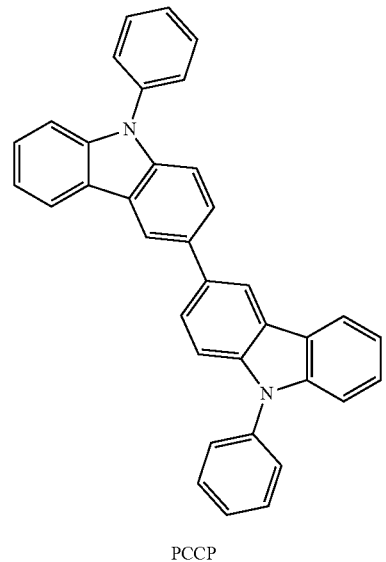 [SMILES: c1ccc(-n2c3ccccc3c3cc(-c4ccc5c(c4)c4ccccc4n5-c4ccccc4)ccc32)cc1 ; "PCCP"]

PCCP

TABLE 5

| Layer | | Reference numeral | Thickness (nm) | Material | Weight ratio |
|---|---|---|---|---|---|
| Light-emitting element 10 | Electrode | 102 | 200 | Al | — |
| | Electron-injection layer | 119 | 1 | LiF | — |
| | Electron-transport layer | 118 (2) | 10 | NBPhen | — |
| | | 118 (1) | 20 | PCCzPTzn | — |
| | Light-emitting layer | 130 | 40 | PCCzPTzn:GD270:TBRb | 0.8:0.2:0.01 |
| | Hole-transport layer | 112 | 20 | PCBBi1BP | — |
| | Hole-injection layer | 111 | 45 | DBT3P-II:MoO$_3$ | 1:0.5 |
| | Anode | 101 | 70 | ITSO | — |
| Comparative light-emitting element 11 | Electrode | 102 | 200 | Al | — |
| | Electron-injection layer | 119 | 1 | LiF | — |
| | Electron-transport layer | 118 (2) | 10 | NBPhen | — |
| | | 118 (1) | 20 | PCCzPTzn | — |
| | Light-emitting layer | 130 | 40 | PCCzPTzn:GD270 | 0.8:0.2 |
| | Hole-transport layer | 112 | 20 | PCBBi1BP | — |

TABLE 5-continued

| | Layer | Reference numeral | Thickness (nm) | Material | Weight ratio |
|---|---|---|---|---|---|
| | Hole-injection layer | 111 | 45 | DBT3P-II:MoO$_3$ | 1:0.5 |
| | Anode | 101 | 70 | ITSO | — |
| Comparative | Electrode | 102 | 200 | Al | — |
| light-emitting | Electron-injection layer | 119 | 1 | LiF | — |
| element 12 | Electron-transport layer | 118 (2) | 10 | NBPhen | — |
| | | 118 (1) | 20 | PCCzPTzn | — |
| | Light-emitting layer | 130 | 30 | PCCzPTzn:TBRb | 1:0.01 |
| | Hole-transport layer | 112 | 20 | PCCP | — |
| | Hole-injection layer | 111 | 45 | DBT3P-II:MoO$_3$ | 1:0.5 |
| | Anode | 101 | 70 | ITSO | — |

<Fabrication of Light-Emitting Elements>

Fabrication methods of the light-emitting elements in this example will be described below.

<<Fabrication of light-emitting element 10>>

As the electrode 101, an ITSO film was formed to a thickness of 70 nm over a glass substrate. Note that the electrode area of the electrode 101 was set to 4 mm$^2$ (2 mm×2 mm).

Next, as the hole-injection layer 111, DBT3P-II and molybdenum oxide (MoO$_3$) were deposited by co-evaporation over the electrode 101 to a thickness of 45 nm with a weight ratio of DBT3P-II to MoO$_3$ being 1:0.5.

Then, as the hole-transport layer 112, PCBBi1BP was deposited by evaporation over the hole-injection layer 111 to a thickness of 20 nm.

Next, as the light-emitting layer 130, PCCzPTzn, GD270 (manufactured by Jilin Optical and Electronic Materials Co., Ltd.), and TBRb were deposited by co-evaporation over the hole-transport layer 112 to a thickness of 40 nm with a weight ratio of PCCzPTzn to GD270 and TBRb being 0.8:0.2:0.01. In the light-emitting layer 130, GD270 is a phosphorescent compound and TBRb is a fluorescent compound.

Subsequently, as the electron-transport layer 118, PCCzPTzn and NBPhen were sequentially deposited by evaporation over the light-emitting layer 130 to thicknesses of 20 nm and 10 nm, respectively. Then, as the electron-injection layer 119, LiF was deposited by evaporation over the electron-transport layer 118 to a thickness of 1 nm.

Next, as the electrode 102, aluminum (Al) was deposited over the electron-injection layer 119 to a thickness of 200 nm.

Then, in a glove box containing a nitrogen atmosphere, the light-emitting element 10 was sealed by fixing a glass substrate for sealing to the glass substrate over which the organic materials were deposited using a sealant for organic EL. Specifically, after the sealant was applied to surround the organic materials over the glass substrate and the glass substrate was bonded to the glass substrate for sealing, irradiation with ultraviolet light having a wavelength of 365 nm at 6 J/cm$^2$ and heat treatment at 80° C. for one hour were performed. Through the above steps, the light-emitting element 10 was fabricated.

<<Fabrication of Comparative Light-Emitting Element 11>>

A comparative light-emitting element 11 was fabricated through the same steps as those for the above-described light-emitting element 10 except for the step of forming the light-emitting layer 130.

As the light-emitting layer 130 of the comparative light-emitting element 11, PCCzPTzn and GD270 were deposited by co-evaporation to a thickness of 40 nm with a weight ratio of PCCzPTzn to GD270 being 0.8:0.2. Unlike in the light-emitting layer 130 of the light-emitting element 10, the fluorescent compound TBRb was not contained in the light-emitting layer 130 of the comparative light-emitting element 11.

<<Fabrication of Comparative Light-Emitting Element 12>>

A comparative light-emitting element 12 was fabricated through the same steps as those for the above-described light-emitting element 10 except for the steps of forming the hole-transport layer 112 and the light-emitting layer 130.

As the hole-transport layer 112 of the comparative light-emitting element 12, PCCP was deposited by evaporation over the hole-injection layer 111 to a thickness of 20 nm.

Then, as the light-emitting layer 130, PCCzPTzn and TBRb were deposited by co-evaporation to a thickness of 30 nm with a weight ratio of PCCzPTzn to TBRb being 1:0.01. Unlike in the light-emitting layer 130 of the light-emitting element 10, the phosphorescent compound GD270 was not contained in the light-emitting layer 130 of the comparative light-emitting element 12.

<Characteristics of Light-Emitting Elements>

Next, the characteristics of the fabricated light-emitting element 10 and comparative light-emitting elements 11 and 12 and the above-described comparative light-emitting element 8 were measured. Note that the measurement method is similar to that used in Example 1.

Figure 29:
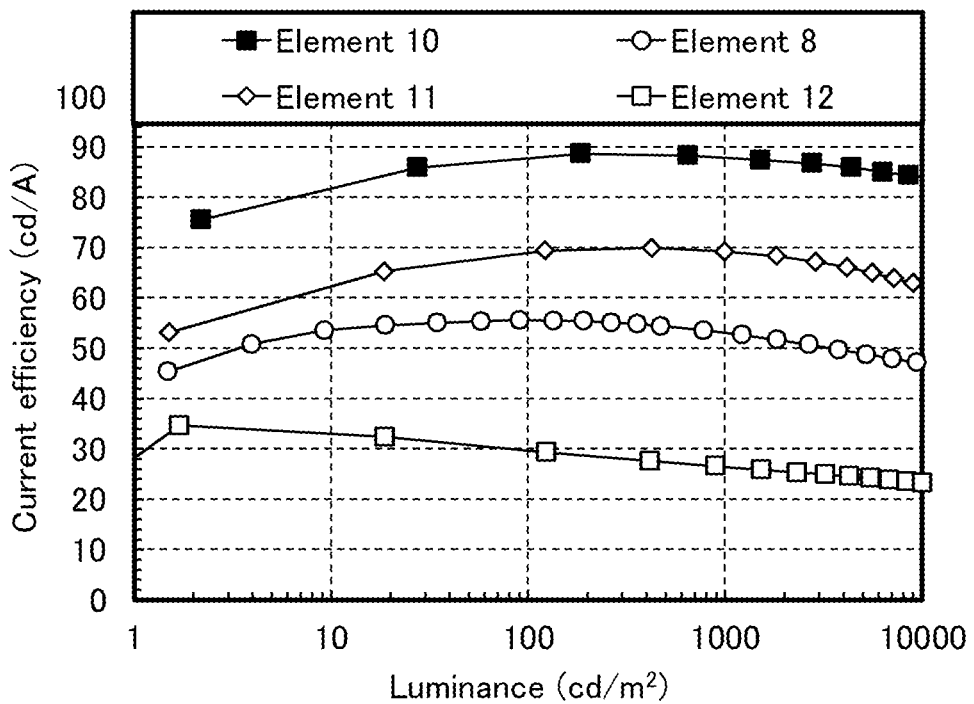
FIG. 29 shows luminance—current efficiency characteristics of light-emitting elements in Example.
Figure 30:
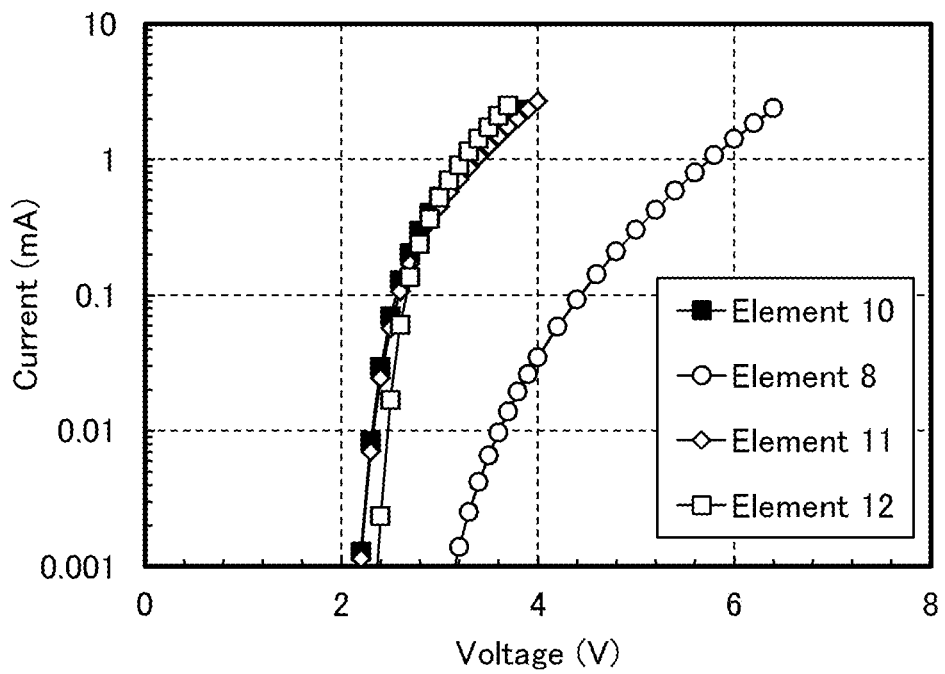
FIG. 30 shows voltage—current characteristics of light-emitting elements in Example.
Figure 31:
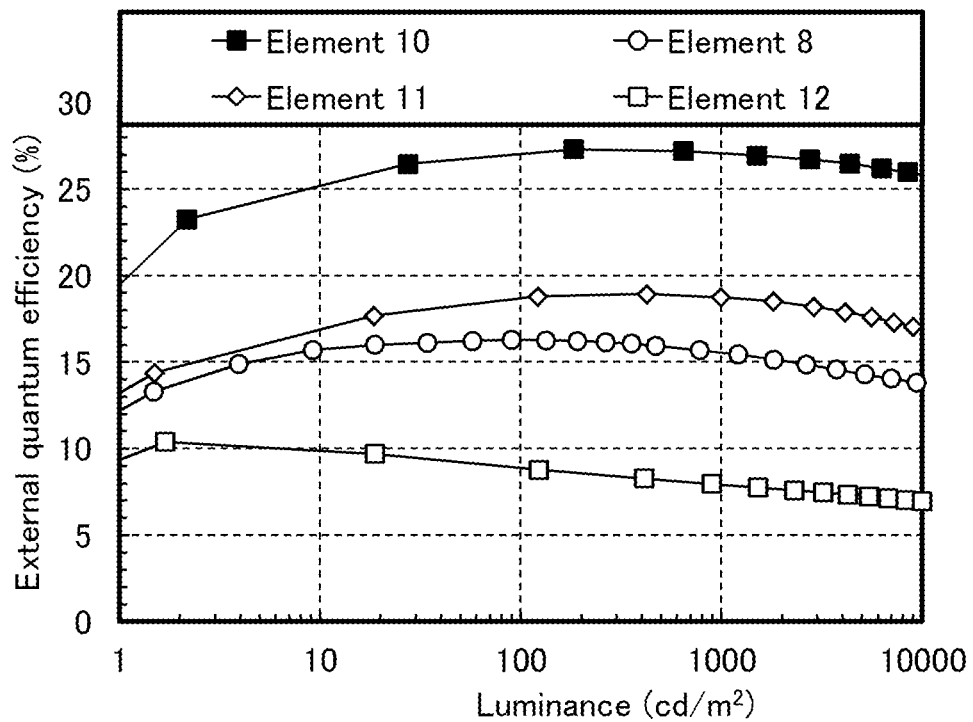
FIG. 31 shows luminance—external quantum efficiency characteristics of light-emitting elements in Example.
Figure 32:
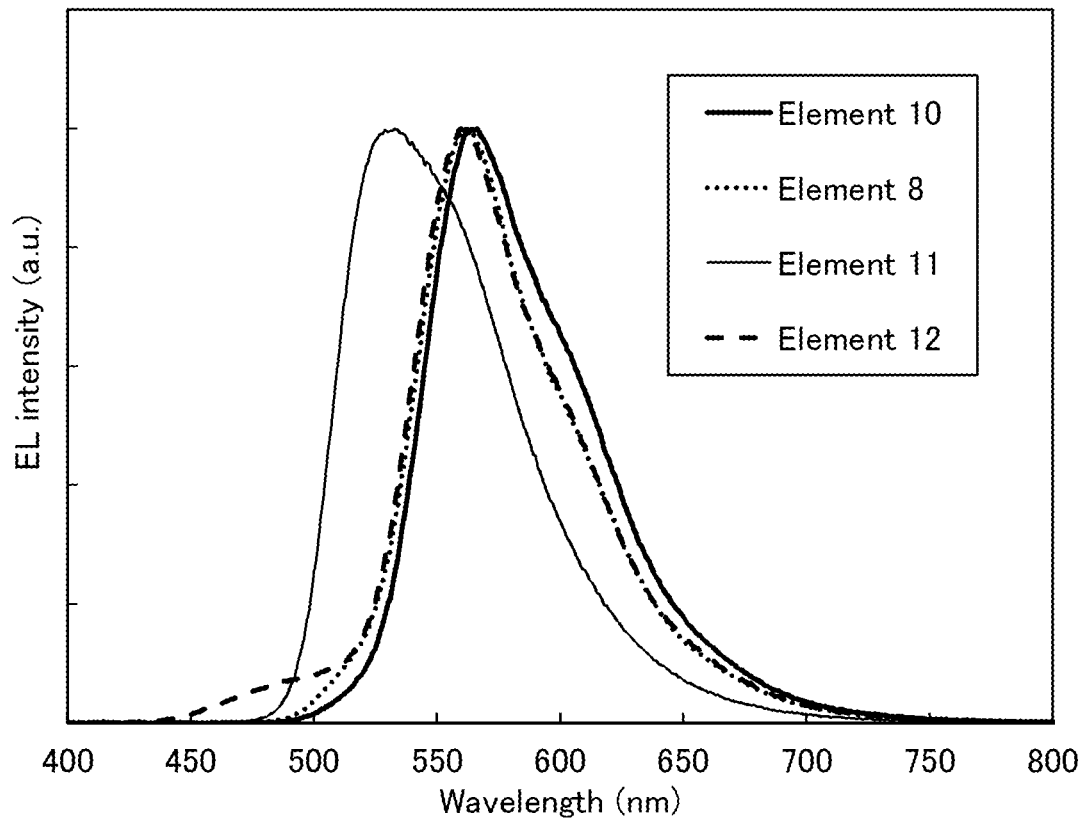
FIG. 32 shows emission spectra of light-emitting elements in Example.

FIG. 29, FIG. 30, and FIG. 31 show luminance—current efficiency characteristics, voltage—current characteristics, and luminance—external quantum efficiency characteristics, respectively, of the light-emitting element 10 and the comparative light-emitting elements 8, 11, and 12. FIG. 32 shows the electroluminescence spectra when current at a current density of 2.5 mA/cm$^2$ was supplied to the light-emitting element 10 and the comparative light-emitting elements 8, 11, and 12. Note that the measurements of the light-emitting elements were performed at room temperature (in an atmosphere kept at 23° C.).

Table 6 shows the element characteristics of the light-emitting element 10 and the comparative light-emitting elements 11 and 12 at around 1000 cd/m$^2$.

TABLE 6

| | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Light-emitting element 10 | 2.40 | 0.73 | (0.472, 0.523) | 648 | 88.3 | 115.6 | 27.2 |
| Comparative light-emitting element 11 | 2.50 | 1.43 | (0.345, 0.631) | 992 | 69.2 | 87.0 | 18.8 |
| Comparative light-emitting element 12 | 2.70 | 3.37 | (0.435, 0.536) | 894 | 26.5 | 30.9 | 7.95 |

As shown in FIG. 32, the emission spectra of the light-emitting element 10 and the comparative light-emitting elements 8 and 12 have peak wavelengths of 566 nm, 562 nm, and 560 nm, respectively, and have full widths at half maximum of approximately 74 nm, 67 nm, and 69 nm, respectively. This indicates that the light-emitting element 10 and the comparative light-emitting elements 8 and 12 emit yellow light. Therefore, light emitted from the light-emitting element 10 and the comparative light-emitting elements 8 and 12 was derived from the fluorescent compound TBRb. Note that the emission spectrum of the comparative light-emitting element 11 has a peak wavelength of 533 nm and a full width at half maximum of 78 nm. This indicates that the comparative light-emitting element 11 emits green light. Therefore, light emitted from the comparative light-emitting element 11 was derived from GD270. Thus, the light-emitting element 10 of one embodiment of the present invention has the emission spectrum with a small full width at half maximum of the peak wavelength and can emit light with high color purity as compared to the comparative light-emitting element 11. Accordingly, the light-emitting element of one embodiment of the present invention is suitable for a display device.

As shown in FIG. 29, FIG. 31, and Table 6, although the light-emitting element 10 is a fluorescent light-emitting element, the external quantum efficiency thereof is higher than 6.25%. This is because, in the light-emitting element 10 of one embodiment of the present invention, not only singlet excitons but also triplet excitons can contribute to fluorescence through the phosphorescent compound GD270. Furthermore, as described later, PCCzPTzn contained in the light-emitting element 10 is a TADF material; thus, triplet excitons can contribute to fluorescence by reverse intersystem crossing caused by the TADF material, resulting in an increase in emission efficiency.

The emission efficiency of the light-emitting element 10 is higher than that of the comparative light-emitting element 8. As described above, the comparative light-emitting element 8 contains CBP, which is not a TADF material, in the light-emitting layer 130; thus, the comparative light-emitting element 8 does not have a function of converting triplet excitons into singlet excitons, which is made possible through reverse intersystem crossing caused by the TADF material. By contrast, the light-emitting element 10 of one embodiment of the present invention contains a TADF material in the light-emitting layer 130; thus, triplet excitons can be converted into singlet excitons by reverse intersystem crossing caused by the TADF material in the light-emitting element 10. Accordingly, the light-emitting element 10 can have higher emission efficiency than the comparative light-emitting element 8.

The emission efficiency of the light-emitting element 10 is higher than that of the comparative light-emitting element 12. As described above, the comparative light-emitting element 12 contains a TADF material but does not contain a phosphorescent compound in the light-emitting layer 130; thus, triplet excitons cannot contribute to fluorescence through the phosphorescent compound in the comparative light-emitting element 12. By contrast, the light-emitting element 10 of one embodiment of the present invention contains a phosphorescent compound as well as a TADF material in the light-emitting layer 130. This allows, in the light-emitting element 10, triplet excitons to contribute to fluorescence through the phosphorescent compound, in addition to an efficiency increasing effect by reverse intersystem crossing caused by the TADF material. Accordingly, the light-emitting element 10 can have higher emission efficiency than the comparative light-emitting element 12.

<Time-Resolved Emission Measurement>

Figure 33:
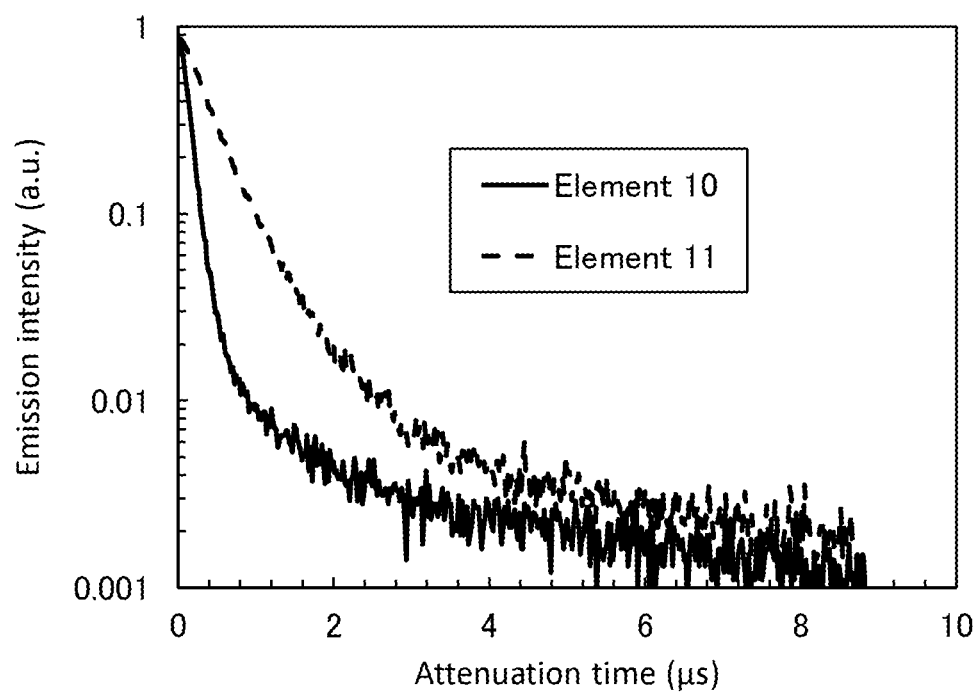
FIG. 33 shows results of time-resolved emission measurement in Example.

Next, time-resolved emission measurement was performed on the light-emitting element and the comparative light-emitting element 11. The results are shown in FIG. 33. The measurement method is similar to that described in the above examples.

As shown in FIG. 33, the attenuation rate of light emitted from the light-emitting element is higher than that of light emitted from the comparative light-emitting element 11. This means, in the light-emitting element 10, that the excitation energy is rapidly converted into light emission and thus emitted light can be extracted efficiently even when the density of excitons is high (a large amount of current flows) in the light-emitting layer. For that reason, the light-emitting element 10 shows a small roll-off as shown in FIG. 29 and FIG. 31. Furthermore, the emission efficiency of the light-emitting element 10 is higher than that of the comparative light-emitting element 11. The light-emitting layer 130 of the light-emitting element 10 has a structure in which the fluorescent compound TBRb is added to the light-emitting layer 130 of the comparative light-emitting element 11. As shown in FIG. 33, the addition of the fluorescent compound increases the attenuation rate of light; thus, the deactivation of the excitons is inhibited. Accordingly, the light-emitting element 10 can have higher emission efficiency than the comparative light-emitting element 11.

<Transient Fluorescent Characteristics of Host Material>

Here, transient fluorescent characteristics of PCCzPTzn used for the light-emitting element 10 were examined by time-resolved emission measurement to determine whether PCCzPTzn is a TADF material. The time-resolved emission measurement was performed in a manner similar to that described in Example 1. For the measurement, a thin-film sample formed over a quartz substrate by evaporation of PCCzPTzn to a thickness of 50 nm was used.

Figure 34:
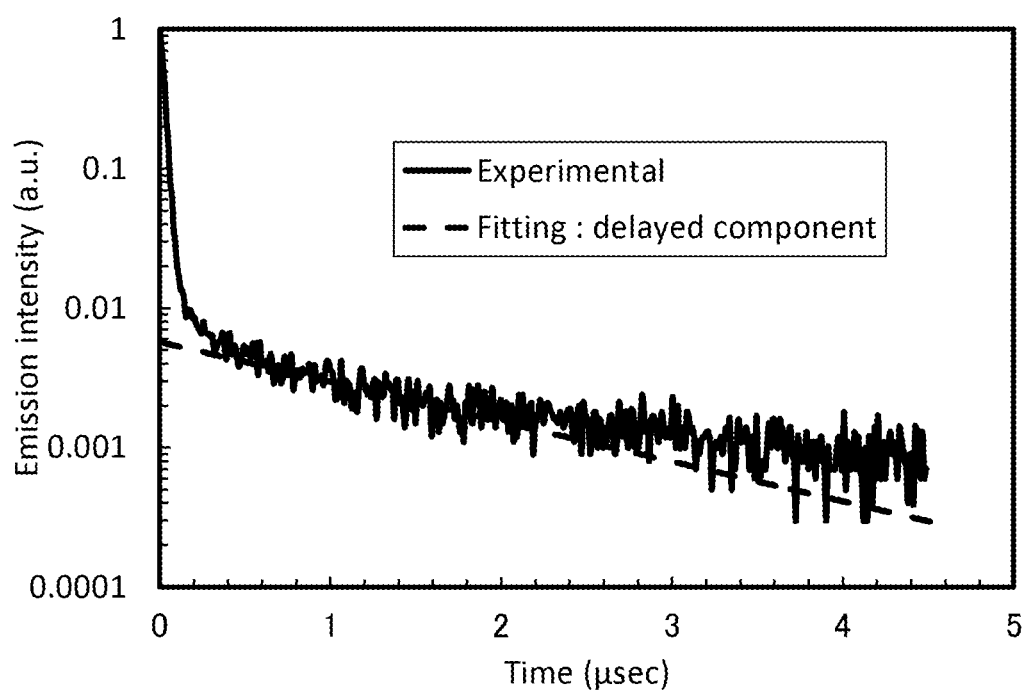
FIG. 34 shows results of time-resolved emission measurement in Example.

FIG. 34 shows transient fluorescent characteristics of PCCzPTzn obtained by the measurement.

The attenuation curve shown in FIG. 34 was fitted with Formula 4. The fitting results show that light emitted from the thin-film sample of PCCzPTzn contains a plurality of emission components having different fluorescence lifetimes. The emission components of the thin-film sample of PCCzPTzn contain at least a prompt fluorescence component having a fluorescence lifetime of 15.0 ns and a delayed fluorescence component having a lifetime of 1.5 μs which is the longest. That is, PCCzPTzn is a thermally activated delayed fluorescent material exhibiting delayed fluorescence at room temperature.

<Measurements of S1 Level and T1 Level>

Figure 35:
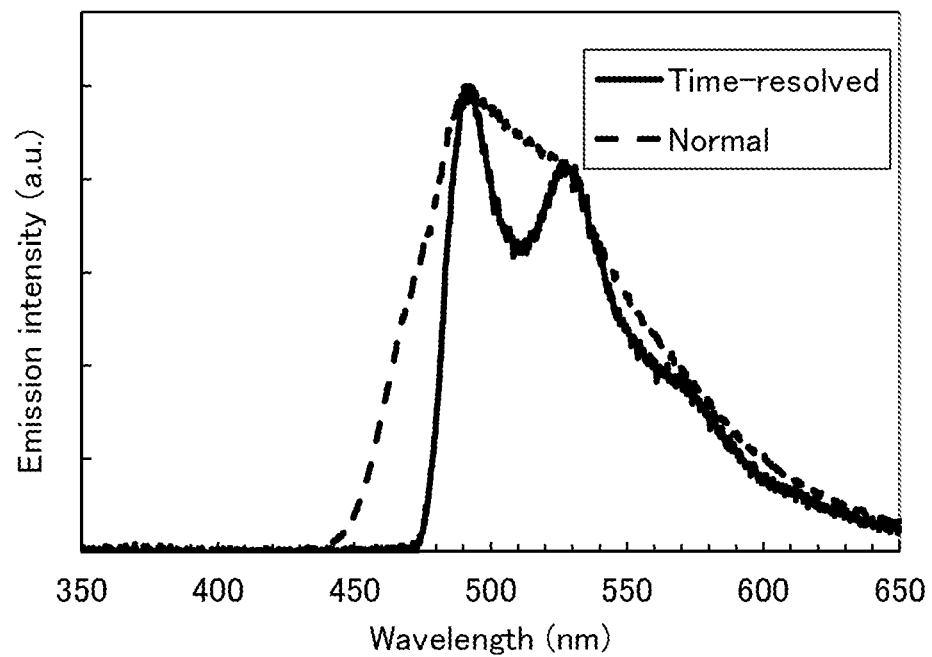
FIG. 35 shows emission spectra of a compound in Example.

Next, an emission spectrum of PCCzPTzn was measured at a low temperature (10 K) to calculate the S1 level and the T1 level thereof. The measurement method is similar to that described in Example 1. FIG. 35 shows the measurement results.

As shown in FIG. 35, in the emission spectrum of PCCzPTzn, the wavelengths of peaks (including shoulders) of the fluorescence component and the phosphorescence component on the shortest wavelength side were 472 nm and 491 nm, respectively.

Thus, the S1 level and the T1 level of PCCzPTzn, which are calculated from the wavelengths of the peaks (including shoulders), are 2.63 eV and 2.53 eV, respectively, and therefore the energy difference between the S1 level and the T1 level is 0.10 eV.

Furthermore, as shown in FIG. 35, in the emission spectrum of PCCzPTzn, the wavelengths of the rising portions of the fluorescence component and the phosphorescence component on the shorter wavelength side are 450 nm and 477 nm, respectively. Note that the wavelength of the rising portion on the shorter wavelength side of the emission spectrum is a wavelength at the intersection of the horizontal axis and a tangent to the spectrum at a point where the slope of the tangent has a maximum value.

The S1 level and the T1 level of PCCzPTzn, which are thus calculated from the wavelengths of the rising portions, are 2.76 eV and 2.60 eV, respectively, and therefore the energy difference between the S1 level and the T1 level is 0.16 eV.

As described above, the energy difference between the S1 level and the T1 level of PCCzPTzn is greater than 0 eV and less than or equal to 0.2 eV, which is extremely small, when calculated either from the wavelengths of the peaks (including shoulders) on the shortest wavelength side of the emission spectrum or from the wavelength of the rising portion on the shorter wavelength side of the emission spectrum. Therefore, PCCzPTzn has a function of converting triplet excitation energy into singlet excitation energy by reverse intersystem crossing and a function of exhibiting thermally activated delayed fluorescence.

<Reliability of Light-Emitting Elements>

Figure 36:
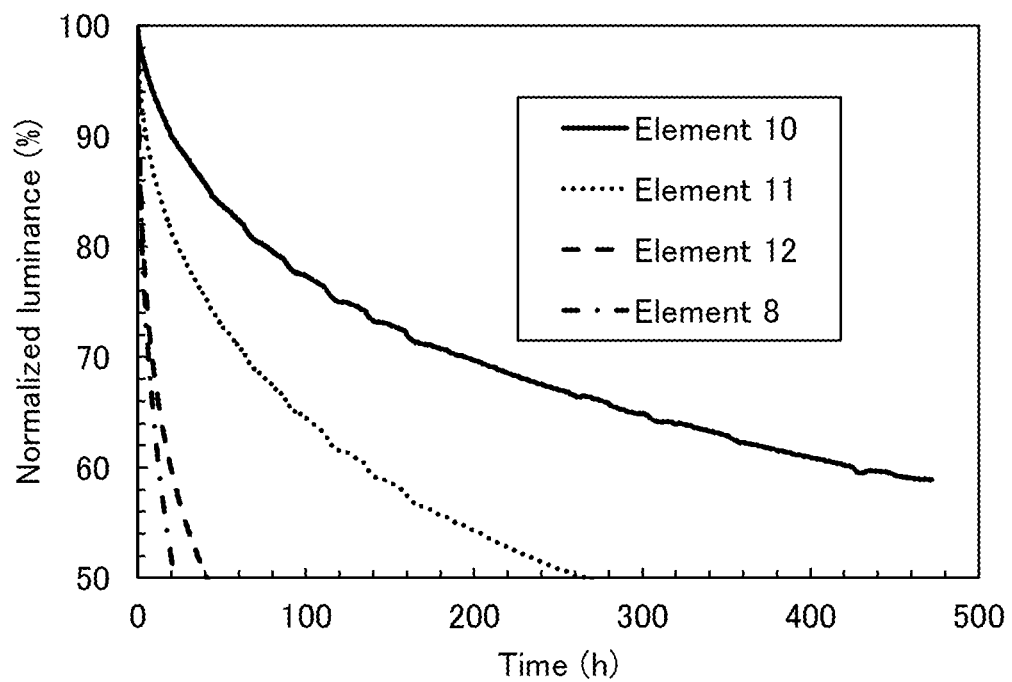
FIG. 36 shows reliability test results of light-emitting elements in Example.

FIG. 36 shows the results of driving tests at a constant current of 2.0 mA that were performed on the light-emitting element 10 and the comparative light-emitting elements 8, 11, and 12. As shown in FIG. 36, the light-emitting element 10 has higher reliability than the comparative light-emitting element 11. As described above, light from the fluorescent compound was obtained in the light-emitting element 10, and light from the phosphorescent compound was obtained in the comparative light-emitting element 11. This demonstrates that the reliability is improved when light emission is obtained from the fluorescent compound as in the light-emitting element of one embodiment of the present invention. Furthermore, the light-emitting element 10 has higher reliability than the comparative light-emitting element 12. As described above, in the light-emitting element 10, the triplet excitation energy can be transferred to the fluorescent compound through the TADF material and the phosphorescent compound. By contrast, in the comparative light-emitting element 12, the triplet excitation energy can be transferred to the fluorescent compound only through the TADF material. This indicates that a light-emitting element that has a plurality of paths through each of which triplet excitation energy can be transferred to a fluorescent compound, like the light-emitting element of one embodiment of the present invention, is more reliable. Furthermore, the light-emitting element 10 has higher reliability than the comparative light-emitting element 8. The use of a host material having a TADF property makes it possible to obtain a light-emitting element having high reliability.

As has been described, one embodiment of the present invention can provide a light-emitting element with high emission efficiency and high reliability. In addition, one embodiment of the present invention can provide a light-emitting element with low driving voltage and low power consumption.

Example 4

In this example, fabrication examples of a light-emitting element of one embodiment of the present invention and comparative light-emitting elements will be described. The structure of each of the light-emitting elements fabricated in this example is the same as that illustrated in FIG. 1A. Table 7 shows the details of the element structures. Refer to the above examples and embodiment for the structures and abbreviations of compounds used here.

TABLE 7

| | Layer | Reference numeral | Thickness (nm) | Material | Weight ratio |
|---|---|---|---|---|---|
| Light-emitting element 13 | Electrode | 102 | 200 | Al | — |
| | Electron-injection layer | 119 | 1 | LiF | — |
| | Electron-transport layer | 118 (2) | 10 | NBPhen | — |
| | | 118 (1) | 20 | mPCCzPTzn-02 | — |
| | Light-emitting layer | 130 | 40 | mPCCzPTzn-02:GD270:TBRb | 0.8:0.2:0.01 |
| | Hole-transport layer | 112 | 20 | mCzFLP | — |
| | Hole-injection layer | 111 | 45 | DBT3P-II:MoO$_3$ | 1:0.5 |
| | Anode | 101 | 70 | ITSO | — |
| Comparative light-emitting element 14 | Electrode | 102 | 200 | Al | — |
| | Electron-injection layer | 119 | 1 | LiF | — |
| | Electron-transport layer | 118 (2) | 10 | NBPhen | — |
| | | 118 (1) | 20 | mPCCzPTzn-02 | — |

TABLE 7-continued

|  | Layer | Reference numeral | Thickness (nm) | Material | Weight ratio |
|---|---|---|---|---|---|
|  | Light-emitting layer | 130 | 40 | mPCCzPTzn-02:GD270 | 0.8:0.2 |
|  | Hole-transport layer | 112 | 20 | mCzFLP | — |
|  | Hole-injection layer | 111 | 45 | DBT3P-II:MoO$_3$ | 1:0.5 |
|  | Anode | 101 | 70 | ITSO | — |
| Comparative light-emitting element 15 | Electrode | 102 | 200 | Al | — |
|  | Electron-injection layer | 119 | 1 | LiF | — |
|  | Electron-transport layer | 118 (2) | 10 | NBPhen | — |
|  |  | 118 (1) | 20 | mPCCzPTzn-02 | — |
|  | Light-emitting layer | 130 | 30 | mPCCzPTzn-02:TBRb | 1:0.01 |
|  | Hole-transport layer | 112 | 20 | PCCP | — |
|  | Hole-injection layer | 111 | 45 | DBT3P-II:MoO$_3$ | 1:0.5 |
|  | Anode | 101 | 70 | ITSO | — |

<Fabrication of Light-Emitting Elements>

Fabrication methods of the light-emitting elements in this example will be described below.

<<Fabrication of Light-Emitting Element 13>>

As the electrode 101, an ITSO film was formed to a thickness of 70 nm over a glass substrate. Note that the electrode area of the electrode 101 was set to 4 mm$^2$ (2 mm×2 mm).

Next, as the hole-injection layer 111, DBT3P-II and molybdenum oxide (MoO$_3$) were deposited by co-evaporation over the electrode 101 to a thickness of 45 nm with a weight ratio of DBT3P-II to MoO$_3$ being 1:0.5.

Then, as the hole-transport layer 112, mCzFLP was deposited by evaporation over the hole-injection layer 111 to a thickness of 20 nm.

Next, as the light-emitting layer 130, mPCCzPTzn-02, GD270 (manufactured by Jilin Optical and Electronic Materials Co., Ltd.), and TBRb were deposited by co-evaporation over the hole-transport layer 112 to a thickness of 40 nm with a weight ratio of mPCCzPTzn-02 to GD270 and TBRb being 0.8:0.2:0.01. In the light-emitting layer 130, GD270 is a phosphorescent compound and TBRb is a fluorescent compound.

Subsequently, as the electron-transport layer 118, mPCCzPTzn-02 and NBPhen were sequentially deposited by evaporation over the light-emitting layer 130 to thicknesses of 20 nm and 10 nm, respectively. Then, as the electron-injection layer 119, LiF was deposited by evaporation over the electron-transport layer 118 to a thickness of 1 nm.

Next, as the electrode 102, aluminum (Al) was deposited over the electron-injection layer 119 to a thickness of 200 nm.

Then, in a glove box containing a nitrogen atmosphere, the light-emitting element 13 was sealed by fixing a glass substrate for sealing to the glass substrate over which the organic materials were deposited using a sealant for organic EL. Specifically, after the sealant was applied to surround the organic materials over the glass substrate and the glass substrate was bonded to the glass substrate for sealing, irradiation with ultraviolet light having a wavelength of 365 nm at 6 J/cm$^2$ and heat treatment at 80° C. for one hour were performed. Through the above steps, the light-emitting element 13 was fabricated.

<<Fabrication of Comparative Light-Emitting Element 14>>

A comparative light-emitting element 14 was fabricated through the same steps as those for the above-described light-emitting element 13 except for the step of forming the light-emitting layer 130.

As the light-emitting layer 130 of the comparative light-emitting element 14, mPCCzPTzn-02 and GD270 were deposited by co-evaporation to a thickness of 40 nm with a weight ratio of mPCCzPTzn-02 to GD270 being 0.8:0.2. Unlike in the light-emitting layer 130 of the light-emitting element 13, the fluorescent compound TBRb was not contained in the light-emitting layer 130 of the comparative light-emitting element 14.

<<Fabrication of Comparative Light-Emitting Element 15>>

A comparative light-emitting element 15 was fabricated through the same steps as those for the above-described light-emitting element 13 except for the steps of forming the hole-transport layer 112 and the light-emitting layer 130.

As the hole-transport layer 112 of the comparative light-emitting element 15, PCCP was deposited by evaporation over the hole-injection layer 111 to a thickness of 20 nm.

Then, as the light-emitting layer 130, mPCCzPTzn-02 and TBRb were deposited by co-evaporation to a thickness of 30 nm with a weight ratio of mPCCzPTzn-02 to TBRb being 1:0.01. Unlike in the light-emitting layer 130 of the light-emitting element 13, the phosphorescent compound GD270 was not contained in the light-emitting layer 130 of the comparative light-emitting element 15.

<Characteristics of Light-Emitting Elements>

Next, the characteristics of the fabricated light-emitting element 13 and comparative light-emitting elements 14 and 15 and the above-described comparative light-emitting element 8 were measured. Note that the measurement method is similar to that used in Example 1.

Figure 37:
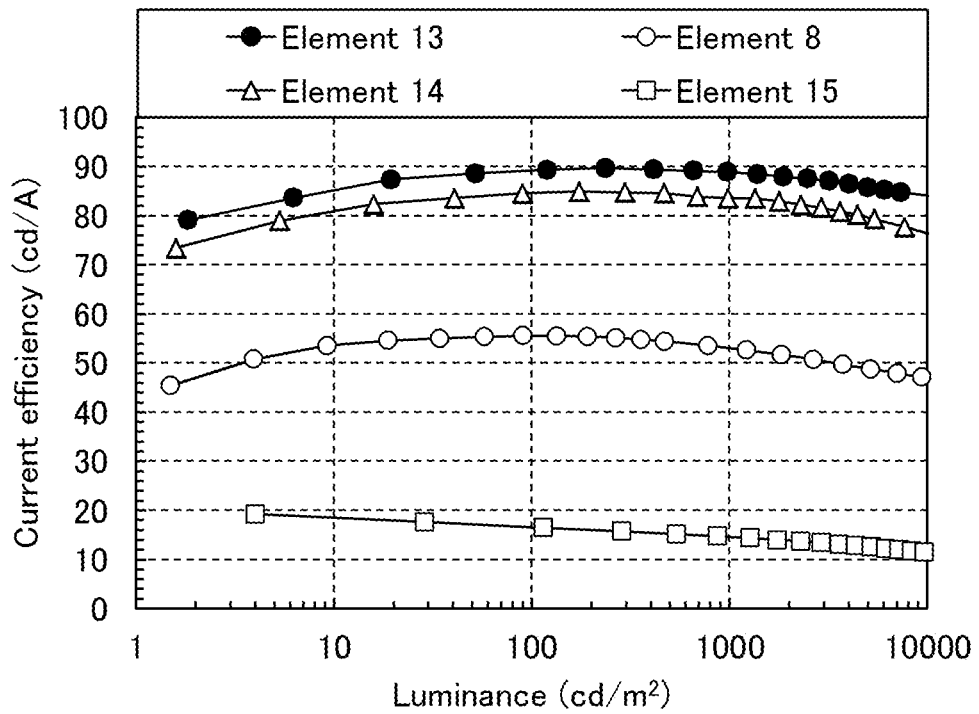
FIG. 37 shows luminance—current efficiency characteristics of light-emitting elements in Example.
Figure 38:
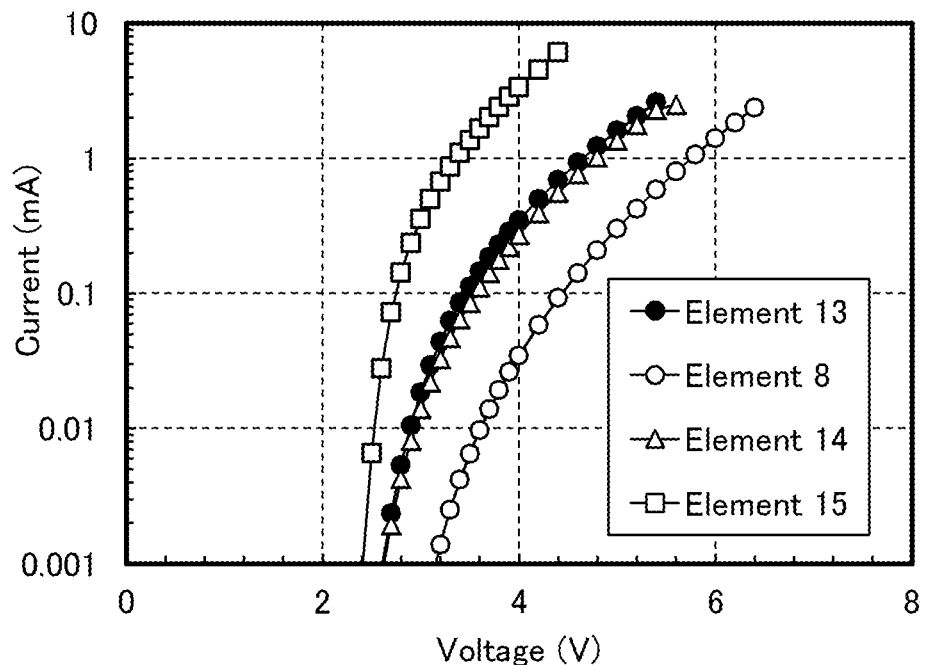
FIG. 38 shows voltage—current characteristics of light-emitting elements in Example.
Figure 39:
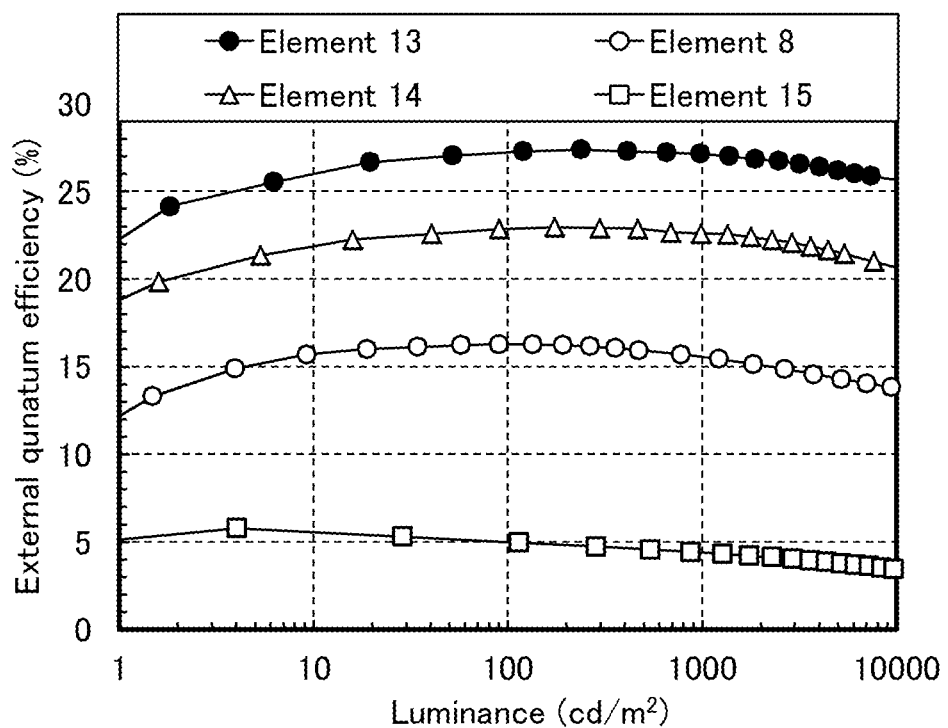
FIG. 39 shows luminance—external quantum efficiency characteristics of light-emitting elements in Example.
Figure 40:
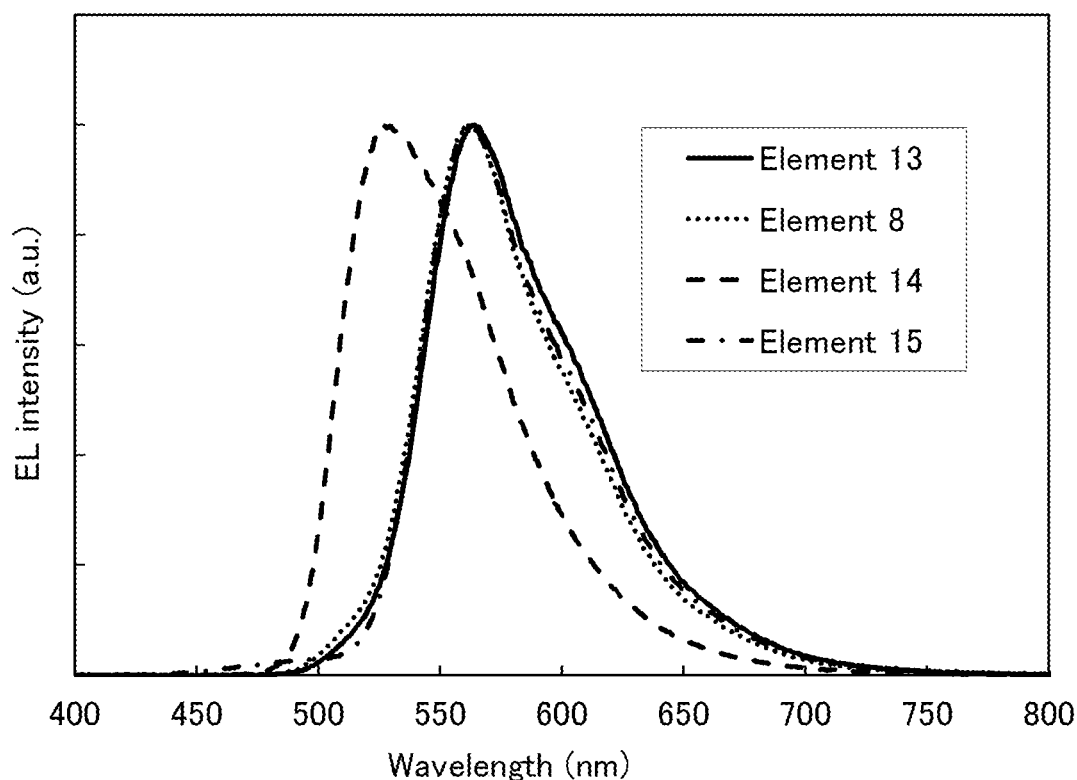
FIG. 40 shows emission spectra of light-emitting elements in Example.

FIG. 37, FIG. 38, and FIG. 39 show luminance—current efficiency characteristics, voltage—current characteristics, and luminance—external quantum efficiency characteristics, respectively, of the light-emitting element 13 and the comparative light-emitting elements 8, 14, and 15. FIG. 40 shows the electroluminescence spectra when current at a current density of 2.5 mA/cm$^2$ was supplied to the light-emitting element 13 and the comparative light-emitting elements 8, 14, and 15. Note that the measurements of the light-emitting elements were performed at room temperature (in an atmosphere kept at 23° C.).

Table 8 shows the element characteristics of the light-emitting element 13 and the comparative light-emitting elements 14 and 15 at around 1000 cd/m$^2$.

TABLE 8

|  | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Light-emitting element 13 | 3.20 | 1.10 | (0.462, 0.532) | 977 | 88.9 | 87.3 | 27.1 |
| Comparative light-emitting element 14 | 3.30 | 1.18 | (0.339, 0.634) | 983 | 83.6 | 79.6 | 22.6 |
| Comparative light-emitting element 15 | 2.90 | 5.91 | (0.451, 0.534) | 871 | 14.7 | 16.0 | 4.44 |

As shown in FIG. 40, the emission spectra of the light-emitting element 13 and the comparative light-emitting elements 8 and 15 have peak wavelengths of 564 nm, 562 nm, and 562 nm, respectively, and have full widths at half maximum of approximately 72 nm, 67 nm, and 69 nm, respectively. This indicates that the light-emitting element 13 and the comparative light-emitting elements 8 and 15 emit yellow light. Therefore, light emitted from the light-emitting element 13 and the comparative light-emitting elements 8 and 15 was derived from the fluorescent compound TBRb. Note that the emission spectrum of the comparative light-emitting element 14 has a peak wavelength of 527 nm and a full width at half maximum of 73 nm. This indicates that the comparative light-emitting element 14 emits green light. Therefore, light emitted from the comparative light-emitting element 14 was derived from GD270. Thus, the light-emitting element 13 of one embodiment of the present invention has the emission spectrum with a small full width at half maximum of the peak wavelength and can emit light with high color purity as compared to the comparative light-emitting element 14. Accordingly, the light-emitting element of one embodiment of the present invention is suitable for a display device.

As shown in FIG. 37, FIG. 39, and Table 8, although the light-emitting element 13 is a fluorescent light-emitting element, the external quantum efficiency thereof is higher than 6.25%. This is because, in the light-emitting element 13 of one embodiment of the present invention, not only singlet excitons but also triplet excitons can contribute to fluorescence through the phosphorescent compound GD270. Furthermore, as described later, mPCCzPTzn-02 contained in the light-emitting element 13 is a TADF material; thus, triplet excitons can contribute to fluorescence by reverse intersystem crossing caused by the TADF material, resulting in an increase in emission efficiency.

The emission efficiency of the light-emitting element 13 is higher than that of the comparative light-emitting element 8. As described above, the comparative light-emitting element 8 contains CBP, which is not a TADF material, in the light-emitting layer 130; thus, the comparative light-emitting element 8 does not have a function of converting triplet excitons into singlet excitons, which is made possible through reverse intersystem crossing caused by the TADF material. By contrast, the light-emitting element 13 of one embodiment of the present invention contains a TADF material in the light-emitting layer 130; thus, triplet excitons can be converted into singlet excitons by reverse intersystem crossing caused by the TADF material in the light-emitting element 13. Accordingly, the light-emitting element 13 can have higher emission efficiency than the comparative light-emitting element 8.

The emission efficiency of the light-emitting element 13 is higher than that of the comparative light-emitting element 15. As described above, the comparative light-emitting element 15 contains a TADF material but does not contain a phosphorescent compound in the light-emitting layer 130; thus, triplet excitons cannot contribute to fluorescence through the phosphorescent compound in the comparative light-emitting element 15. By contrast, the light-emitting element 13 of one embodiment of the present invention contains a phosphorescent compound as well as a TADF material. This allows triplet excitons to contribute to fluorescence through the phosphorescent compound. Accordingly, the light-emitting element 13 can have higher emission efficiency than the comparative light-emitting element 15.

<Time-Resolved Emission Measurement>

Figure 41:
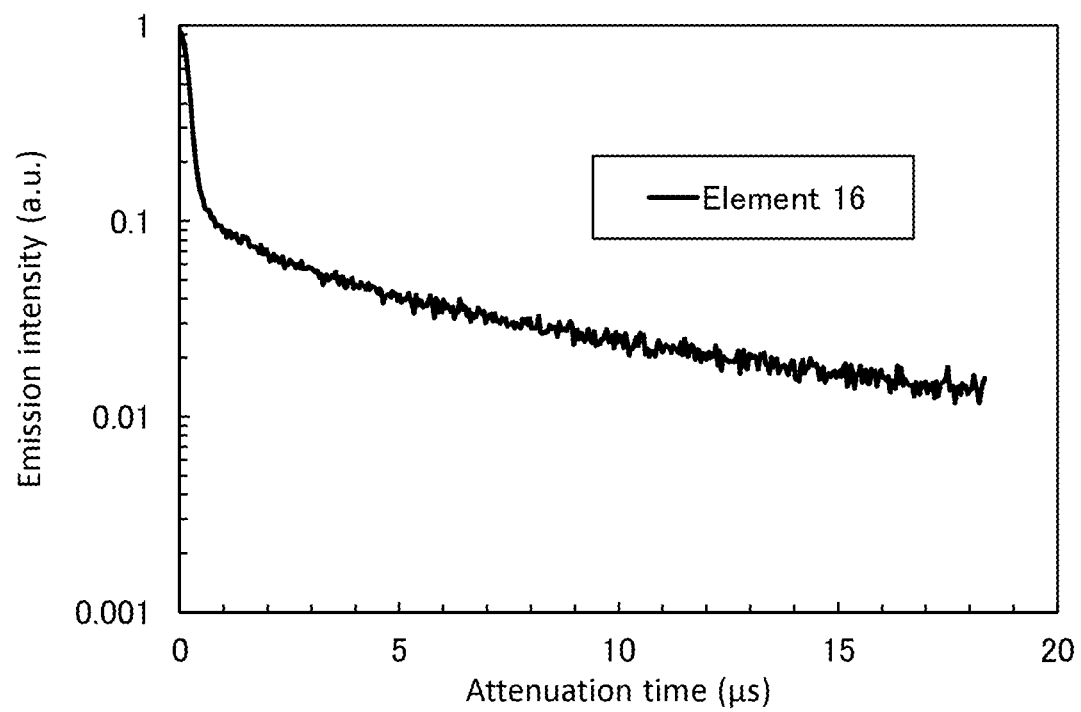
FIG. 41 shows results of time-resolved emission measurement in Example.

Next, time-resolved emission measurement was performed to determine whether mPCCzPTzn-02 is a TADF material. The result is shown in FIG. 41. The measurement method is similar to that described in the above examples. For the measurement, a light-emitting element 16 having an element structure shown in Table 9 was used.

TABLE 9

|  | Layer | Reference numeral | Thickness (nm) | Material | Weight ratio |
|---|---|---|---|---|---|
| Light-emitting element 16 | Electrode | 102 | 200 | Al | — |
|  | Electron-injection layer | 119 | 1 | LiF | — |
|  | Electron-transport layer | 118 (2) | 10 | NBPhen | — |
|  |  | 118 (1) | 20 | mPCCzPTzn-02 | — |
|  | Light-emitting layer | 130 | 30 | mPCCzPTzn-02 | — |
|  | Hole-transport layer | 112 | 20 | PCCP | — |

TABLE 9-continued

| Layer | Reference numeral | Thickness (nm) | Material | Weight ratio |
|---|---|---|---|---|
| Hole-injection layer | 111 | 30 | DBT3P-II:MoO$_3$ | 1:0.5 |
| Anode | 101 | 70 | ITSO | — |

As shown in FIG. 41, a plurality of emission components having different fluorescence lifetimes were observed in the light-emitting element 16. Specifically, a prompt fluorescence component having a short emission lifetime and a delayed fluorescence component having a long emission lifetime were observed. Thus, mPCCzPTzn-02 is a TADF material. On the other hand, as shown in FIG. 41, the proportion of the delayed fluorescence component in all emission components (prompt fluorescence component and delayed fluorescence component) is approximately 10%. This indicates that, after triplet excitons are converted into singlet excitons, the conversion ratio of the singlet excitons into light emission is calculated to be approximately 4%. Hence, mPCCzPTzn-02 has a TADF property but its emission efficiency is not high. However, as described above, the light-emitting element 13 has an extremely high external quantum efficiency of over 27%. Accordingly, the emission efficiency of a TADF material used for the light-emitting element of one embodiment of the present invention may be low as long as it has a TADF property.

<Measurements of S1 Level and T1 Level>

Figure 42:
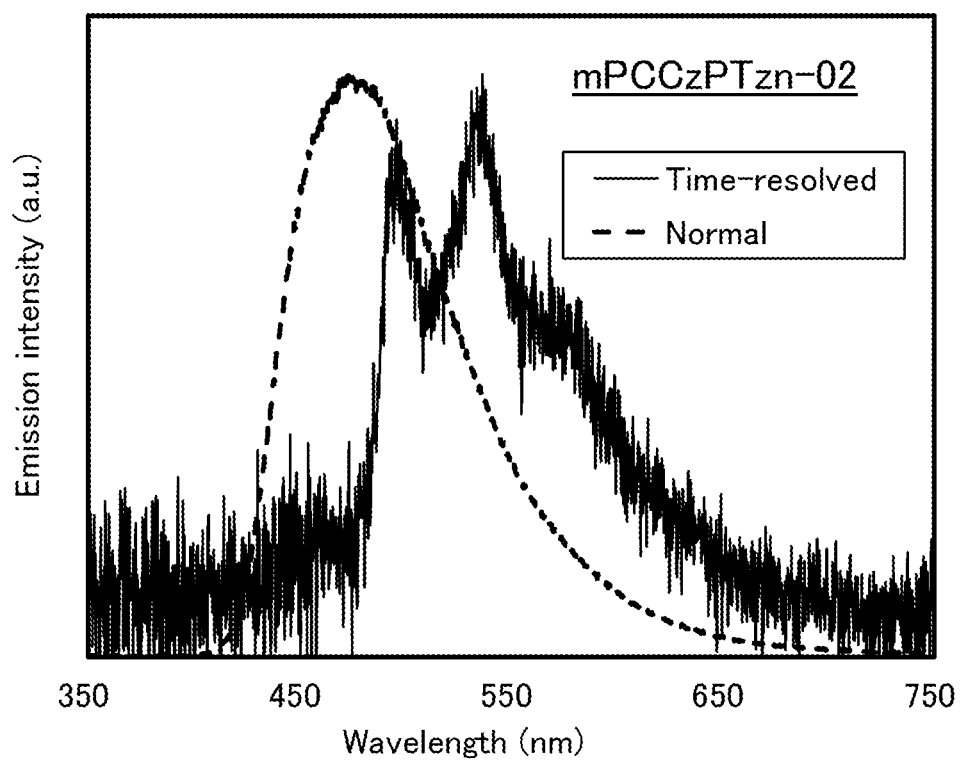
FIG. 42 shows emission spectra of a compound in Example.

Next, an emission spectrum of mPCCzPTzn-02 was measured at a low temperature (10 K) to calculate the S1 level and the T1 level thereof. The measurement method is similar to that described in Example 1. FIG. 42 shows the measurement results.

As shown in FIG. 42, in the emission spectrum of mPCCzPTzn-02, the wavelengths of peaks (including shoulders) of the fluorescence component and the phosphorescence component on the shortest wavelength side were 471 nm and 496 nm, respectively.

Thus, the S1 level and the T1 level of mPCCzPTzn-02, which are calculated from the wavelengths of the peaks (including shoulders), are 2.63 eV and 2.50 eV, respectively, and therefore the energy difference between the S1 level and the T1 level is 0.13 eV.

As described above, the energy difference between the S1 level and the T1 level of mPCCzPTzn-02, which is calculated from the wavelengths of the peaks (including shoulders) on the shortest wavelength side of the emission spectrum, is greater than 0 eV and less than or equal to 0.2 eV, which is extremely small. Therefore, mPCCzPTzn-02 has a function of converting triplet excitation energy into singlet excitation energy by reverse intersystem crossing and a function of exhibiting thermally activated delayed fluorescence.

<Reliability of Light-Emitting Elements>

Figure 43:
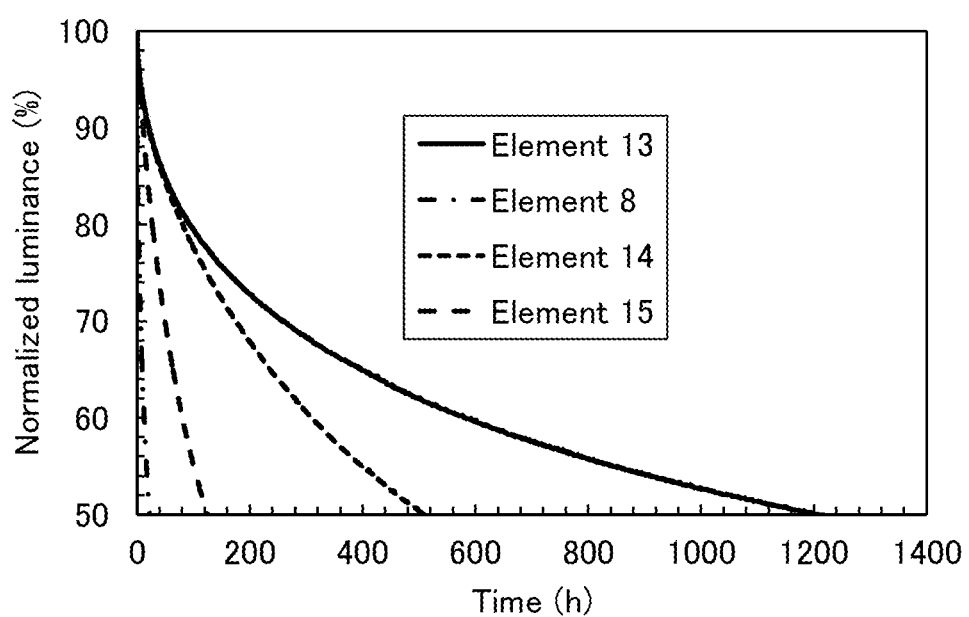
FIG. 43 shows reliability test results of light-emitting elements in Example.

FIG. 43 shows the results of driving tests at a constant current of 2.0 mA that were performed on the light-emitting element 13 and the comparative light-emitting elements 8, 14, and 15. As shown in FIG. 43, the light-emitting element 13 has higher reliability than the comparative light-emitting element 14. As described above, light from the fluorescent compound was obtained in the light-emitting element 13, and light from the phosphorescent compound was obtained in the comparative light-emitting element 14. This demonstrates that the reliability is improved when light emission is obtained from the fluorescent compound as in the light-emitting element of one embodiment of the present invention. Furthermore, the light-emitting element 13 has higher reliability than the comparative light-emitting element 15. As described above, in the light-emitting element 13, the triplet excitation energy can be transferred to the fluorescent compound through the TADF material and the phosphorescent compound. By contrast, in the comparative light-emitting element 15, the triplet excitation energy can be transferred to the fluorescent compound only through the TADF material. This indicates that a light-emitting element that has a plurality of paths through each of which triplet excitation energy can be transferred to a fluorescent compound, like the light-emitting element of one embodiment of the present invention, is more reliable. Furthermore, the light-emitting element 13 has higher reliability than the comparative light-emitting element 8. The use of a host material having a TADF property makes it possible to obtain a light-emitting element having high reliability.

As has been described, one embodiment of the present invention can provide a light-emitting element with high emission efficiency and high reliability. In addition, one embodiment of the present invention can provide a light-emitting element with low driving voltage and low power consumption.

Example 5

In this example, fabrication examples of a light-emitting element of one embodiment of the present invention and a comparative light-emitting element will be described. The structure of each of the light-emitting elements fabricated in this example is the same as that illustrated in FIG. 1A. Table 10 shows the details of the element structures. Refer to the above examples and embodiment for the structures and abbreviations of compounds used here.

TABLE 10

| | Layer | Reference numeral | Thickness (nm) | Material | Weight ratio |
|---|---|---|---|---|---|
| Light-emitting element 17 | Electrode | 102 | 200 | Al | — |
| | Electron-injection layer | 119 | 1 | LiF | — |
| | Electron-transport layer | 118 (2) | 10 | NBPhen | — |
| | | 118 (1) | 20 | mPCCzPTzn-02 | — |
| | Light-emitting layer | 130 | 40 | mPCCzPTzn-02:PCCP:GD270:TBRb | 0.5:0.5:0.1:0.01 |
| | Hole-transport layer | 112 | 20 | mCzFLP | — |
| | Hole-injection layer | 111 | 45 | DBT3P-II:MoO$_3$ | 1:0.5 |

TABLE 10-continued

| | Layer | Reference numeral | Thickness (nm) | Material | Weight ratio |
|---|---|---|---|---|---|
| | Anode | 101 | 70 | ITSO | — |
| Comparative light-emitting element 18 | Electrode | 102 | 200 | Al | — |
| | Electron-injection layer | 119 | 1 | LiF | — |
| | Electron-transport layer | 118 (2) | 10 | NBPhen | — |
| | | 118 (1) | 20 | mPCCzPTzn-02 | — |
| | Light-emitting layer | 130 | 40 | mPCCzPTzn-02:PCCP:GD270 | 0.5:0.5:0.1 |
| | Hole-transport layer | 112 | 20 | mCzFLP | — |
| | Hole-injection layer | 111 | 45 | DBT3P-II:MoO$_3$ | 1:0.5 |
| | Anode | 101 | 70 | ITSO | — |

<Fabrication of Light-Emitting Elements>

Fabrication methods of the light-emitting elements in this example will be described below.

<<Fabrication of Light-Emitting Element 17>>

As the electrode 101, an ITSO film was formed to a thickness of 70 nm over a glass substrate. Note that the electrode area of the electrode 101 was set to 4 mm$^2$ (2 mm×2 mm).

Next, as the hole-injection layer 111, DBT3P-II and molybdenum oxide (MoO$_3$) were deposited by co-evaporation over the electrode 101 to a thickness of 45 nm with a weight ratio of DBT3P-II to MoO$_3$ being 1:0.5.

Then, as the hole-transport layer 112, mCzFLP was deposited by evaporation over the hole-injection layer 111 to a thickness of 20 nm.

Next, as the light-emitting layer 130, mPCCzPTzn-02, PCCP, GD270, and TBRb were deposited by co-evaporation over the hole-transport layer 112 to a thickness of 40 nm with a weight ratio of mPCCzPTzn-02 to PCCP, GD270, and TBRb being 0.5:0.5:0.1:0.01. In the light-emitting layer 130, TBRb is a fluorescent compound.

Subsequently, as the electron-transport layer 118, mPCCzPTzn-02 and NBPhen were sequentially deposited by evaporation over the light-emitting layer 130 to thicknesses of 20 nm and 10 nm, respectively. Then, as the electron-injection layer 119, LiF was deposited by evaporation over the electron-transport layer 118 to a thickness of 1 nm.

Next, as the electrode 102, aluminum (Al) was deposited over the electron-injection layer 119 to a thickness of 200 nm.

Then, in a glove box containing a nitrogen atmosphere, the light-emitting element 17 was sealed by fixing a glass substrate for sealing to the glass substrate over which the organic materials were deposited using a sealant for organic EL. Specifically, after the sealant was applied to surround the organic materials over the glass substrate and the glass substrate was bonded to the glass substrate for sealing, irradiation with ultraviolet light having a wavelength of 365 nm at 6 J/cm$^2$ and heat treatment at 80° C. for one hour were performed. Through the above steps, the light-emitting element 17 was fabricated.

<<Fabrication of Comparative Light-Emitting Element 18>>

A comparative light-emitting element 18 was fabricated through the same steps as those for the above-described light-emitting element 17 except for the step of forming the light-emitting layer 130.

As the light-emitting layer 130 of the comparative light-emitting element 18, mPCCzPTzn-02, PCCP, and GD270 were deposited by co-evaporation to a thickness of 40 nm with a weight ratio of mPCCzPTzn-02 to PCCP and GD270 being 0.5:0.5:0.1. Unlike in the light-emitting layer 130 of the light-emitting element 17, the fluorescent compound TBRb was not contained in the light-emitting layer 130 of the comparative light-emitting element 18.

<Characteristics of Light-Emitting Elements>

Next, the characteristics of the fabricated light-emitting element 17 and comparative light-emitting element 18 and the above-described light-emitting element 13 were measured. Note that the measurement method is similar to that used in Example 1.

Figure 44:
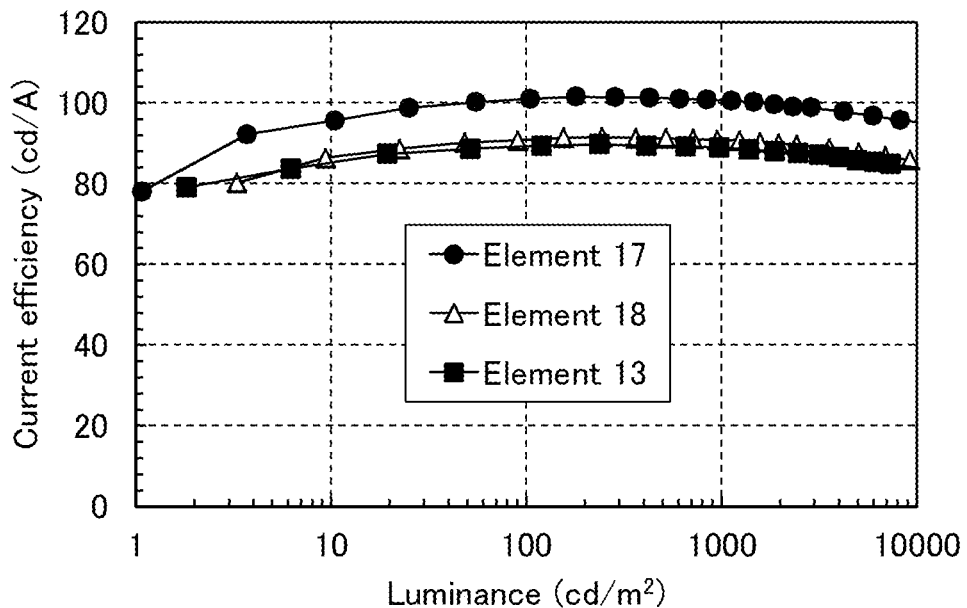
FIG. 44 shows luminance—current efficiency characteristics of light-emitting elements in Example.
Figure 45:
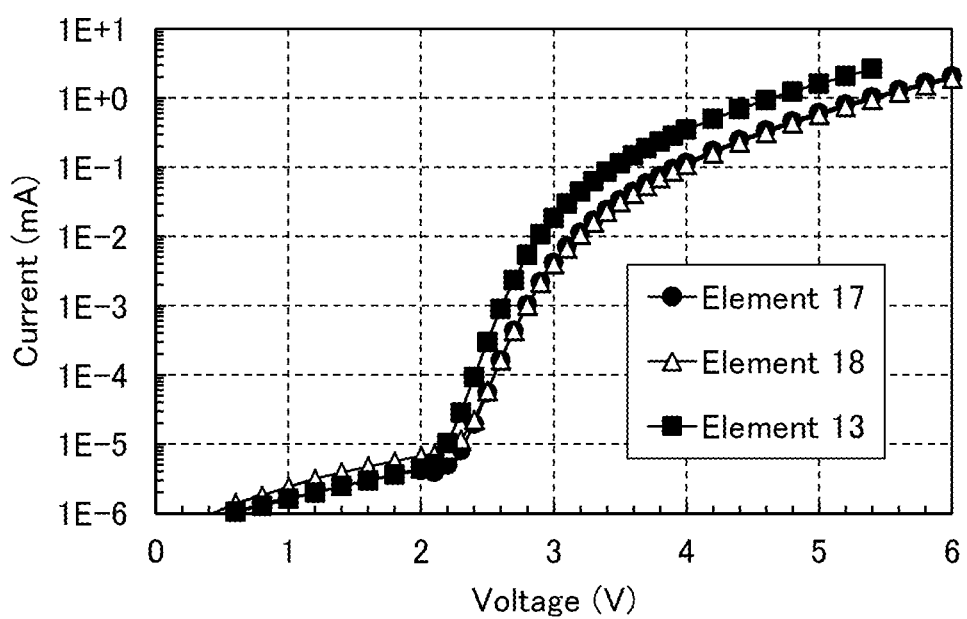
FIG. 45 shows voltage—current characteristics of light-emitting elements in Example.
Figure 46:
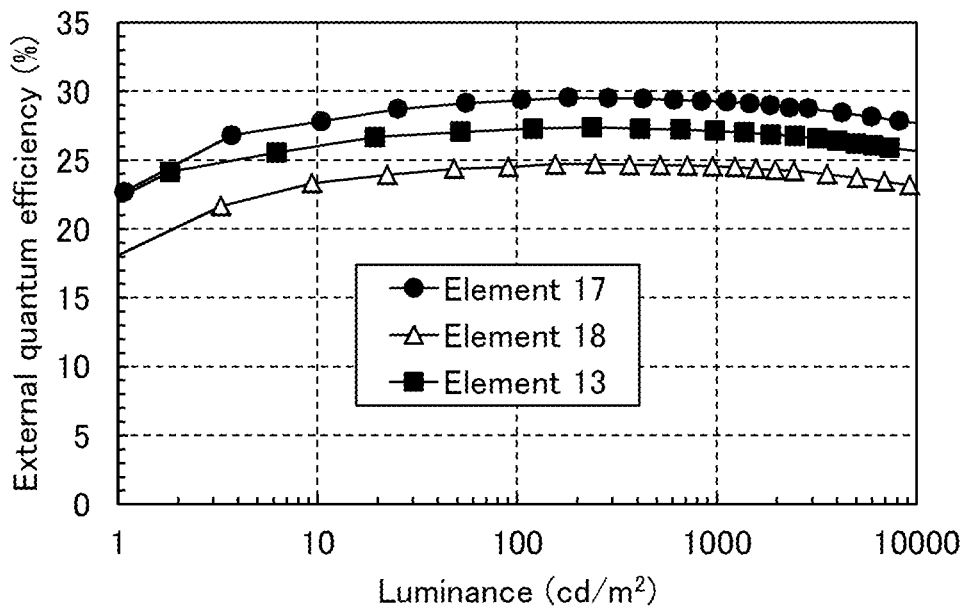
FIG. 46 shows luminance—external quantum efficiency characteristics of light-emitting elements in Example.
Figure 47:
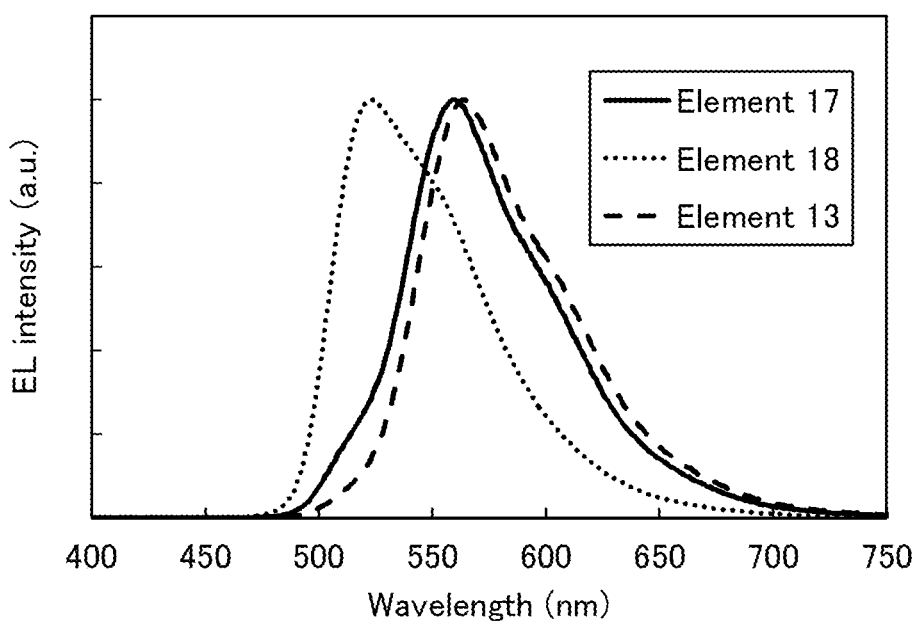
FIG. 47 shows emission spectra of light-emitting elements in Example.

FIG. 44, FIG. 45, and FIG. 46 show luminance—current efficiency characteristics, voltage—current characteristics, and luminance—external quantum efficiency characteristics, respectively, of the light-emitting elements 13 and 17 and the comparative light-emitting element 18. FIG. 47 shows the electroluminescence spectra when current at a current density of 2.5 mA/cm$^2$ was supplied to the light-emitting elements 13 and 17 and the comparative light-emitting element 18. Note that the measurements of the light-emitting elements were performed at room temperature (in an atmosphere kept at 23° C.).

Table 11 shows the element characteristics of the light-emitting element 17 and the comparative light-emitting element 18 at around 1000 cd/m$^2$.

TABLE 11

| | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Light-emitting element 17 | 3.60 | 1.12 | (0.434, 0.557) | 1123 | 100.5 | 87.7 | 29.2 |
| Comparative light-emitting element 18 | 3.60 | 1.05 | (0.318, 0.649) | 949 | 90.8 | 79.3 | 24.5 |

As shown in FIG. 47, the electroluminescence spectra of the light-emitting elements 13 and 17 have peak wavelengths of 564 nm and 559 nm, respectively, and have full widths at half maximum of approximately 72 nm and 71 nm, respectively. This indicates that the light-emitting elements 13 and 17 emit yellow light. Therefore, light emitted from the light-emitting elements 13 and 17 was derived from the fluorescent compound TBRb. Furthermore, the electroluminescence spectrum of the comparative light-emitting element 18 has a peak wavelength of 524 nm and a full width at half maximum of 72 nm. This indicates that the comparative light-emitting element 18 emits green light. Therefore, light emitted from the comparative light-emitting element 18 was derived from the phosphorescent compound GD270.

As shown in FIG. 44, FIG. 46, and Table 11, the light-emitting elements 13 and 17 and the comparative light-emitting element 18 have extremely high emission efficiency (current efficiency, power efficiency, and external quantum efficiency). Although the light-emitting element 17 is a fluorescent light-emitting element, the external quantum efficiency thereof is much higher than 6.25%. This is because light emission derived from triplet excitons is obtained in addition to light emission derived from singlet excitons generated by recombination of carriers (holes and electrons), which indicates that excitation energy is transferred to the fluorescent compound TBRb through the phosphorescent compound GD270. Furthermore, as described above, mPCCzPTzn-02 contained in the light-emitting element 17 is a TADF material; thus, triplet excitons can contribute to fluorescence by reverse intersystem crossing caused by the TADF material, resulting in an increase in the emission efficiency.

<CV Measurement Results>

Next, the electrochemical characteristics (oxidation reaction characteristics and reduction reaction characteristics) of the above compounds were measured by cyclic voltammetry (CV) measurement to calculate the HOMO and LUMO levels of the above compounds. The measurement was performed in a manner similar to that described in Example 1.

From the CV measurement results, the HOMO level and the LUMO level of mPCCzPTzn-02 are calculated to be −5.69 eV and −3.00 eV, respectively. In addition, the HOMO level and the LUMO level of PCCP are calculated to be −5.63 eV and −1.96 eV, respectively.

Thus, mPCCzPTzn-02 has a higher HOMO level and a lower LUMO level than PCCP; hence, mPCCzPTzn-02 and PCCP are a combination that forms an exciplex in a light-emitting layer.

The S1 level and the T1 level of the exciplex formed by mPCCzPTzn-02 and PCCP, which are calculated from a peak wavelength of an emission spectrum thereof, are each 2.45 eV. Note that the T1 level of GD270 is 2.44 eV (calculated from the absorption edge of a chloroform solution); thus, the excitation energy of the exciplex can be transferred to GD270.

<Examination of Formation of Exciplex>

In order to examine whether mPCCzPTzn-02 and PCCP form the exciplex, a light-emitting element 19 shown in Table 12 and the above-described light-emitting element 16 were fabricated. Note that the emission spectrum of mPCCzPTzn-02 and the emission spectrum of a mixed film of mPCCzPTzn-02 and PCCP were compared with each other to examine whether the exciplex is formed.

TABLE 12

| | Layer | Reference numeral | Thickness (nm) | Material | Weight ratio |
|---|---|---|---|---|---|
| Light-emitting element 19 | Electrode | 102 | 200 | Al | — |
| | Electron-injection layer | 119 | 1 | LiF | — |
| | Electron-transport layer | 118 (2) | 10 | NBphen | — |
| | | 118 (1) | 20 | mPCCzPTzn-02 | — |
| | Light-emitting layer | 130 | 30 | mPCCzPTzn-02:PCCP | 0.8:0.2 |
| | Hole-transport layer | 112 | 20 | PCCP | — |
| | Hole-injection layer | 111 | 30 | DBT3P-II:MoO$_3$ | 1:0.5 |
| | Anode | 101 | 70 | ITSO | — |

<<EL Spectra>>

Figure 48:
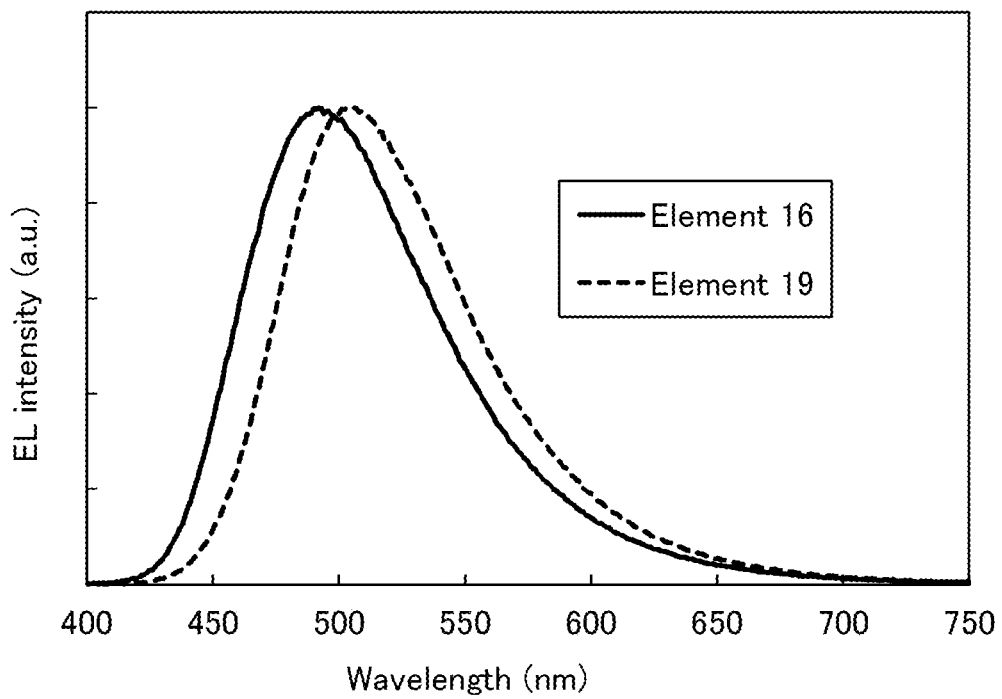
FIG. 48 shows emission spectra of light-emitting elements in Example.

FIG. 48 shows EL spectra obtained when current at a current density of 2.5 mA/cm$^2$ was supplied to the light-emitting elements 16 and 19. As shown in FIG. 48, light from mPCCzPTzn-02 is obtained in the light-emitting element 16. Note that light from the light-emitting element 19 has a peak on the longer wavelength side than light from the light-emitting element 16. Furthermore, the light emission energy of the light-emitting element 19 (2.45 eV) calculated from a peak wavelength of the emission spectrum thereof is substantially the same as a difference between the LUMO level of mPCCzPTzn-02 and the HOMO level of PCCP (2.63 eV). Therefore, mPCCzPTzn-02 and PCCP form the exciplex.

<<Time-Resolved Emission Measurement>>

Figure 49:
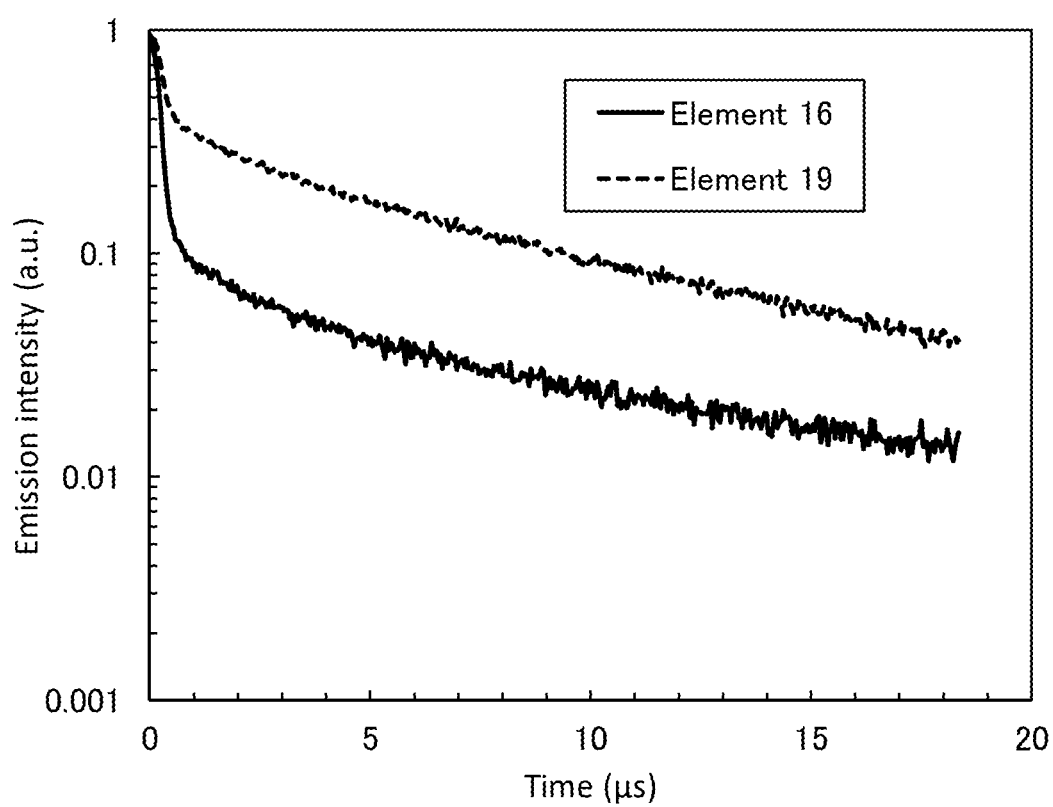
FIG. 49 shows results of time-resolved emission measurement in Example.

Time-resolved emission measurement was performed on the light-emitting elements 16 and 19. The results are shown in FIG. 49. As shown in FIG. 49, the proportion of the delayed fluorescence component in the light-emitting element 19 is higher than that of the delayed fluorescence component in the light-emitting element 16. In addition, the light-emitting element 19 contains an emission component having a longer lifetime than that in the light-emitting element 16. That is, the transient response characteristics differ between the light-emitting element 16 and the light-emitting element 19. Therefore, mPCCzPTzn-02 and PCCP form the exciplex.

<Relationship Between Emission Spectrum of Exciplex and Absorption Spectrum of Guest Material>

Figure 50:
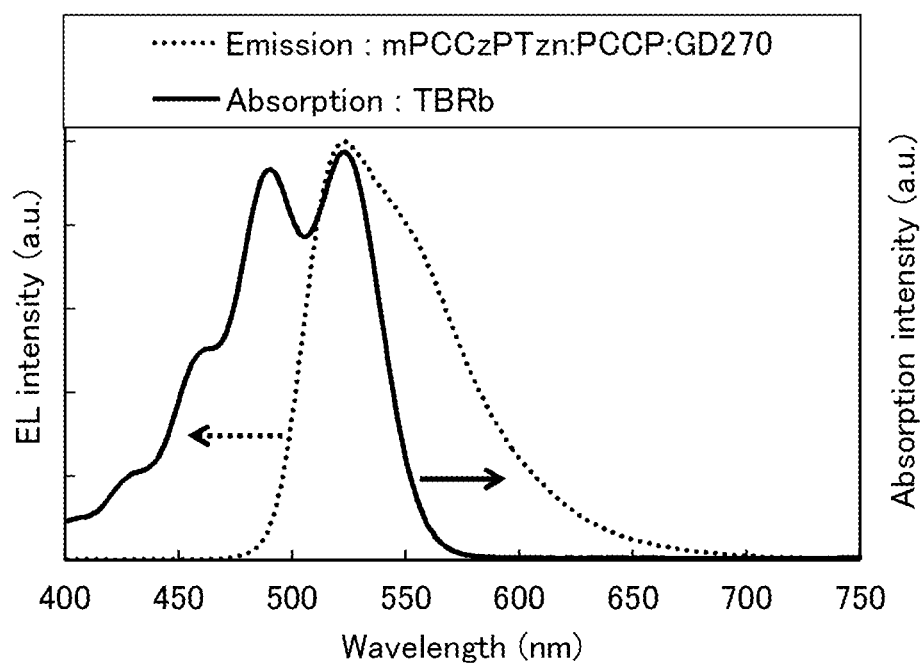
FIG. 50 shows a relationship between an emission spectrum and an absorption spectrum in Example.

FIG. 50 shows the measurement results of the absorption spectrum of a toluene solution of TBRb, and the emission spectrum of the comparative light-emitting element 18. The measurement was performed in a manner similar to that described in the above example.

As shown in FIG. 50, the absorption spectrum of TBRb and the emission spectrum of the comparative light-emitting element 18 partly overlap with each other. Thus, the excitation energy can be efficiently supplied from the exciplex formed by mPCCzPTzn-02 and PCCP to the fluorescent compound TBRb through GD270. The energy is transferred to TBRb through the phosphorescent compound GD270, so that triplet excitation energy can contribute to fluorescence. In the case where mPCCzPTzn-02 that does not form the exciplex is excited, singlet excitons are generated from triplet excitons by reverse intersystem crossing because mPCCzPTzn-02 has a TADF property. In the light-emitting layer 130, singlet excitons are generated by the TADF material and the triplet excitation energy is transferred to the fluorescent compound TBRb through the phosphorescent compound GD270; thus, the light-emitting element 17 can have extremely high emission efficiency.

<Reliability of Light-Emitting Elements>

Driving tests at a constant current of 2.0 mA were performed on the light-emitting elements 13 and 17 and the comparative light-emitting element 18. Table 13 shows $LT_{60}$ (time at which the luminance is reduced by 40%) in the driving test.

TABLE 13

|  | $LT_{60}$ (h) |
| --- | --- |
| Light-emitting element 17 | 690 |
| Comparative light-emitting element 18 | 430 |
| Light-emitting element 13 | 580 |

As shown in Table 13, the light-emitting elements 13 and 17 and the comparative light-emitting element 18 have high reliability. Furthermore, the light-emitting element 17 has higher reliability than the comparative light-emitting element 18. In addition, $LT_{60}$ of the light-emitting element 17 is longer than that of the light-emitting element 13. Thus, the use of a TADF material as a host material and the use of an exciplex make it possible to obtain a light-emitting element having high reliability.

REFERENCE NUMERALS

100: EL layer, 101: electrode, 102: electrode, 106: light-emitting unit, 108: light-emitting unit, 111: hole-injection layer, 112: hole-transport layer, 113: electron-transport layer, 114: electron-injection layer, 115: charge-generation layer, 116: hole-injection layer, 117: hole-transport layer, 118: electron-transport layer, 119: electron-injection layer, 120: light-emitting layer, 130: light-emitting layer, 131: compound, 132: compound, 133: compound, 134: compound, 150: light-emitting element, 170: light-emitting layer, 250: light-emitting element, 601: source side driver circuit, 602: pixel portion, 603: gate side driver circuit, 604: sealing substrate, 605: sealant, 607: space, 608: wiring, 609: FPC, 610: element substrate, 611: switching TFT, 612: current controlling TFT, 613: electrode, 614: insulator, 616: EL layer, 617: electrode, 618: light-emitting element, 623: n-channel TFT, 624: p-channel TFT, 625: desiccant, 900: portable information terminal, 901: housing, 902: housing, 903: display portion, 905: hinge portion, 910: portable information terminal, 911: housing, 912: display portion, 913: operation button, 914: external connection port, 915: speaker, 916: microphone, 917: camera, 920: camera, 921: housing, 922: display portion, 923: operation button, 924: shutter button, 926: lens, 1001: substrate, 1002: base insulating film, 1003: gate insulating film, 1006: gate electrode, 1007: gate electrode, 1008: gate electrode, 1020: interlayer insulating film, 1021: interlayer insulating film, 1022: electrode, 1024B: electrode, 1024G: electrode, 1024R: electrode, 1024W: electrode, 1025B: lower electrode, 1025G: lower electrode, 1025R: lower electrode, 1025W: lower electrode, 1026: partition, 1028: EL layer, 1029: electrode, 1031: sealing substrate, 1032: sealant, 1033: base material, 1034B: coloring layer, 1034G: coloring layer, 1034R: coloring layer, 1035: black layer, 1036: overcoat layer, 1037: interlayer insulating film, 1040: pixel portion, 1041: driver circuit portion, 1042: peripheral portion, 1044B: blue pixel, 1044G: green pixel, 1044R: red pixel, 1044W: white pixel, 2100: robot, 2101: illuminance sensor, 2102: microphone, 2103: upper camera, 2104: speaker, 2105: display, 2106: lower camera, 2107: obstacle sensor, 2108: moving mechanism, 2110: arithmetic device, 5000: housing, 5001: display portion, 5002: display portion, 5003: speaker, 5004: LED lamp, 5005: operation key, 5006: connection terminal, 5007: sensor, 5008: microphone, 5012: support, 5013: earphone, 5100: cleaning robot, 5101: display, 5102: camera, 5103: brush, 5104: operation button, 5120: dust, 5140: portable electronic device, 5150: portable information terminal, 5151: housing, 5152: display region, 5153: bend portion, 8501: lighting device, 8502: lighting device, 8503: lighting device, and 8504: lighting device.

This application is based on Japanese Patent Application Serial No. 2017-213080 filed with Japan Patent Office on Nov. 2, 2017, the entire contents of which are hereby incorporated by reference.

The invention claimed is:

1. A light-emitting device comprising:
a first electrode;
a light-emitting layer over the first electrode, the light-emitting layer comprising:
a first organic compound configured to convert triplet excitation energy into light emission;
a second organic compound comprising a π-electron rich skeleton and a π-electron deficient skeleton; and
a third organic compound configured to convert singlet excitation energy into light emission; and
a second electrode over the light-emitting layer,
wherein the π-electron rich skeleton comprises any one of an acridine skeleton, a phenoxazine skeleton, a phenothiazine skeleton, a furan skeleton, a thiophene skeleton, and a pyrrole skeleton,
wherein the π-electron deficient skeleton comprises any one of a pyridine skeleton, a diazine skeleton (a pyrimidine skeleton, a pyrazine skeleton, or a pyridazine skeleton), a triazine skeleton, and an aromatic ring having a cyano group,
wherein the second organic compound is a thermally activated delayed fluorescence material,
wherein light emission from the light-emitting layer comprises light emission from the third organic compound, and
wherein the lowest triplet excitation energy level of the first organic compound is higher than or equal to the lowest triplet excitation energy of the third organic compound.

2. The light-emitting device according to claim 1, wherein the π-electron rich skeleton and the π-electron deficient skeleton are directly bonded to each other.

3. The light-emitting device according to claim 1, wherein the first organic compound is configured to supply excitation energy to the third organic compound.

4. The light-emitting device according to claim 1, wherein the lowest triplet excitation energy level of the first organic compound is higher than or equal to the lowest singlet excitation energy level of the third organic compound.

5. The light-emitting device according to claim 1, wherein the lowest triplet excitation energy level of the first organic compound is lower than or equal to the lowest triplet excitation energy level of the second organic compound.

6. The light-emitting device according to claim 1, wherein the first organic compound comprises one of Ru, Rh, Pd, Os, Ir and Pt.

7. A display device comprising:
the light-emitting device according to claim 1; and
at least one of a color filter and a transistor.

8. An electronic device comprising:
the display device according to claim 7; and
at least one of a housing and a touch sensor.

9. A lighting device comprising:
the light-emitting device according to claim 1; and
at least one of a housing and a touch sensor.

* * * * *